(12) United States Patent
Miskimins et al.

(10) Patent No.: US 6,230,109 B1
(45) Date of Patent: *May 8, 2001

(54) MULTICONDUCTOR CONTINUITY AND INTERMITTENT FAULT ANALYZER WITH DISTRIBUTED PROCESSING AND DYNAMIC STIMULATION

(75) Inventors: John G. Miskimins, Port Hadlock; Gary L. Combs, Seabeck, both of WA (US)

(73) Assignee: The United States of America as represented by the Secretary of the Navy, Washington, DC (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/872,170

(22) Filed: Jun. 10, 1997

Related U.S. Application Data

(63) Continuation-in-part of application No. 08/442,616, filed on May 16, 1995, now Pat. No. 5,638,004.

(51) Int. Cl.⁷ .................................................. G01R 19/00
(52) U.S. Cl. .......................................... 702/109; 324/539
(58) Field of Search ................................... 324/513, 539; 702/109, 122, 118, 121; 714/741

(56) References Cited

U.S. PATENT DOCUMENTS

| 3,131,347 | * | 4/1964 | Brooks et al. | 324/514 |
| 5,001,714 | * | 3/1991 | Stark et al. | 371/26 |
| 5,638,004 | * | 6/1997 | Combs et al. | 324/539 |
| 5,744,967 | * | 4/1998 | Sorensen | 324/540 |

* cited by examiner

Primary Examiner—Marc S. Hoff
Assistant Examiner—Edward Raymond
(74) Attorney, Agent, or Firm—Richard M. Gray; Crane L. Lopes; Donald G. Peck

(57) ABSTRACT

A multiconductor continuity and intermittent fault analysis system that subjects the cable to controlled environmental stress stimuli, such as vibration at a plurality of frequencies simultaneously, during testing. Multiconductor cables used for the transmission of digital data and control signals include multiple individual conductors terminating at both ends in pins or sockets that are grouped together in a connector. Physical defects in these cables can be permanent, or they can be intermittent faults, such as temporary breaks or shorts caused by vibrational stress on the cables. By vibrating the cable under test and measuring continuity rapidly enough to detect short-term anomalies, even intermittent faults are located. A distributed processing embodiment disclosed uses a user interface unit such as a personal computer or personal digital assistant, a multiprocessor controlled control unit, and the dynamic stimulation unit. The control unit includes a plurality of processors operating independently to test a plurality of cable pins simultaneously.

17 Claims, 50 Drawing Sheets

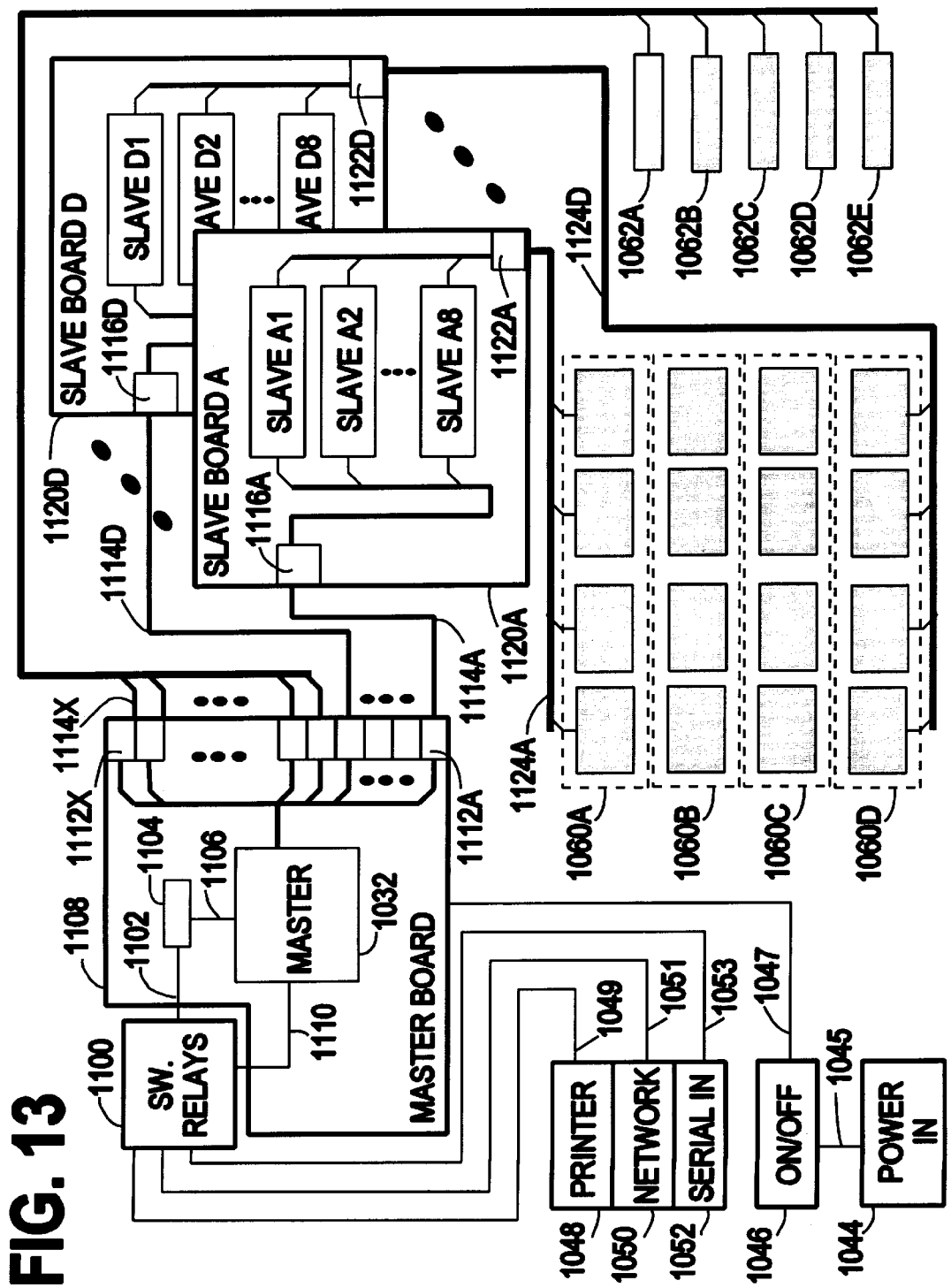

MULTICONDUCTOR CONTINUITY AND INTERMITTENT FAULT ANALYZER WITH DISTRIBUTED PROCESSING AND DYNAMIC STIMULATION

CROSS-REFERENCE TO RELATED APPLICATIONS

This application is a continuation-in-part of application Ser. No. 08/442,616, filed May 16, 1995, now U.S. Pat. No. 5,638,004.

FIELD OF THE INVENTION

This invention relates generally to multiconductor continuity and intermittent fault analysis systems, and more particularly to multiconductor cable testers that subject the cable to controlled environmental stress stimuli during testing.

BACKGROUND OF THE INVENTION

Multiconductor cables are widely used for the transmission of digital data and control signals. In general, the cables include multiple individual conductors terminating at both ends in pins or sockets that are grouped together in a connector. As digital control systems have become more common, multiconductor cables have become more varied. Modern multiconductor cables are found in a very large variety of connector shapes and sizes, number of conductors, and internal wiring schemes. Examples range from small ribbon cables used in personal computers that may have only a few conductors to massive cable harnesses used in aircraft control systems that may have hundreds or thousands of individual conductors.

As the complexity of the cable wiring schemes has increased, so too has the variety of cable testing equipment. Most conventional testing devices focus on determining the continuity paths between the individual pins of the cable. Determining the continuity paths serves two purposes: identifying the internal wiring of the cable; and detecting faults or defects in the cable. In general, conventional testing systems check continuity by applying a test signal to one or more test pins at one end of the cable and searching the remaining pins at one or both ends of the cable for the presence of the applied signal. If any of the remaining pins receives the test signal, that indicates a continuity path between that pin and the test pin.

The most sophisticated systems are capable of quickly determining complex wiring arrangements, cross-checking the continuity results against the wiring schematic stored in memory, and saving, displaying, or printing the test results for future comparison or record keeping purposes. If the signal is not received at the appropriate pins, an open circuit condition (open) is indicated, while the presence of the signal on pins where there should be no signal indicates a short circuit condition (short).

These faults can result from any number of physical defects or manufacturing errors including broken wires, incorrect pin fit, deformed pins, missing springs, cold solder joints, and bad crimps. Moreover, these defects manifest themselves in two different forms of faults: hard faults, which are permanent or long-lasting opens or shorts; and intermittent faults, which are opens or shorts that may last only microseconds or milliseconds.

Conventional systems are not capable of detecting intermittent faults, i.e. opens or shorts lasting only a few microseconds or milliseconds. Intermittent faults are generally caused by the same types of problems that lead to hard faults, but in a less severe form. For example, although a conductor may be cracked or broken at a given point, the severed ends of the conductor may usually remain in contact with one another, breaking contact only periodically, and for a very short time, constituting therefore an intermittent fault.

The only way conventional systems could detect such a short-lived fault is if the fault occurred exactly when that pin or conductor was being tested, and for long enough to be detected by the system. As a result, many cables that pass conventional continuity analysis may actually have multiple defects that lead to intermittent faults when the cable is placed into operation, particularly under harsh ambient conditions. In fact, recent information indicates that intermittent faults in multiconductor cables form one of the most common and significant sources of error in digital control systems.

Accordingly, conventional multiconductor cable systems and testing techniques must be modified to detect intermittent faults. This modification must be twofold: first, intermittent faults must be induced or generated in the cable during the testing procedure; and second, the testing system must be capable of detecting the intermittent faults when they occur.

Both modifications of the conventional system must be present to ensure accurate fault detection. For example, even if intermittent faults were being generated during testing, many conventional systems would not be capable of detecting a fault lasting only a few microseconds or milliseconds. Likewise, those systems that might be fast enough to detect intermittent faults would not be able to do so if the faults were not being induced at the precise moment when the individual pin or conductor connected to that fault were being tested.

SUMMARY OF THE INVENTION

The present invention provides a high-speed digital cable tester that can run a simple continuity test, reduce test time, manifest and detect short-duration faults (opens and shorts) in cables, reproduce test results in the same cable, locate the pin or pins in a connector that produced faults, operate at the simplest test level without causing degradation to the cable under test, and operate at the lowest possible cost.

The invention provides an improved multiconductor cable testing system that overcomes the disadvantages associated with the prior art. The invention provides an improved cable testing system that reliably induces intermittent faults in the cable under test of the sort that might occur when the cable is placed into its intended operating environment. The invention provides an improved cable testing system that determines the continuity paths of the cable and also detects intermittent faults lasting only a few microseconds or milliseconds or less. The invention accomplishes the foregoing with a multiconductor cable-continuity and intermittent-fault analysis system that is compatible with existing cables, is expandable to accommodate future cable designs, and is portable, small, and inexpensive.

BRIEF DESCRIPTION OF THE DRAWINGS

FIG. 13 is a block diagram showing the interconnections and signal paths within the control unit of the distributed processing embodiment.

DETAILED DESCRIPTION OF THE PREFERRED EMBODIMENTS

Central Processing Embodiment

Figure 1:
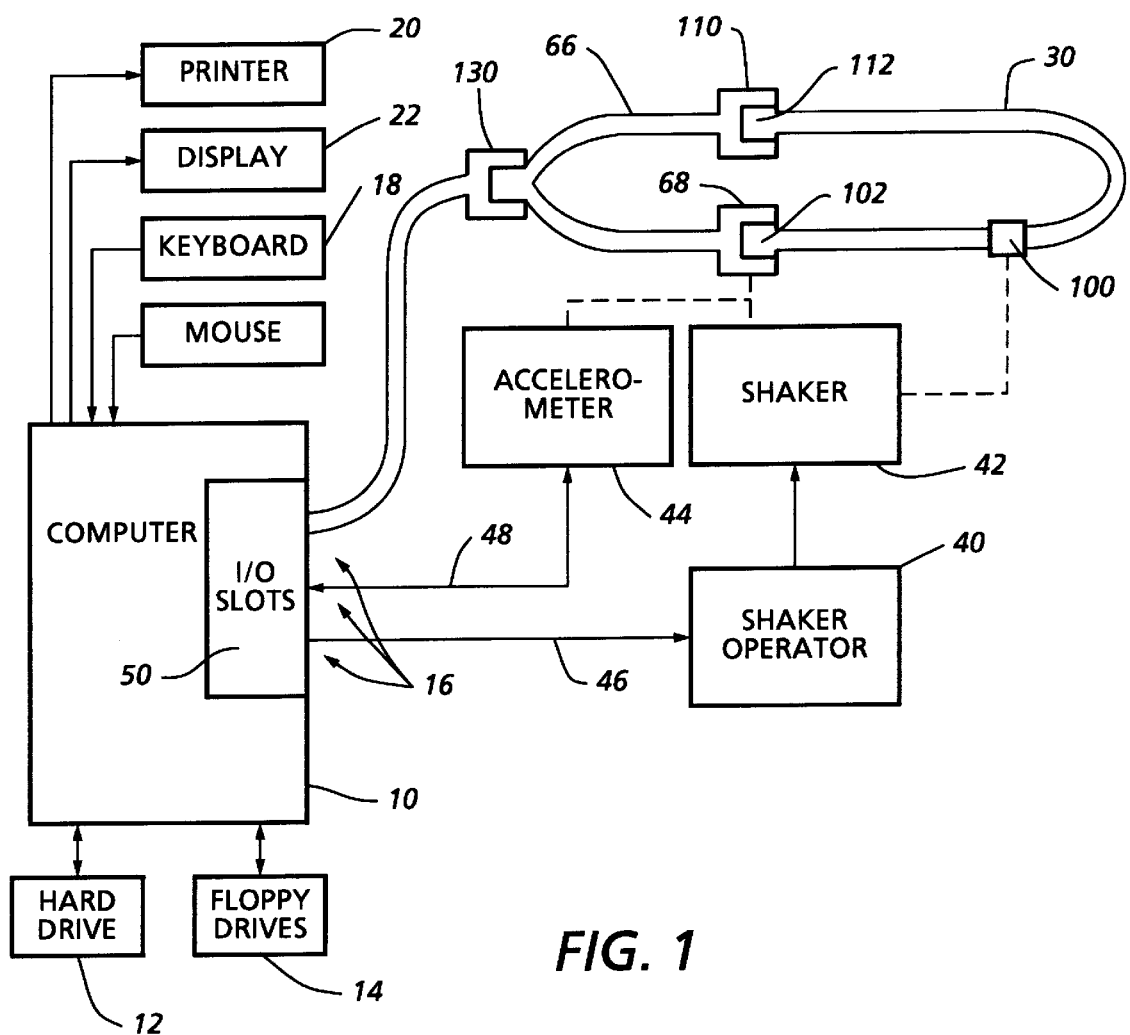
FIG. 1 is a block diagram of one embodiment of the invention.

A block diagram showing one preferred embodiment of the invention is provided in FIG. 1. The system is designed around a standard microprocessor controlled personal computer 10 or effectively equivalent circuitry. It is equipped as standard peripheral equipment with a hard drive 12, floppy diskette drives 14, input/output (I/O) ports 16, a keyboard 18, a printer 20, and a display monitor 22.

There are two main subsystems of the invention—a signal processing subsystem and a dynamic stimulation subsystem, which operate independently of one another. However, since each subsystem is controlled by a separate software program, the PC must be equipped with an operating system capable of managing at least two processes simultaneously. For example, this preferred embodiment uses the OS/2 WARP operating system, available from IBM. A math coprocessor is recommended.

The signal processing subsystem is responsible for transmitting test signals through individual pins and conductors of the cable under test (CUT) 30, determining the continuity paths between the pins, counting intermittent faults, saving the test results to a data file, and displaying or printing the results. The dynamic stimulation subsystem uses a closed-loop control scheme to manage a shaker operator 40, which controls a hydraulic shaker 42 on which the CUT is mounted. Vibrations generated by the shaker are specifically tailored to induce intermittent faults without damaging the CUT.

The main function of the dynamic stimulus is to induce intermittent faults by vibrating the components of the CUT. In principle, the vibration energy will cause the individual components of the CUT to move sufficiently to activate existing intermittent opens or shorts without causing damage to a good cable.

It is desirable that the measurement of the faults in an individual conductor in the cable can be completed in less than a half cycle of the period of the highest effective frequency of the mechanical vibrations applied to the CUT. It is more desirable by an order of magnitude that such a measurement can be made for all of the individual conductors in the cable during one such half-cycle period. This is determined by a combination of the clock-pulse frequency of the computer and the vibration frequency of the shaker.

Figure 2:
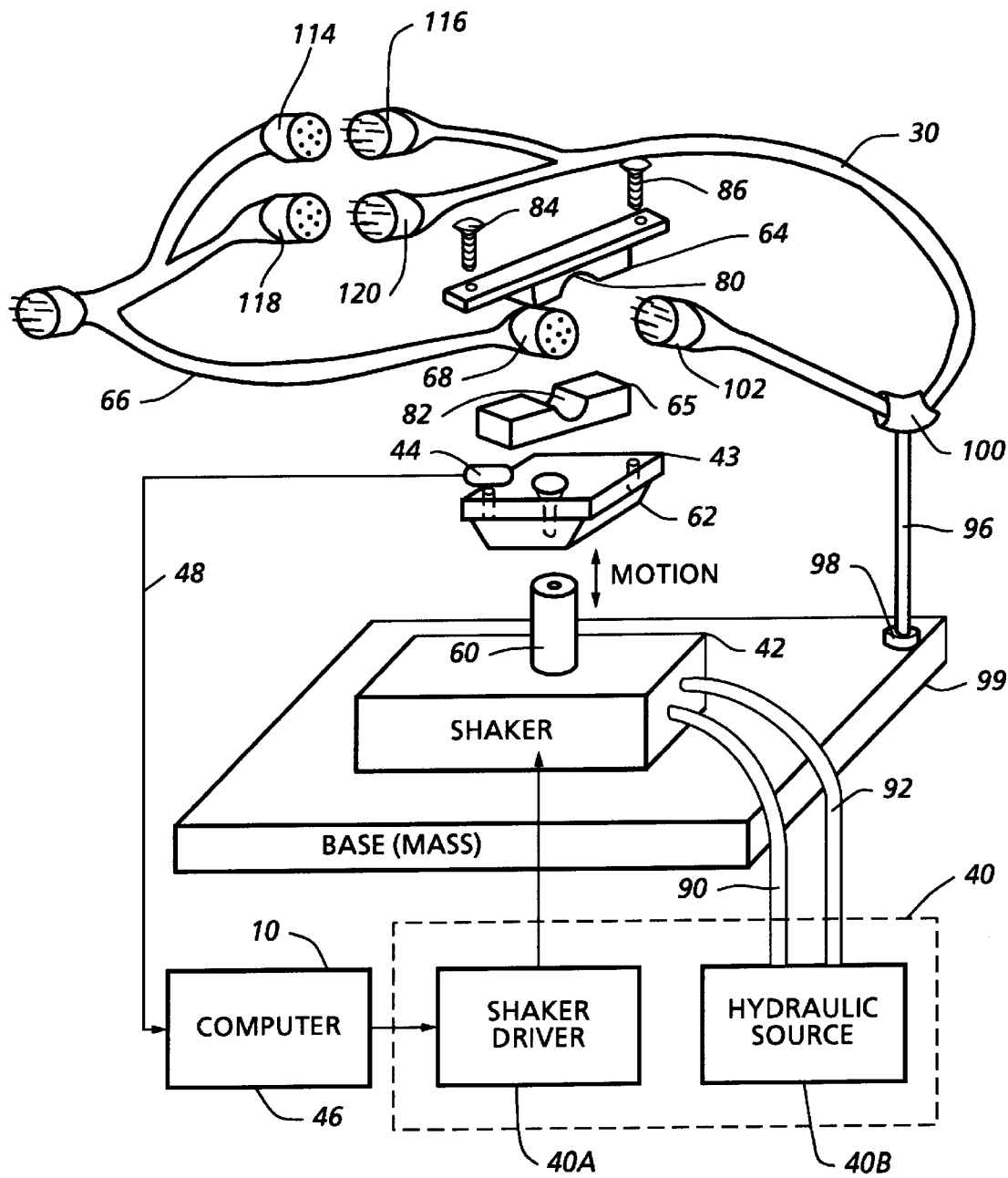
FIG. 2 is a schematic diagram showing in more detail the equipment for mechanically inducing intermittent faults in the embodiment shown in FIG. 1.

As shown in FIG. 2, the main hardware components of the dynamic stimulation subsystem include a shaker operator 40 which operates a hydraulic shaker 42 to vibrate a test fixture 43. The operator includes a shaker driver 40A and a hydraulic source 40B. The shaker driver receives via line 46 signals from the vibration controller program running on the computer 10, and uses those commands to control a valve in the shaker 42 the regulates the flow of the hydraulic fluid provided by the hydraulic source 40B. Mounted on the test fixture, in addition to the cable 30 under test, is an accelerometer 44. The system is controlled by a software program loaded into the memory of computer 10, which sends control signals via line 46 to the shaker driver 40A, and receives feedback signals via line 48 from accelerometer 44, and via an I/O card in the I/O interface slots 50 (FIG. 1).

The cable test fixture 43 is mounted on the hydraulic shaker's actuator piston 60 and includes a base portion 62 and a clamp portion 64, 65. The cable under test (CUT) 30 is connected to an adaptor cable 66 for communication with the signal processing subsystem. A connector 68 of the adaptor cable 66 is secured in the test fixture 43, thus transmitting the vibration energy from the shaker to the CUT 30. This is at least partially analogous to the cable being plugged into a socket when in actual use under field conditions.

The clamp portion is comprised of two main pieces 64 and 65, containing notches 80 and 82, respectively, for receiving the connector 68. The lower piece 65 rests on the base portion 62 of the test fixture and receives the adaptor cable connector 68 into notch 82. The notch 80 in the upper portion 64 fits over the upper surface of the connector 68. The top portion of the clamp is then secured to the base 62 of the test fixture by threading bolts 84 and 86 through the threaded holes provided in base 62. Tightening the bolts presses the upper portion 64 of the clamp firmly onto the connector 68, which holds the connector against the lower portion 65 of the clamp, and which also forces the lower portion 65 firmly against the base of the fixture. Any cable connector shape or size can be accommodated by modifying the notches 80 and 82 in the clamp.

In this preferred embodiment the hydraulic shaker system 42 provides 1000 force-pounds for sine wave oscillations up to 3000 Hz, and is available from TEAM Corporation. For the typical multiconductor cable, e.g., from two to twelve pounds, this force rating and frequency response is more than adequate to produce repeatable intermittent faults without damaging the CUT. This particular model was chosen because it presented the best compromise between performance requirements, size, and cost. For example, an electrodynamic shaker with same force rating and frequency response would be significantly larger; and an acoustic vibration system would be much more expensive. However, any suitable vibration system could be selected.

The shaker driver 40A receives a control signal 46 from the vibration control program running on the PC, and amplifies and converts the control signal to control the hydraulic shaker actuator piston 60. The hydraulic source 40B provides hydraulic power to the shaker via lines 90 and 92. The flow of hydraulic fluid in lines 90 and 92, regulated by the shaker driver, operates the actuator piston, which determines the characteristics of the oscillation, e.g., force and frequency.

The accelerometer 44 is mounted on the test fixture and produces an electrical signal that is proportional to the acceleration (g) forces that it detects during testing. This signal provides a closed-loop feedback to the vibration controller program running on the PC, which can modify its control signal to maintain the vibration within the test profile parameters. The accelerometer used in this preferred embodiment, a general purpose quartz shear accelerometer available from PCB Piezotronics, Inc., is equipped with its own power source (not shown).

Additionally, the dynamic equipment provides for an optional form of the vibration test, referred to as a flex test. Research has indicated that the primary source of intermittent faults occurs at the conductor-connector junction. The flex test is designed to place additional strain on this junction to elicit any faults that might not be induced in the vibration-only test. As shown in FIG. 2, a rigid arm 96, referred to as the flex arm, is attached at one end 98 to the hydraulic shaker base 99, and at the other end 100 to the CUT 30.

When the actuating piston and thus the CUT are in motion during a vibration test, the flex arm anchors the CUT at end 100 of the flex arm, preferably at a point on CUT 30 which is 10 or 15 centimeters from connector 102. This is the connector forming one part of the connector—connector junction between connectors 68 and 102. Keeping the cable stationary at the point of attachment 100 places an additional load on the conductor-pin junction in connector 102 and may generate an intermittent fault that would not have otherwise been detected during the vibration-only test. Additionally, the flex arm assists in producing a constant, repeatable, load factor that will generate any hidden intermittent faults without damaging the CUT.

Sometimes cables have only one connector for each end of the cable, as illustrated at the junction of connector 110 and connector 112 in FIG. 1. In other cables, at least one end of the cable may be split to form a plurality of connector points. In FIG. 2, the adaptor cable 66 has been split to accommodate a split CUT 30, so that one junction is formed between adaptor cable connector 114 and CUT connector 116 and another junction is formed between adaptor cable connector 118 and CUT connector 120. Any one of these connector-connector junctions can be chosen as the junction to be tested in the shaker.

The vibration equipment can be controlled by software available from Vibration Test Systems (VTS) as Digital Random Controller DRC-1. The software package comes with an I/O card for transmitting control signals to the shaker on line 46 and receiving feedback from the accelerometer on line 48. Thus, the system uses a closed-loop control scheme to maintain the dynamic stimulation within predetermined limits set by the user in the form of a vibration profile.

Figure 4:
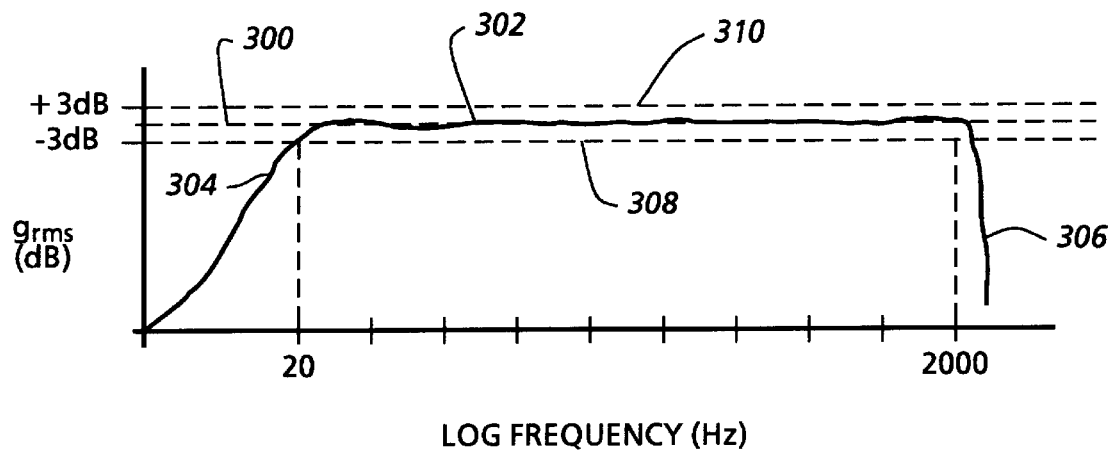
FIG. 4 illustrates a vibration profile providing a plot of g-forces versus frequency of oscillation.
Figure 5:
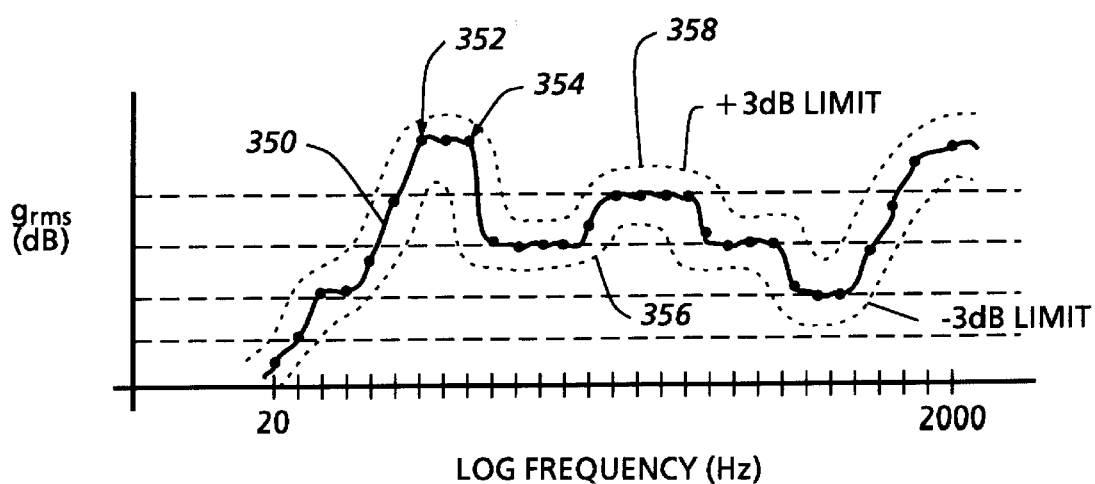
FIG. 5 illustrates a random vibration profile customized for a particular cable type by setting 30 break points to establish the magnitude of the vibrations at various frequencies.

The VTS software allows the user to select from a variety of predetermined vibration profiles or create a specialized profile. A vibration profile refers to the plot of g-forces versus frequency of oscillation as shown in FIGS. 4 and 5. The vibration controller program is capable of controlling oscillation at between 10 Hz and 2000 Hz, and the g value depends on the type of vibration equipment used, e.g., the force rating. For general cable testing purposes, a random vibration profile ranging from 20 to 2000 Hz which produces an average acceleration of 4 $g_{rms}$ (the root mean square of the g force) is recommended. It was found that acceleration values less than 4 $g_{rms}$ failed to generate consistent test results (i.e., was not reliably inducing the intermittent faults). Furthermore, acceleration values greater than 4 $g_{rms}$ failed to enhance the accuracy or repeatability of the tests, and only served to place the CUT under greater strain, thus increasing the risk of damaging the CUT during the test procedure.

A random test profile is recommended because it was found to produce the most accurate and repeatable intermittent fault detection. A random vibration profile provides acceleration forces at all frequencies over a preselected range or band (e.g, 20 Hz to 2000 Hz as shown in FIGS. 4 and 5), thus increasing the chance that any defective pin or conductor will be in mechanical resonance at some point during the test.

The random profile takes advantage of the fact that all physical structures have at least one characteristic natural frequency at which the structure prefers to vibrate or oscillate. One consequence of this property is that even a small periodic disturbance at that structures natural frequency may cause significant forced vibrations in the structure.

Each cable may have a different stiffness due to its component materials, the gauge of the conductors, the type of shielding or insulation, or the size of the connector. Accordingly each individual pin or conductor may have a different and distinct natural frequency. Thus, if a defective pin, connector, or conductor is not being subjected to vibration energy at its resonant frequency at the precise moment it is tested by the system, an existing intermittent fault in the system may not be detected simply because it is not being induced.

However, this difficulty is overcome by using a random test profile, which stimulates the workpiece at all of the distinct frequency values over a preselected range simultaneously. Thus, the particular $g_{rms}$ value at any frequency is random, but the average $g_{rms}$ over the entire band is maintained at the preselected value, which can be constant (FIG. 4) or varied (FIG. 5). In this fashion, a lower $g_{rms}$ value over a broad range of frequencies will elicit as many faults as a higher, and potentially damaging, $g_{rms}$ value at a discrete frequency.

As illustrated in FIG. 5, the VTS software allows the user to customize the envelope of the random vibration profile for a particular cable type by setting 30 break points, to define a random vibration profile 350. A break point, for example, points 352 and 354, refers to a setting a specific $g_{rms}$ value for a particular frequency. The software then automatically fills in the $g_{rms}$ values for frequencies between the specified break points to create the profile 350. Each customized profile can be saved to disk with a user-defined descriptive filename, perhaps referring to the particular cable type for which the profile is to be used.

Additionally, as shown by dashed lines 308 and 310 in FIG. 4, and 356 and 358 in FIG. 5, the VTS software allows the user to set absolute maximum and minimum values for the $g_{rms}$ value. In this preferred embodiment, the VTS software has been configured with limits at the plus or minus 3 dB $g_{rms}$ value.

Although a random test profile is recommended, it would be possible to use a different controller program to generate a multiplicity of other test formats; for example, a sweeping sine test, or a shock test. A sweeping sine profile involves stimulating the workpiece for a predetermined time at a series of discrete frequencies. The frequency values may begin at a value X, be increased in steps up to a value Y, and then be stepped back to the initial value. Although this variety of testing may be preferred in some applications, our results showed that it was not as well suited as the random test profile to a generic intermittent fault detection scheme. Swept sine vibration did not yield predictable or consistent results, took hours to perform, and was more destructive to the CUT than the random test profile.

It is also possible to use shock testing to agitate the CUT, which involves stimulating the cable over a broad frequency range for a brief time. However, shock testing did not allow time for completing the signal processing portion of the testing, and had other drawbacks similar to those obtained in sine vibration testing. Also, combinations of dynamic stimuli did not produce better results than the random profiles.

In this preferred embodiment of the invention, the constant 4 $g_{rms}$, 20 to 2000 Hz random vibration profile, as shown in FIG. 4, has been made the default vibration profile which is selected automatically each time the vibration controller software is loaded. Once the random vibration test is started, the vibration controller program gradually raises the $g_{rms}$ level to the test level to prevent the CUT from being damaged with a transient.

Returning now to FIG. 1, for a discussion of the signal processing subsystem. The test signal is applied to, and read from, the individual pins of the cable under test (CUT) via computer interface cards. The particular cards or combination of cards chosen must be capable of handling a sufficient number of pins, and must be able to transmit and receive data and control signals quickly enough to implement the program. This preferred embodiment is configured with three CIO-DIO192 cards available from ComputerBoards, Inc. Each card is capable of communicating with 192 pins (96 conductors), enabling the system to handle a total of 576 pins (288 conductors), although the system could be expanded to include any number of cards. The input and output signals for each CIO-DIO192 card are controlled by eight 82C55A-5 PPI chips, with each chip configured into eight-bit ports, each port thus being able to control or monitor eight pins from the CUT. However, any suitable I/O card could be chosen to implement the principles of the invention.

Optionally, each I/O pin of the I/O card can be connected to ground potential through a resistor. This precautionary measure is intended to prevent the voltage of the pins from "floating" or otherwise changing from ground potential in the absence of a true signal carried by the wires and pins of the CUT. Also, the system could include a set of electrostatic discharge (ESD) buffer cards. The ESD buffer cards provide a buffer between the I/O cards and the CUT by absorbing any electrostatic discharge coming from the CUT, and can also boost the output signal from the I/O cards (above the 3 V normal level) to allow the system to drive longer CUTs.

The I/O pins of the cards are numbered consecutively, 1 through 576, and are hardwired to Double "D" (D/D) female connectors, available from The Amp Company. The D/D connectors were chosen because they are widely used in conventional cable testing systems, and should be compatible with many existing adaptor cables. Additionally, the D/D connector provides a damping effect so that vibrations from the CUT are not transmitted directly to computer I/O slots. However, any suitable connector could be implemented.

The cable under test (CUT) is connected to the D/D connectors by an adaptor cable. One end of the adaptor cable is fitted with male D/D connectors (more than one if necessary), and the other end terminates in the appropriate connectors to mate with both (or all) ends of the CUT. Thus, the system is not limited to a CUT having only two connectors. The wiring of the adaptor cable determines which pins of which connector of the CUT are mapped to which pins of the I/O cards via the D/D connectors. For simplicity and consistency, it is recommended that like-numbered pins in the I/O cards, the D/D connectors, the adaptor cable, and the CUT are mapped to one another. However, any pin-mapping scheme could be employed provided that the user is aware of the scheme and can correlate the data provided by the system with the physical structure of the CUT.

Figure 6A:
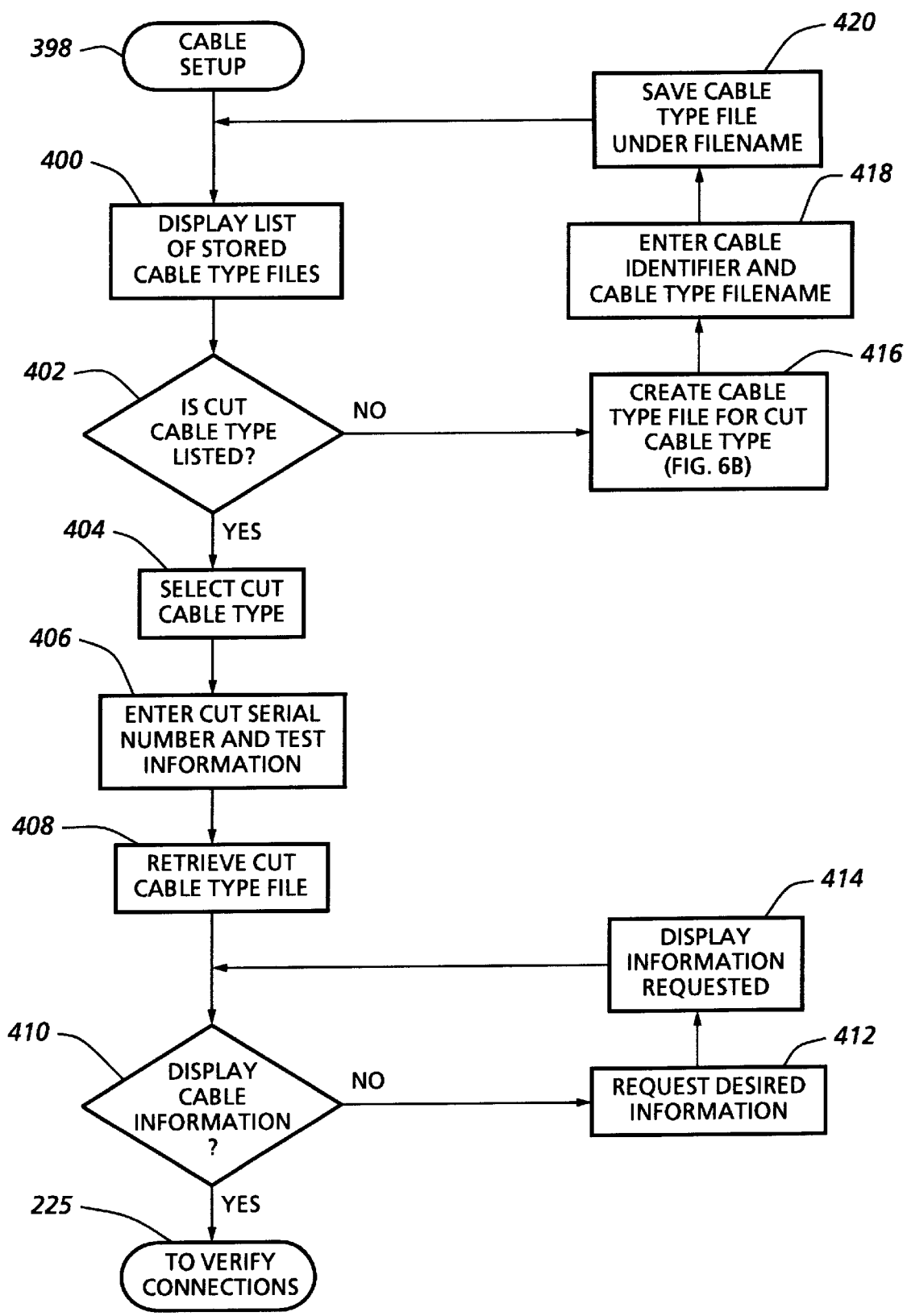
FIGS. 6A and 6B form a flow chart showing the steps of selecting and defining the cable type for the cable under test, according to one embodiment of the invention.

The signal processing software was developed specifically for this system in Turbo C++ programming language. The signal processing system is shown generally on the right side 198 of FIG. 3B. Step 224 of FIG. 3B, the cable setup procedure, is shown in greater detail in FIGS. 6A, 6B. Beginning at entry point 398 of FIG. 6A, the user is first presented 400 with a display of cable types that have been tested previously. Each cable type displayed or listed represents a file that contains wiring information for previously tested known good cables. The files for these files may be stored on the hard drive or on a diskette in the floppy drive. The cable files include information on the cable's connector type, pin configuration, and continuity paths between the pins.

The continuity paths are preferably stored in a two dimensional array of single-bit elements, a "bit map." Each dimension of this square matrix is equivalent to the total number of pins available on the cable. For example, for a cable with N total pins, the continuity array will be an N×N array of bits. The individual elements of the array, denoted by (row, column), indicate whether the pins corresponding to that row index and column index are connected: a "1" (the bit is "set") indicates a connection; a "0" (the bit is "cleared") indicates no connection. By convention, the row index represents the pin into which the test signal is injected, and the column index represents the pin at which the response is measured. For example, a 1 in element (X, Y) indicates that when a signal is input into pin X, that signal should be present at pin Y via a continuity path between those pins.

It is important that all pins are listed both as inputs and outputs. Some cables include direction-sensitive continuity paths. For example, if a conventional diode is connected with its cathode end to pin X and its anode end at pin Y, the continuity path will be present in only one direction, from Y to X. Accordingly, the continuity matrix should contain a 1 in element (Y, X), but not in element (X, Y).

If the appropriate cable type is listed 402, the user selects 404 from the list the cable type corresponding to the current CUT. If the needed cable type is not found, the user selects the option 416 to define a "new" cable type continuity matrix. This procedure is outlined in FIG. 6B, entered at entry point 448. Ideally, when defining or creating the continuity matrix for a new cable-type, the CUT should be a known good cable, so that the continuity information is accurate. If the status of the cable is unknown, the matrix can be generated, printed, and compared with the CUT's wiring schematic provided by the CUT manufacturer.

Figure 6B:
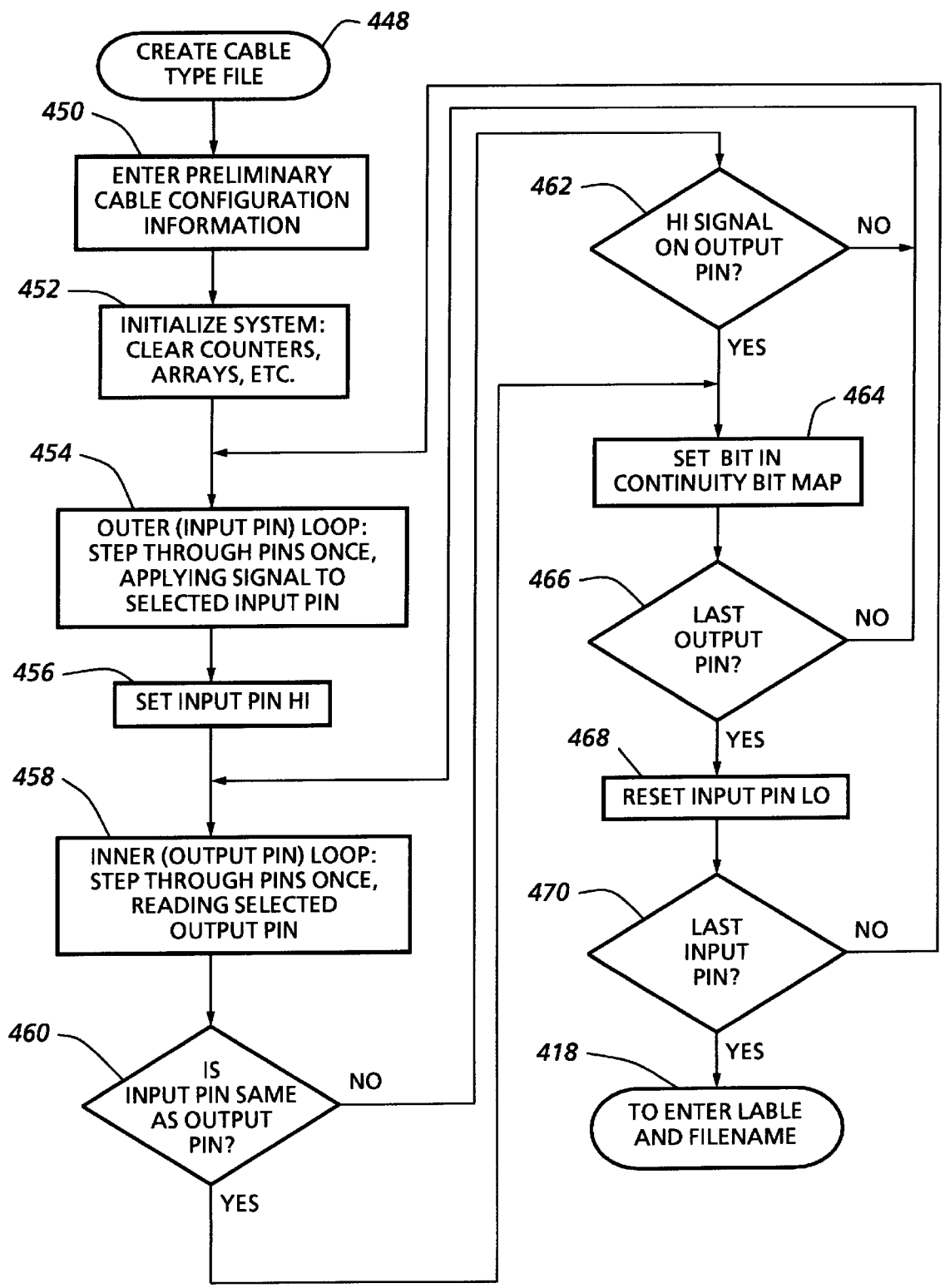

As indicated in FIG. 6B, the user is prompted 450 enter the general information regarding the cable configuration including connector and pin designations and the total number of pins available on the CUT. The system creates 452 an appropriately sized continuity matrix with all of its elements initially cleared (filled with Os), indicating no continuity between the pins. Additionally, all of the pins are initially driven 452 to logic 0 (LO) to avoid any false signals during the test.

The procedure creates the continuity matrix using a nested loop structure: each iteration of the outer loop 454 selects a different input pin and is equivalent to stepping through the rows of the matrix; and each iteration of the inner loop 458 selects a different output pin and is equivalent to stepping through the columns. During the outer loop, the program places a logic 1 (HI) signal 456 on one pin at a time, the input pin, corresponding to that row of the matrix. During the inner loop, unless 460 the input pin is the same pin as the output pin, the program reads each of the remaining pins in the CUT, the output pin, corresponding to the columns of the matrix. If the signal is detected 462 on the output pin, the program places a 1 in the appropriate element (INPUT-PIN, OUTPUT-PIN) of the matrix 464. If no signal is detected, i.e., no connection between the pins, no entry is required because the matrix has been initialized with Os and the program immediately returns to the beginning of the inner loop 458 to read the next output pin (and step to the next column).

When all the remaining output pins have been checked 466, the program resets 468 the input pin to logic zero (LO), and if the last input pin has not been reached 470, returns to the beginning of the outer loop 454 to apply a HI signal 456 to the next input pin, and repeat the procedure for the new input pin. When each pin in the CUT has served as an input pin, the matrix will be complete 470.

Returning to FIG. 6A, the user is prompted to provide a filename 418 for the cable file under which it will be saved 420, and also to enter a brief label or descriptive information that will be used to identify the cable type in the cable list. When completed, the cable list is again displayed 400, this time including the cable-type file just created by the user. The user can then select 404 the appropriate cable type from the list and begin the test. The program creates a test-data file for each individual CUT. Consequently, the user is prompted 406 for the serial number of the CUT as well as a short description for the test to be performed, e.g., perhaps the cable is exhibiting a very specific type of fault.

Once this information is entered, the program retrieves 408 the cable information file for the selected cable type. The user is then given the option 410 to display the information recorded in the cable file. For example, by entering 412 a pin number, the program lists 414 all other pins that are connected to the entered pin. If desired, the user could print out a complete list of the continuity paths to be checked against the wiring schematic provided by the cable manufacturer.

Figure 3A:
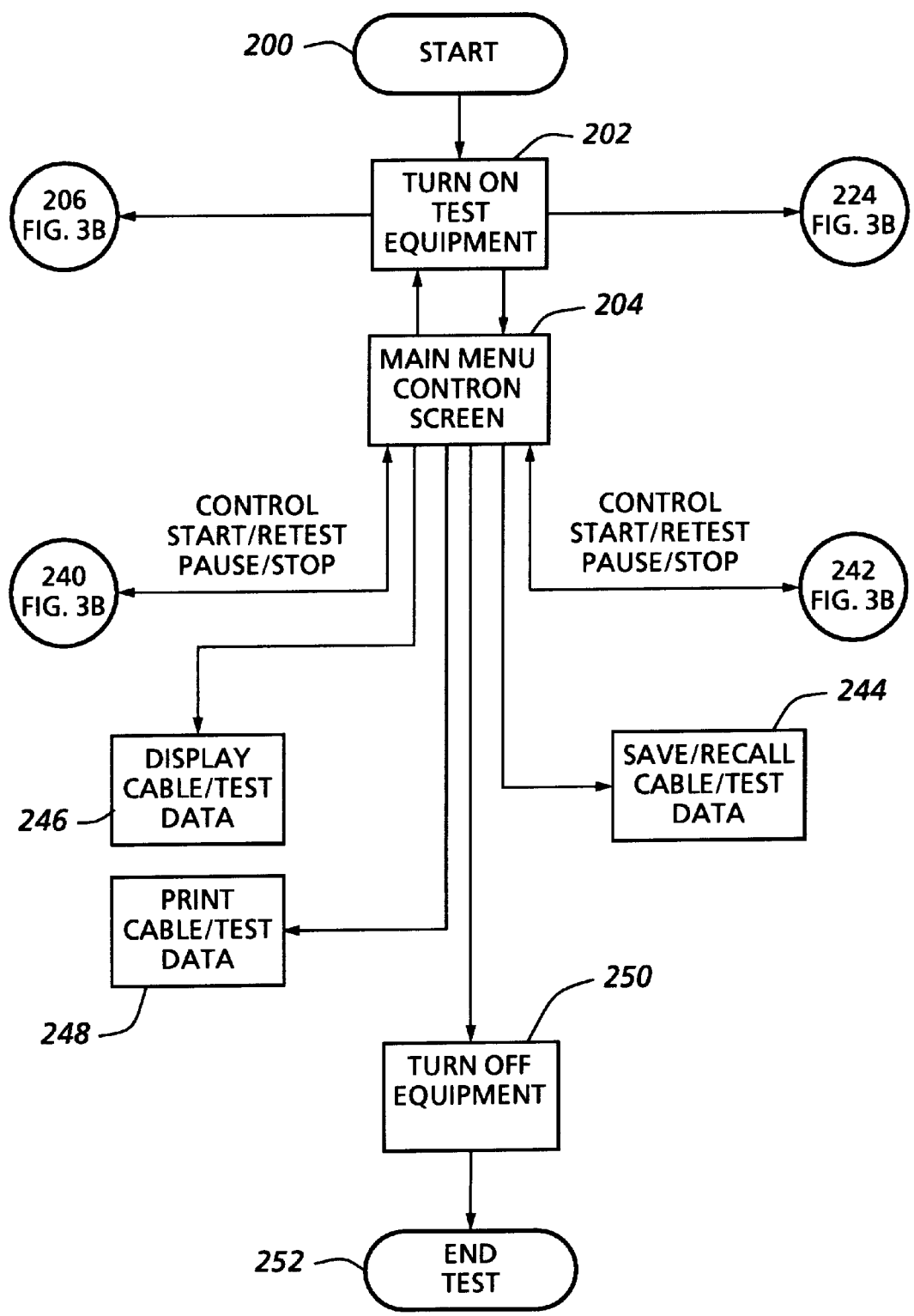
FIGS. 3A and 3B form a flow chart showing the dynamics control steps for inducing intermittent faults in a cable and the signal processing steps for detecting and recording those faults, according to one embodiment of the invention.
Figure 3B:
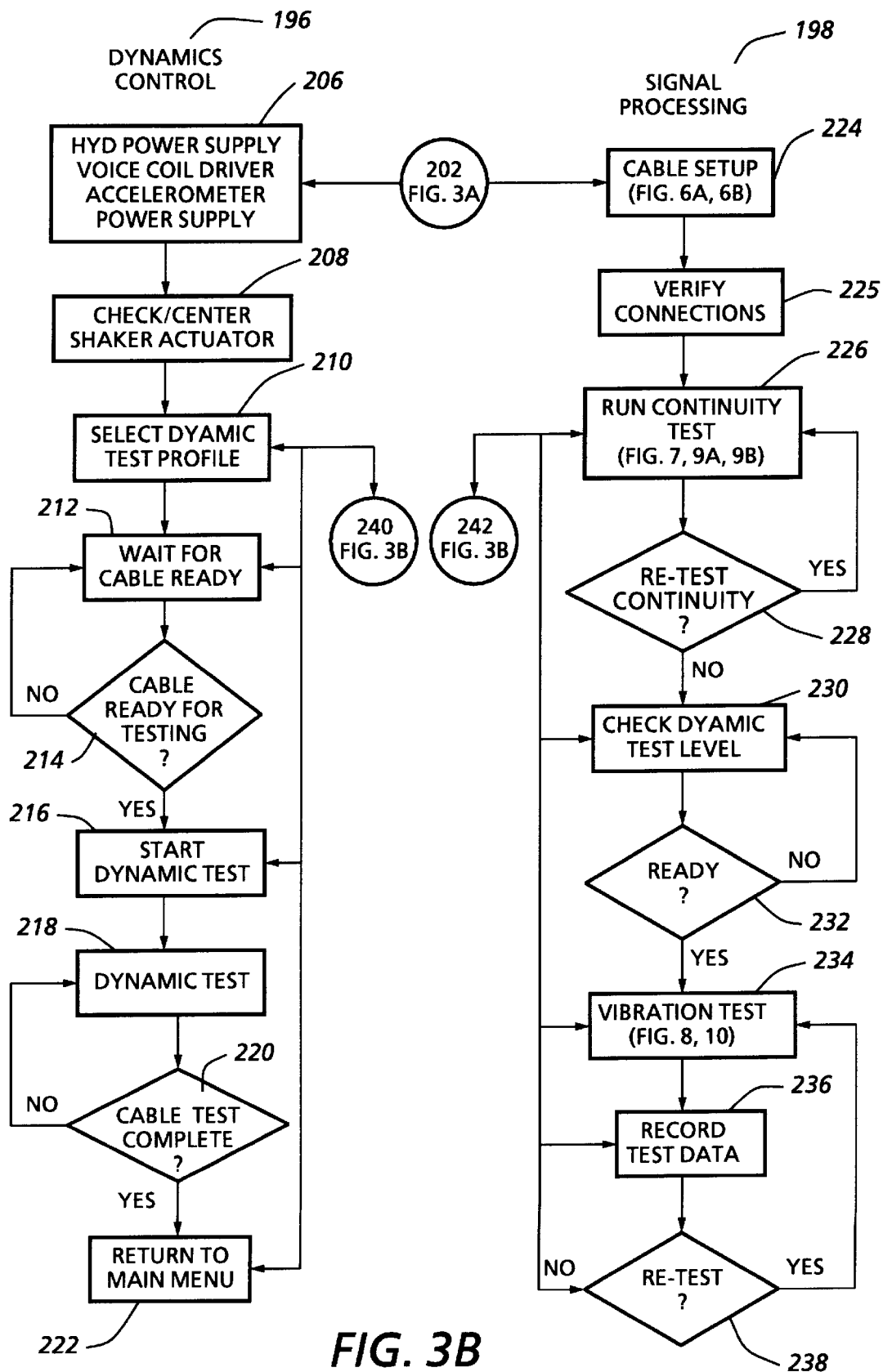

Next, as shown in FIG. 3B, the user is directed 225 to verify the cable connections necessary for the test: inserting the adaptor cable into the D/D socket(s), connecting the adaptor cable to the CUT, and fixing the adaptor cable into the test fixture. When all connections are complete, the user may begin the testing sequence. At this point, the dynamic equipment has not been activated.

Figure 7:
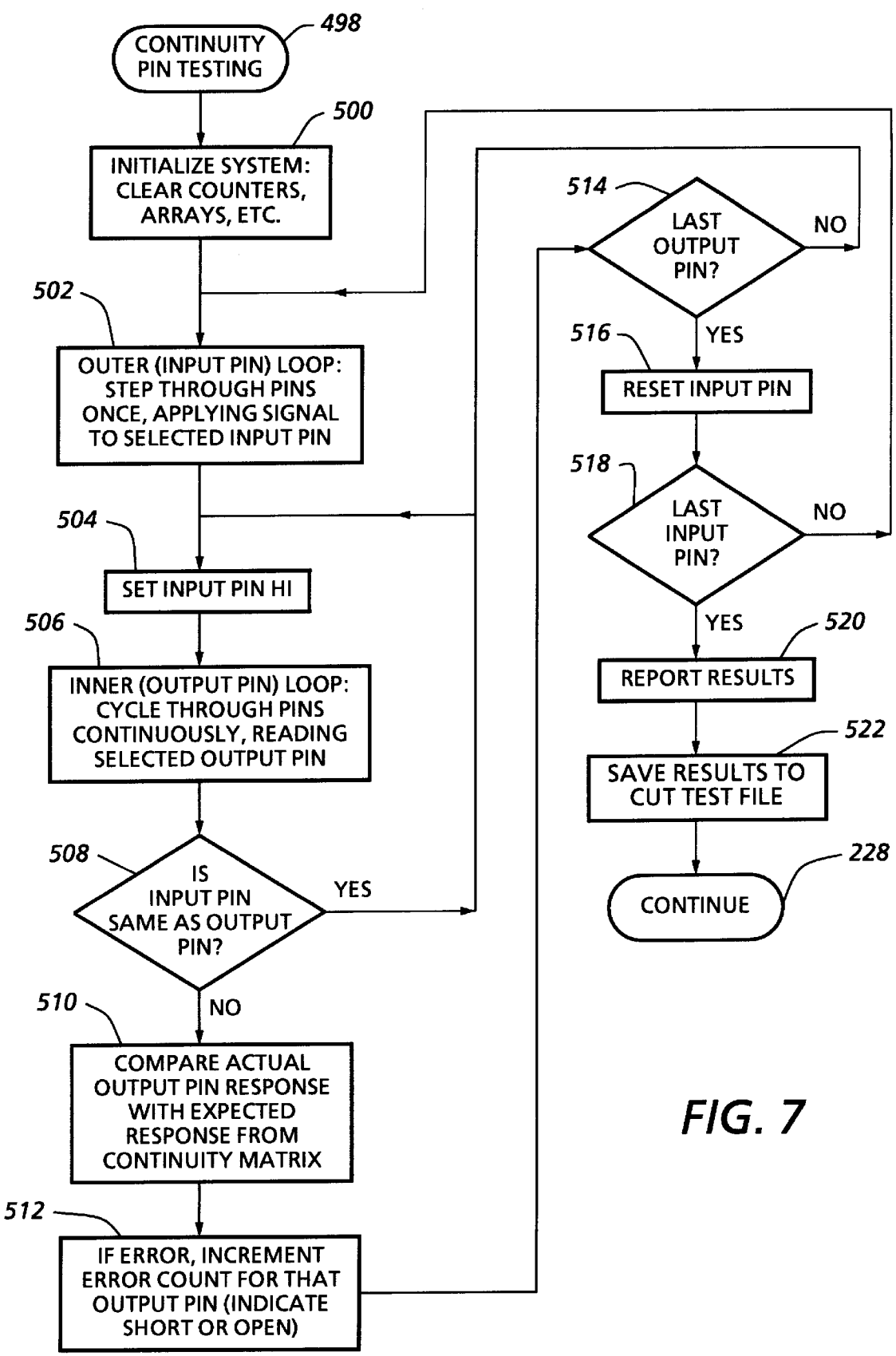
FIG. 7 forms a flow chart showing the steps of checking the continuity between various pins without the vibration stimulus, according to one embodiment of the invention.

First, as shown generally at step 226 of FIG. 3B, and specifically beginning at entry point 498 of FIG. 7, the program conducts a continuity test without the dynamic stimulus. This portion of the test is similar to tests performed by conventional cable test systems in that it is designed to check only for "hard" opens or shorts. The continuity test procedure is similar in many respects to the procedure used to acquire a "new" continuity matrix, as in FIG. 6B.

The program first 500 drives all of the pins LO and creates an appropriately sized test matrix (as distinguished from the continuity matrix for the cable) with each element initialized to Os. Using a nested loop structure, 502 and 506, similar to the process in FIG. 6B, the system acquires a continuity matrix for the CUT and stores it as the test matrix. If desired, the program can continuously reacquire the test matrix until there are no changes in the elements of each successive test matrix (to be sure that the system is not catching an intermittent fault even without the dynamic stimulus being applied).

As each element (INPUT PIN, OUTPUT PIN) of the CUT test matrix is acquired it is compared 510 to the corresponding element of the stored continuity matrix previously created for the CUTs cable type. Any connections shown in the test matrix that are not found in the continuity matrix represent a short circuit, and any missing connections represent an open circuit 512. At the completion of the continuity test 518, the program displays 520 the results, and saves 522 those results to the CUT test file. The faults are reported by pin numbers, connector number, and error type, i.e., open circuit or short circuit. If no faults were recorded, the program issues a statement that the cable has passed the continuity test.

Returning to FIG. 3B, the user is then presented with the option 228 of repeating the continuity test, initiating the dynamic test at 230, or returning to the main menu 204 (FIG. 3A). Assuming the user selects the dynamic testing, the program then directs the user to initiate the dynamic stimulus 230. The user would then power up the dynamic equipment and initiate the (VTS) vibration controller program 206. The user selects the vibration profile desired 210, and the vibration controller program gradually brings the shaker up to the desired operating level (304 in FIG. 4) so that the CUT is not damaged by any transients during the start up sequence. The status of the shaker can be monitored on the controller-generated vibration profile display as shown in FIGS. 4 and 5; when the equipment is ready, the user may start the vibration test sequence 216, 234.

Figure 8:
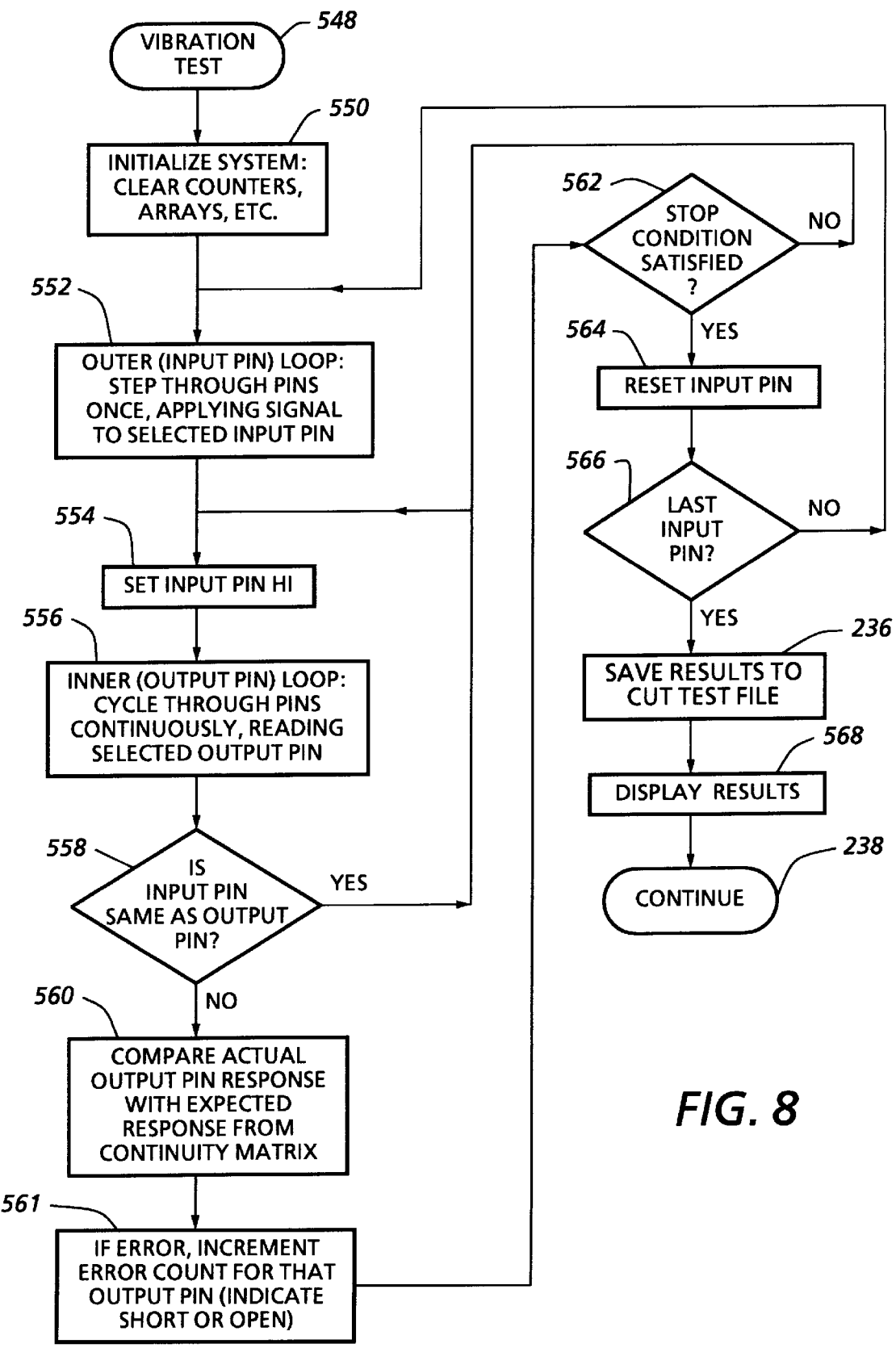
FIG. 8 forms a flow chart showing the steps of checking the continuity between various pins with the vibration stimulus, according to one embodiment of the invention.

As shown in FIG. 8, the vibration testing method contains many similarities to the continuity test procedure of FIG. 7. A nested loop structure, 552 and 556, is used to apply the input signal 554 to the selected input pin, and to compare the measured response for each output pin with the expected response 560. The primary difference in the testing methods is that, for every input pin (selected in the outer loop 552), the response of each output pin (selected by the inner loop 556) is measured multiple times before moving on to the next input pin. In other words, each "row" of the test matrix is acquired repeatedly. As each element in the row is acquired, it is compared 560 with the corresponding element in the continuity matrix and any errors for that bit are recorded in an error array. Each time an error is detected, the error count for that corresponding error type, either open or short, is incremented 561 for that combination of input-pin and output-pin, i.e., corresponding to test matrix element (INPUT PIN, OUTPUT PIN).

The row in the test matrix is continuously acquired until a stop condition is satisfied 562. The stop condition can be any predetermined event; for example, after a time interval (dwell time), when row has been acquired a specified number of times, or if any of the pins reaches a maximum number of errors. The specific stop condition may be determined by the user based on the particular circumstances under which the CUT is being tested. Alternatively the stop condition can be used to bring about multiple repeated measures of the response of the current output pin before moving on to measure the response of the next output pin selected by the inner loop 556. In other words, rather than repeatedly acquiring the corresponding row of the test matrix until the stop condition occurs, the program can repeatedly acquire the corresponding element of the test matrix until the stop condition is satisfied.

The results of the vibration test are automatically saved to the cable test file 236 and reported 568 to the display. Any intermittent faults detected are listed according to the pin numbers and connector(s) involved, and the type of error (i.e., short or open), and the number of each type of error.

If no errors were recorded, the program issues a statement that the cable has passed the vibration test. Returning to FIGS. 3A and 3B, the next menu 238 allows the user to run another vibration test, start over at the main menu, or exit the program. At the main menu 204 the user can display the cable or test data 246, print a copy of the test results 248, or annotate the test results file 244 with a brief description or comments regarding the results.

At this point, it is preferred that the user run the flex test by repeating the vibration test with the flex arm attached. However, the shaker equipment should be turned off and allowed to come to rest before attempting to connect the flex arm so that the CUT is not damaged during the procedure. As shown in FIG. 2, the flex arm should be placed in position on the shaker base and attached to the CUT at the desired point, e.g., approximately ten centimeters from the CUT connector. The user then merely follows the procedure described above for the vibration-only test. Again, when complete, the test results will be automatically saved to the CUT test file.

The continuity, vibration, and flex tests can be run as many times as desired, and each time the results are appended to the CUT file. At any time the user may enter the main menu 204 and display or print selected portions of the CUT test file for contrast or comparison, or append notes or comments to the file at the conclusion of any test.

Figure 9A:
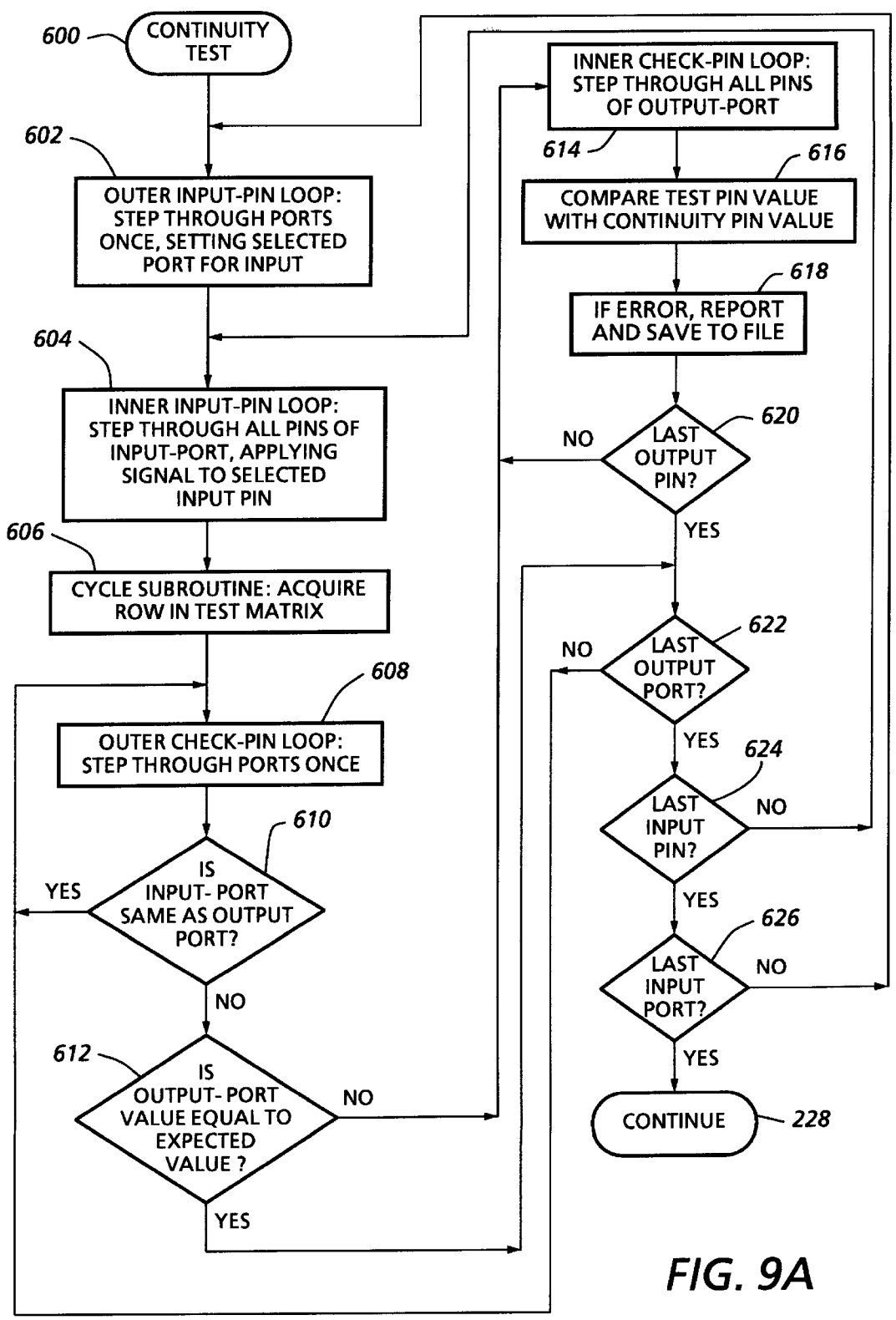
FIGS. 9A and 9B form a flow chart showing the continuity test steps which can be used in one embodiment of the invention.
Figure 9B:
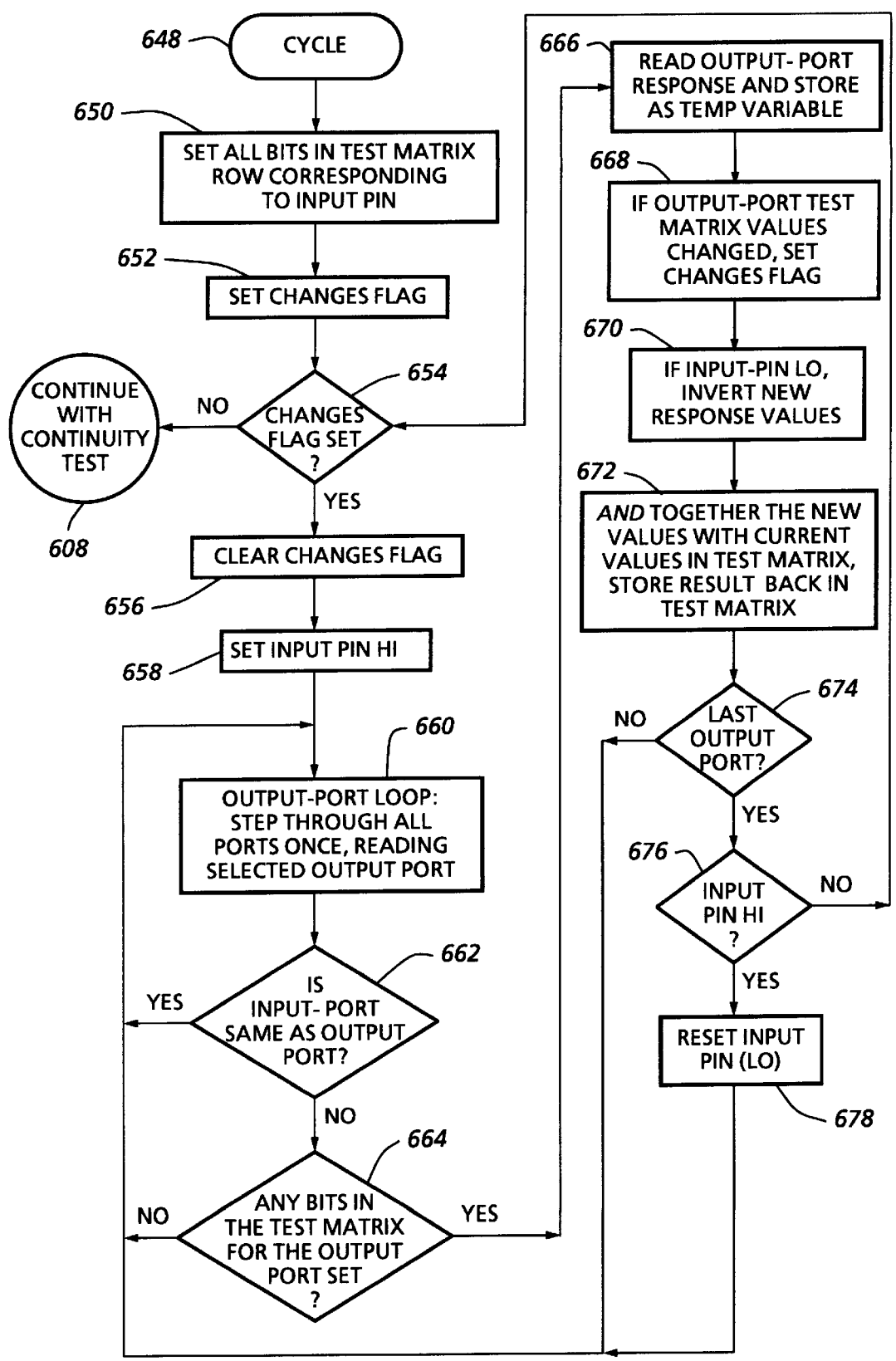

The specific format used to perform the foregoing testing procedures may vary somewhat depending on the particular hardware chosen to implement the principles of the invention. For example, the CIO-DIO192 I/O cards are configured into eight bit ports, meaning that eight pins are written to, or read from, at a time. Additionally, the form of the input signal may be varied according to the specific testing conditions. FIGS. 9A and 9B show a process for performing the continuity check using the I/O cards configured into eight-bit ports, and using a two-stage HI-LO cycle for the input signal.

As shown in FIG. 9A, selecting the input pin (and corresponding row of the test matrix) is itself accomplished by a nested loop format. During each iteration of the outer input-pin loop 602 the program selects one of the eight-bit ports as the input port. Once the input port is selected, the inner input-pin loop 604 selects one pin at a time from that port as the input pin. When the input pin has been determined, program control is turned over to the CYCLE subroutine, which constructs the complete row of the test matrix corresponding to the selected input-pin.

As shown in FIG. 9B, the subroutine CYCLE repeatedly measures the response of the output pins until there are no changes in the corresponding row of the test matrix. Initially, all bits in the appropriate row of the test matrix are set (to 1), indicating a continuity path between the input pins and all of the output pins. Additionally, the CHANGES flag must be initially set (to 1) so the subroutine will enter its main output-port selecting loop 660. With each complete cycle (a HI-LO input cycle as described below) through the subroutine, bits are cleared if it is determined that their corresponding output pins are not connected to the input pin. If a bit is cleared, a CHANGES flag is set to indicate that the program is still eliminating unconnected pins, i.e., the row of the test matrix is still changing. When the subroutine has made a pass through all of the ports without having to clear a bit, the test matrix row is complete and the program continues with the remainder of the continuity test 646.

A complete "cycle" through the subroutine occurs when the response for all output pins has been measured twice: once when the input pin is HI, and once when it is LO. Before entering the loop to step through the output ports, the program drives the input pin HI, and clears the CHANGES flag. First, the program checks the eight-bit word, TEST_PORT, in the test matrix that corresponds to the pins of the current output port to see if any bits are set, thus showing a connection to the input pin. If none of the bits are set then they must have been cleared by the program during a previous cycle, so the program moves on to the next port. In the alternative, if any 1's are found, the program reads the current response of that output port and stores those values in an eight bit word, NEW_PORT.

If the input signal is HI, the program ANDs the current status of the port with the previous status (from the test matrix) and places the result back into the test matrix as the new connection list for those eight pins. Accordingly, the only bits that will remain set after the AND operation are those that contained a I in both the test matrix and the new-port values. The procedure when the input signal is LO will be discussed in greater detail later. If the connection list changed from its previous state, the CHANGES flag is set. The program repeats the foregoing procedure until each of the output ports has been read (NEW_PORT) and compared with its previous value (TEST_PORT).

At the completion of the read loop just described, the program checks to see if the input-pin is HI; if so, it is driven LO, and the read loop is restarted. The procedure inside the loop is the same except at step 670. After the current output port values are read in and stored in NEW_PORT, each bit is inverted (1's s flipped to 0s and vice versa) before NEW_PORT is ANDed with TEST_PORT. The result is that only those pins that were HI when the input pin was HI, and LO when the input pin was LO, will survive the two-step ANDing process. After all ports have been read, program again reaches step 676, and since the input pin is LO the subroutine jumps to step 654. If the program cleared any bits in the test matrix during the previous HI-LO cycle, the CHANGES flag will have been set and another cycle is initiated. Once a complete HI-LO input cycle has been run without changing any bits in the test matrix, the subroutine is terminated and the program continues with the continuity check.

In FIG. 9A, the program is comparing the row of the test matrix that it just determined with the corresponding row from the continuity matrix. The program initially compares the two rows eight bits (one port) at a time; if the words are equal, the program steps to the next word. If the two words are unequal, the program initiates a bit-by-bit check to determine the precise source of the error. The results of the comparison are reported in similar fashion to the method described previously. After all of the words and bits of the test matrix row have been checked against the continuity matrix row, the program continues on with the next iteration of the outer input-pin loop and the whole process is repeated. When the entire test matrix has been acquired and checked against the continuity matrix, the program continues on as described previously.

Figure 10:
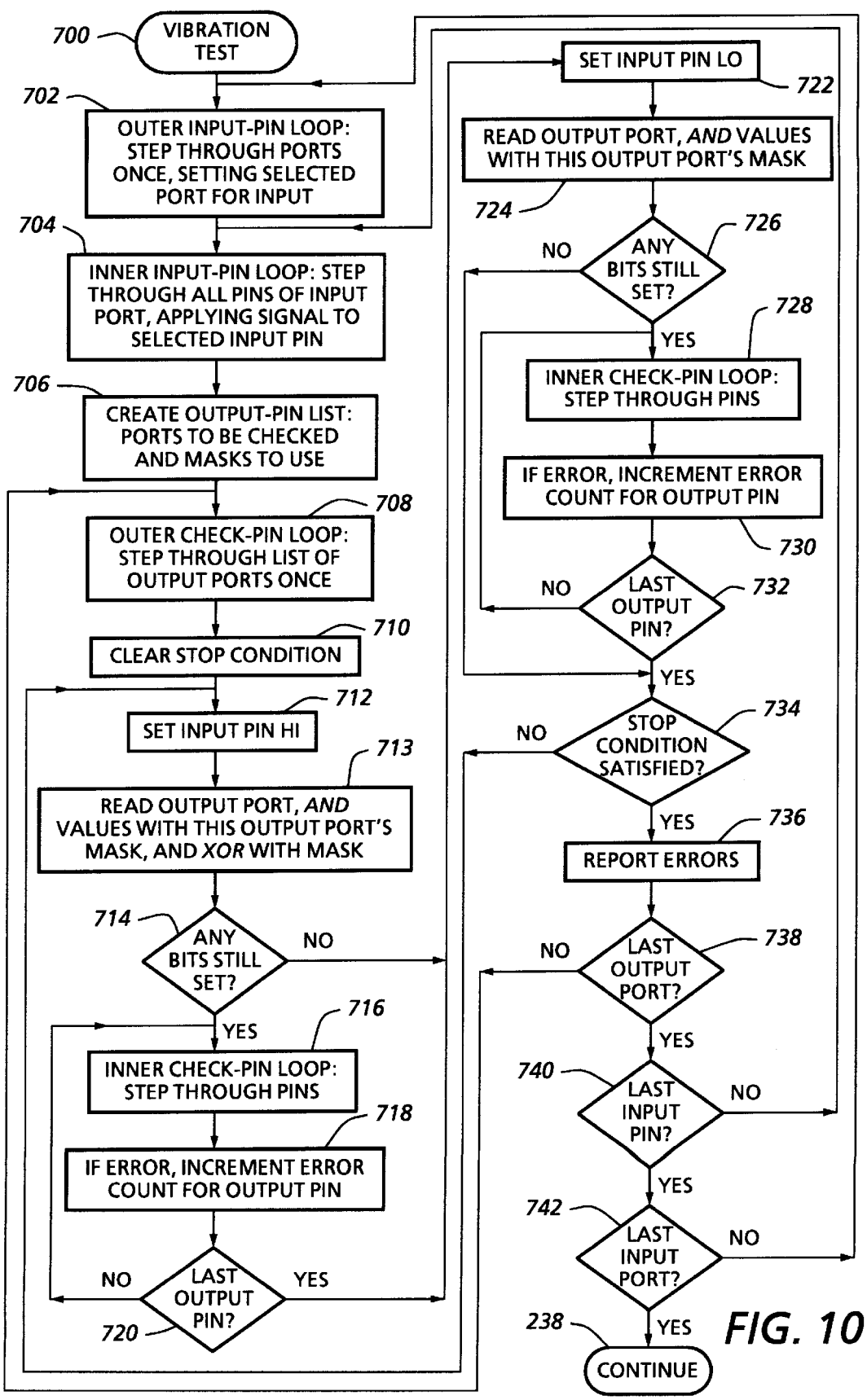
FIG. 10 forms a flow chart showing the vibration test steps which can be used in one embodiment of the invention.

Additionally, the general procedures described for continuity or pin testing can be modified depending on the particular types of faults the user is concerned about. For example, if the user is primarily concerned about intermittent open circuit conditions, an alternative embodiment of the program can be tailored to focus on detecting those errors. For example, FIG. 10 shows a method for performing the vibration pin testing that uses the eight-bit port configured I/O cards, the HI-LO cycled input signal, and that checks only for intermittent open circuit conditions. This embodiment of the program may be able to run significantly more quickly because checking for only open circuits requires that the program read the output response of only those pins that are (should be) connected to the selected input pin (as per the continuity matrix).

Similar to the continuity test of FIGS. 9A and 9B, the vibration testing method of FIG. 10 uses a nested loop structure to select a given input pin (and thus, a row in the test matrix and the continuity matrix). Next, the program constructs a test list of the output ports which contain pins that should be connected to the selected input pin. The program steps through the appropriate row of the continuity matrix one output port (eight bits) at a time; if any bits are set, the program adds that output port to the list, and stores that eight-bit word as a "mask" that will be used to isolate the desired output pins when that port is read. When the port list (with accompanying masks) is complete, the program enters the outer output-pin loop 708.

During each iteration of the outer output-pin loop, the program repeatedly measures the response of one of the output ports from the test list just constructed and compares that response with the expected response. When a STOP condition is satisfied, the program moves on to measure the response of the next output port on the test list, or, if none remain, then on to the next input pin. As discussed for the vibration testing method of FIG. 8, the STOP condition may be any number of parameters such as elapsed time, pins or ports read, or error counts.

The response of each output port is measured in a two-stage HI-LO input cycle similar to that used for the continuity test of FIGS. 9A and 9B. First the input pin is driven HI, and the response of the output port is read and stored in a temporary variable TEST_PORT. The eight-bit output value is ANDed (AND operation) with the appropriate mask (the corresponding eight bits from the continuity matrix) and placed back in TEST_PORT. Next, the TEST_PORT value is XORd (exclusive-OR operation) with the mask and placed back in TEST_PORT. If any bits of TEST_PORT remain set, an open circuit error condition is indicated. The only way a bit could remain set after ANDing and XORing with the mask is if (at least one of) the output pins from the test list was LO when the output response was measured.

If an error is detected, the program enters inner check-pin loop, in each pin of the TEST_PORT value is checked: when a bit is found to be set, the error count (open circuit) for that pin is incremented. If no errors are found (no bits are set after the XOR operation), the program continues on to the LO portion of the HI-LO cycle.

The input pin is driven LO, and again the response of the output port is read and stored in TEST_PORT. The output response is ANDed with the output mask, and any bits remaining set indicate and error. Again, the program checks each bit of the port and increments the error count for any bits (pins) remaining set.

The program continues reading the output port using the two-stage HI-LO cycle just described until the STOP condition is satisfied, at which time any errors found are reported to the screen and saved to the test file. Next, the program moves on to the next output port in the test list, or to the next input pin. When each pin of the CUT has served as an input pin, the vibration test is finished and the program continues as described previously.

As well as alternate testing methods, an alternative preferred embodiment of the invention employs a different hardware and software configuration for the signal processing subsystem. Rather than measuring the response of each pin (or port) serially or sequentially, this embodiment of the invention reduces testing time by using a distributed, parallel processing scheme to test groups of pins simultaneously.

To facilitate the following discussion, the embodiment previously described (see FIGS. 1–10) is referred to as either the computer controlled embodiment or the central processing embodiment, while the embodiment about to be described (see FIGS. 11–22) is referred to either as the multiprocessor controlled embodiment or the distributed processing embodiment. In addition, unless otherwise noted, the term "processor" is used as a generic term intended to encompass processors, microprocessors, controllers, microcontrollers, and equivalent devices.

Distributed Processing Embodiment

Figure 11:
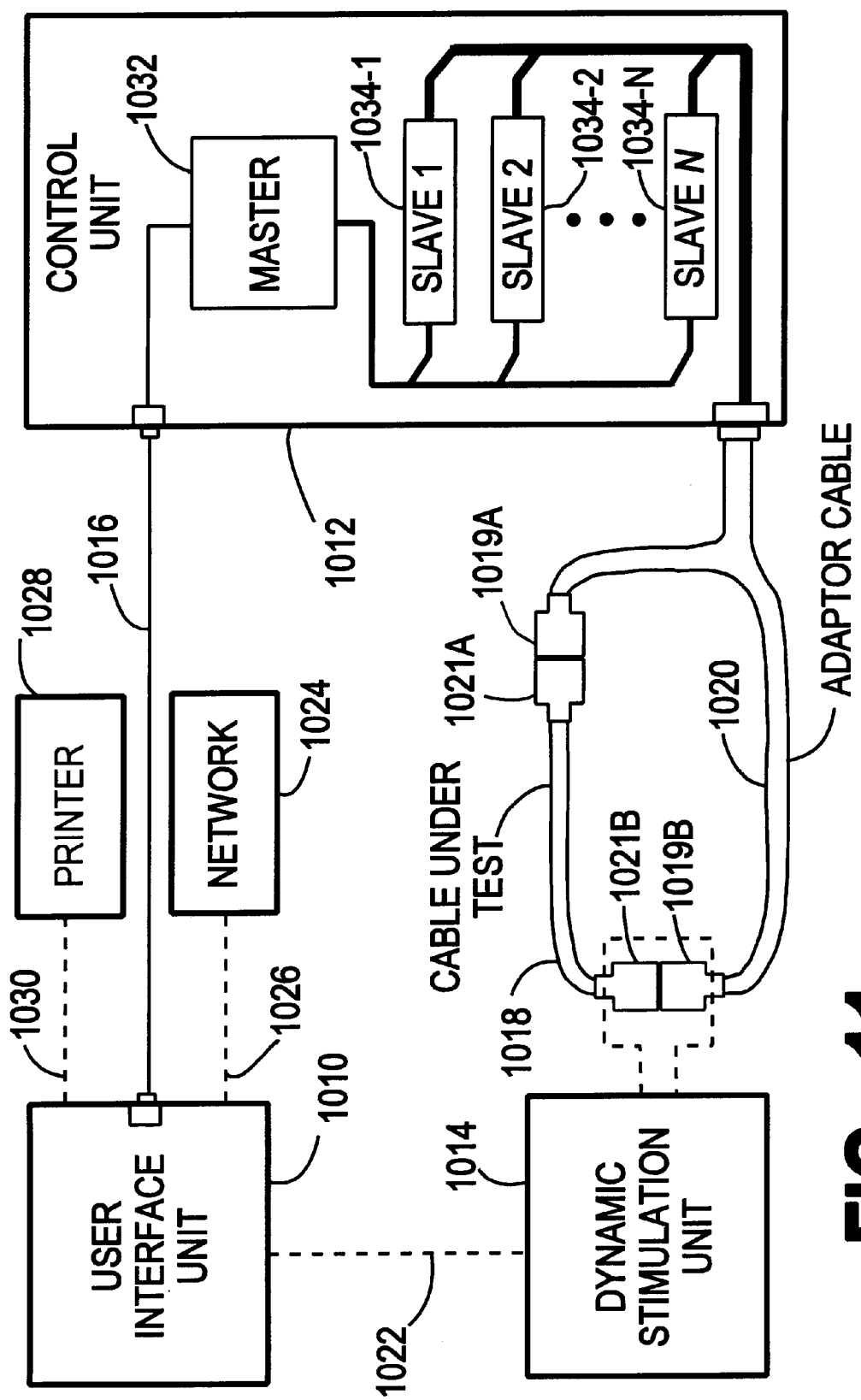
FIG. 11 is a block diagram showing the primary functional units of the distributed processing embodiment of the invention.

As shown generically in FIG. 11, the distributed processing embodiment comprises three main portions: a user interface unit 1010; a multiprocessor-based control unit 1012; and a dynamic stimulation unit 1014. The user interface unit communicates with the control unit via serial (RS-232) cable 1016, and the control unit is connected to the cable under test (CUT) 1018 via adaptor cable 1020, similar to the setup described for the central processing embodiment. Depending on the particular configuration of the system, the user interface unit may also be connected to the dynamic stimulation unit (via cable(s) 1022), a network 1024 (via cable 1026), or a local printer 1028 (via cable 1030).

The distributed processing embodiment may also be characterized as having two primary subsystems: a signal processing subsystem, and a dynamic stimulation subsystem. The signal processing duties are divided up between the user interface unit and the control unit; the dynamic stimulation is handled primarily by the dynamic stimulation unit, possibly with assistance from the user interface unit.

The user interface is responsible for overall control of the signal processing subsystem: presenting information to, and receiving commands from, the user; sending (and receiving) data and control signals to (and from) the control unit; starting and stopping the testing processes; and storing and retrieving cable test files and test results. Preferably, the user interface will comprise either a personal computer (PC), or a personal digital assistant (PDA), running a specialized software program that allows user to control the overall system by using the PC's keyboard or mouse, or the PDA's stylus, to select buttons, icons, or menu choices.

The control unit responds to commands from the user interface unit, and is responsible primarily for the repetitive testing procedures: applying input signals to, and measuring output signals from, the pins of the CUT; comparing the measured signals with the expected results; and recording errors. The control unit contains multiple processors operating in a "master-slave" relationship: a single "master" processor (Master), 1032, communicates with and controls a plurality of "slave" processors (Slaves), 1034-1 through 1034-N. The Master 1032 functions primarily as a communications control unit: receiving all communications from the user interface, interpreting the instruction, and generating and distributing the appropriate commands to the Slave (s).

The Slaves are identical to, and independent from, one another—with each being responsible for only a subset of the total pins of the CUT. During the testing process, each Slave configures its input/output (I/O) pins to be one of four possible states: an output pin "sourcing" high (i.e., pulling the pin high); an output pin "sinking" low (i.e., pulling the pin low); an input pin expecting low; or an input pin expecting high. The pins of each Slave are connected (i.e., mapped) to the various pins of the CUT by the adaptor cable—similar to the architecture described previously for the central processing embodiment.

It should be noted that, in the following discussion, whether a pin is characterized as an "input" or an "output" is determined from the point of view of the processor that "owns" the pin in question, not from the point of view of the CUT or any other component (unless otherwise noted). For example, when a Slave configures an I/O pin as an output pin, the Slave will then "write" a value to that pin, or, in other words, transmit a value out via that pin. If, for example, that output pin is connected to a pin of the CUT, the CUT will receive the signal, and the CUT pin on which the signal is received functions—from the CUT's point of view—as an input pin. Thus, the output pin of the Slave is connected to an input pin of the CUT; while connected, both pins are components of a single electrical node. This is a slightly different nomenclature than was used in the discussion of the central processing embodiment, in which the term "INPUT PIN" was used to indicate the pin of the CUT that was receiving the test signal.

The dynamic stimulation unit 1014 serves essentially the same function as previously described for the central processing embodiment: to generate intermittent faults in the CUT such that the signal processing system is able to capture and record the faults. However, since the distributed processing scheme is generally able to perform the signal processing functions more quickly than the central processing embodiment, a broader range of dynamic stimuli can be used effectively. For example, a shock impulse test—which stimulates a range of frequencies for only a short duration—can be used reliably, as will be discussed.

The discussion of the distributed processing embodiment will generally follow the following outline: first a general overview of the primary hardware components and operational connections therebetween; second, a general overview of the system operation, and functional relationships between the various components; third, a more detailed discussion of the hardware components, including the specific processors, digital logic, and control structures used to implement the system; and finally, a detailed analysis of the functional steps performed by each main component.

In the following discussion, most of the communications and control signals are identified by short, descriptive names, indicated by ALL CAPITALS. Moreover, the individual lines (i.e., conductors) carrying these signals may also be referenced by the name of the signal they are transmitting, in addition to the reference numeral assigned to that particular conductor in the figures. In addition, the logic state (i.e., logic-0 or logic-1) of a signal is determined at the source of the signal; any inversion of the signal thereafter will be indicated by preceding the signal name by the tilde character, "~". For example, if the COMM signal is generated by the Master as logic 0, and is thereafter inverted to logic 1, the inverted signal, or the lines carrying the inverted signal, will be referred to as ~COMM.

Overview of the Components and Connections

Figure 12A:
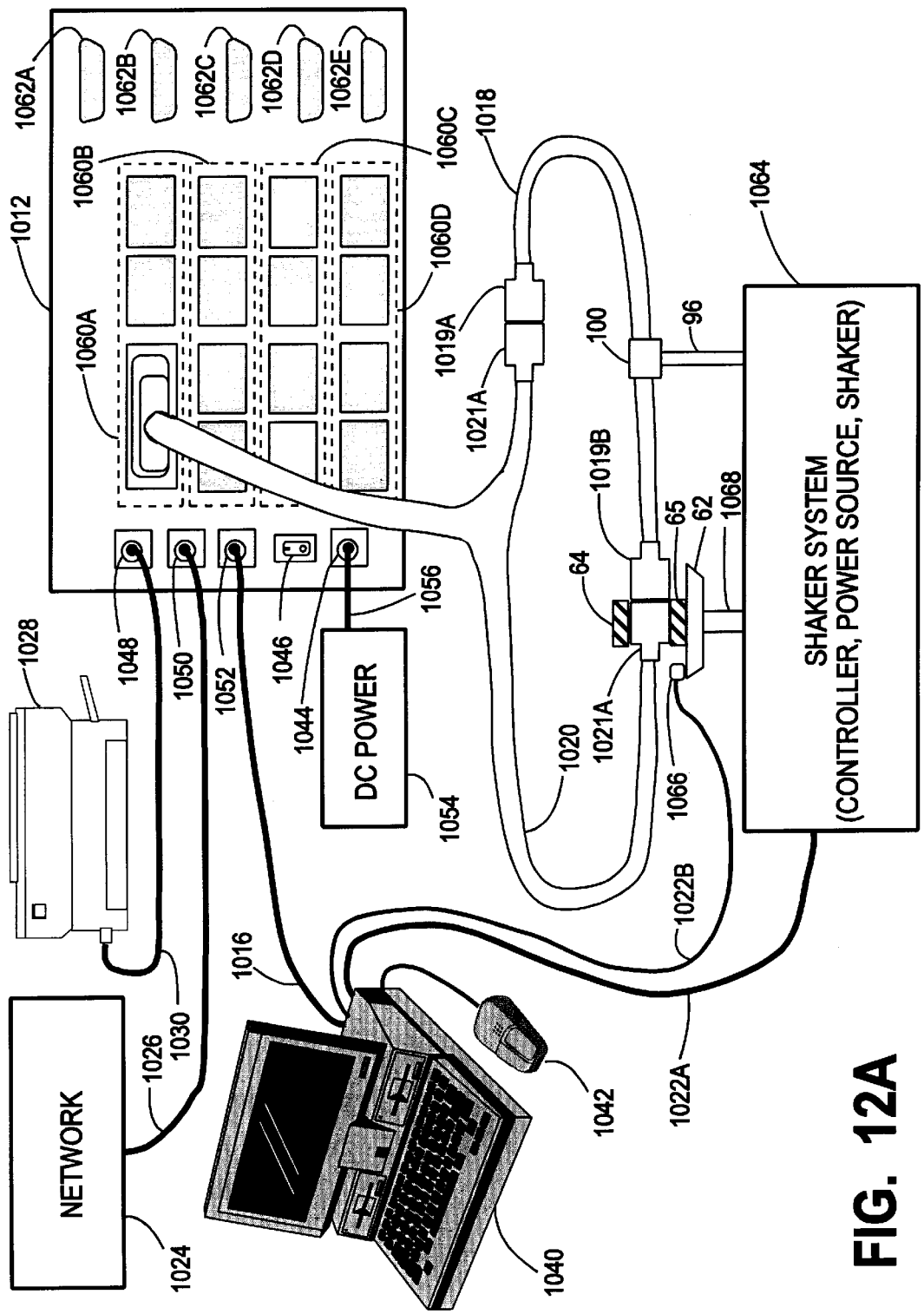
FIGS. 12A and 12B are block diagrams showing two alternative configurations of the distributed processing embodiment depicted in FIG. 11.
Figure 12B:
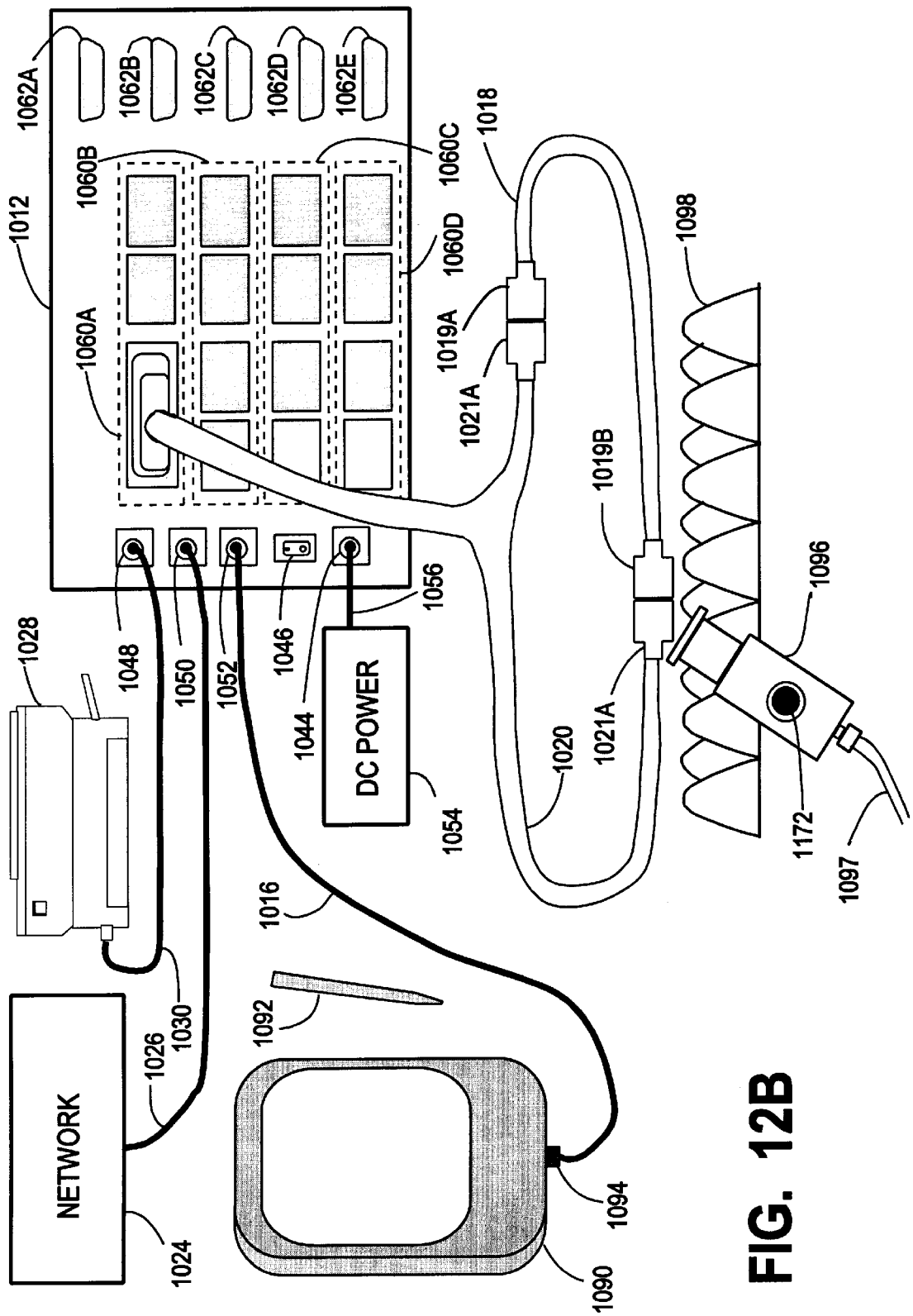

Two representative configurations of the distributed processing embodiment are shown in FIGS. 12A and 12B. Each configuration uses a different component as the user interface unit: a PC 1040, with mouse 1042, is shown in FIG. 12A; while a PDA (such as the Apple MessagePad 120) 1090, with stylus 1092, is shown in FIG. 12B. In either case, the PC or PDA is programmed to communicate with the control unit 1012 via serial cable 1016. Generally speaking, whether the user interface is a PC or a PDA does not alter the operation of the system, e.g., a click of the PC's mouse is equivalent to a tap of the PDA's stylus. Accordingly, the term PC/PDA will be used in the following discussion as a generic reference to a suitable user interface device.

Typically, the PC/PDA communicates directly with the processors in the control unit. However, depending on the needs of the user, the PC/PDA may be connected to a network 1024, a local printer 1028, or both. For example, when connected to a network, the PC/PDA can download a selected cable test file from a central computer also attached to the network, thus enabling the user to have access to hundreds or thousands of cable test files without having to use valuable memory to store the entire collection of files. Additionally, the user may desire to print the test results, which can be sent to a printer connected to the network, or to the attached printer 1028.

The control unit 1012 is identical in both FIGS. 12A and 12B. Along the left edge of the front face of the control unit housing is the Power In port 1044, as well as three 10 ports designated Printer 1048, Network 1050, and Serial I/O 1052. The Power In port is connected to a DC Power source 1054, which may comprise a battery pack, an AC-DC transformer connected to an AC power source, or any suitable means for providing DC power. The I/O ports 1048, 1050, and 1052, are connected to the local printer 1028, the network 1024, and the user interface unit (PC 1040 in FIG. 12A, or PDA 1090 in FIG. 12B), respectively.

The connections within the control unit 1012 are shown in greater detail in FIG. 13. Each of the I/O ports is connected to bank of switching relays 1100, which is further connected—via line 1102, serial I/O interface 1104, and line 1106—to the Master processor 1032 mounted on master board 1108. The switching relays—controlled by the Master via control line 1110—are configured for selective connection of the PC/PDA (port 1052) with either the network (port 1050), the printer (port 1048) or the Master processor. However, at all times the Master maintains a connection (see FIG. 15) to the serial I/O port 1052, to receive the switching commands from the PC/PDA. During most system operations, the PC/PDA is connected to the Master.

The PC/PDA communicates with the Master thru the Master's built-in Universal Synchronous Asynchronous Receiver Transmitter (USART). In the preferred embodiment, the Master's USART is configured as an RS-232 port operating at 19.2K baud, and using an 8 bit, no parity, 1 stop-bit protocol. Although any suitable communications protocol could be used, the RS-232 configuration was chosen because it is nearly universally available on multiple platforms (e.g., DOS, Macintosh, UNIX, etc.).

The control and communications signals generated by the Master are routed to the Slaves by a plurality of multiconductor busses, 1114A through 1114X, each of which contains a plurality of shared or distributed lines (e.g., DC POWER, COMM, COMMDIR, CLOCK, SYNCH) as well as at least one distinct line (e.g., IDENT1 through IDENT24) which is used for identification purposes. Any communications from the Slave(s) are carried back through one of the bus lines, 1114A through 1114X, to the Master, which processes the information and sends the appropriate response back to the user interface.

The majority of the communications between the Master and Slaves are carried by a single wire—the COMM line—which is shared by all of the processors, and is "bidirectional" in that it carries signals in both directions between the Master and Slaves. The bidirectionality is accomplished by using digital logic devices having open collector output pins and pull up resistors, and will be discussed in greater detail later. The system as shown is capable of controlling a total of 24 slave boards: four boards, 1120A through 1120D, are housed within the control unit, with connections for 20 additional slave boards provided via expansion ports 1062A through 1062E, which may be any suitable connector, e.g., DB50 connectors.

Each slave board carries eight Slaves, with each Slave having 32 I/O pins, yielding a total of 256 pins controlled by each slave board. Each of these pins is connected, by bus lines 1124A through 1124D, into a contact in external cable connectors 1160A through 1160D, respectively.

As will become more clear in the discussion to follow, each Slave processor, and slave board, is interchangeable with every other Slave processor, or slave board, respectively. Any Slave processor could be removed from its position on one slave board and moved to a different location on that same board or to any location on any of the other slave boards. Similarly, an entire slave boards can be moved or switched with one another. This feature is due to the fact that each Slave processor is identical to every other Slave processor in the system; the Slaves determine their position in "address space" (i.e., the CUT's pins for which it is responsible) in a dynamic process occurring during program initialization, as will be discussed later.

Turning now to the dynamic stimulation unit, FIGS. 12A and 12B depict two preferred configurations for inducing the intermittent faults. In FIG. 12A, the dynamic stimulus is provided by a shaker system operating in a closed-loop control scheme, similar to that described for the central processing embodiment (see FIGS. 1 and 2): a vibration control program running on the PC sends control signals via line 1022A to the shaker system 1064B, which generates vibration in the actuator shaft 1068, upon which is mounted the cable test fixture for securing the CUT; an accelerometer 1066 senses the relative motion of the test fixture and sends feedback to the vibration control program via line 1022B. Recall that this configuration requires that the PC be equipped with an operating system capable of operating two processes simultaneously; one to control the signal processing functions, and one to control the dynamic stimulation (i.e., the vibration control program).

The test fixture, as described previously, comprises a base portion 62, and clamp portions 64 and 65. The clamps are shaped to fit any or all of the connector(s) 1021A and 1021B of the adaptor cable 1020, or the connectors 1019A and 1019B of the CUT 1018. When clamped in the test fixture, as shown in FIG. 12A, vibration energy from the actuator shaft 1068 is transmitted to the CUT, which induces intermittent faults. Also as described previously, the optional flex arm 96 may be attached 100 to the CUT to provide additional dynamic stimulation that may assist in inducing certain types of intermittent faults.

The shaker system 1064 may comprise a variety of components, depending on the needs or preferences of the user. In general, shaker systems include an amplifier/controller and a power source, both of which are connected to a shaker unit, which generates the vibration in an actuator element. For example, if the hydraulic shaker depicted in FIG. 2 were used, the shaker system 1064 would comprise the shaker driver 40A, the hydraulic source 40B, the shaker 42, and the base 99.

Turning to the configuration of FIG. 12B, the dynamic stimulation is provided by a pneumatic impulse tool 1096 designed for the system. The impulse tool uses compressed air—delivered by hose 1097—as a power source to deliver a controlled shock impulse to the CUT. Preferably, the compressed air source is equipped with a pressure regulator, providing an additional control over the amount of force delivered to the CUT.

Figure 14:
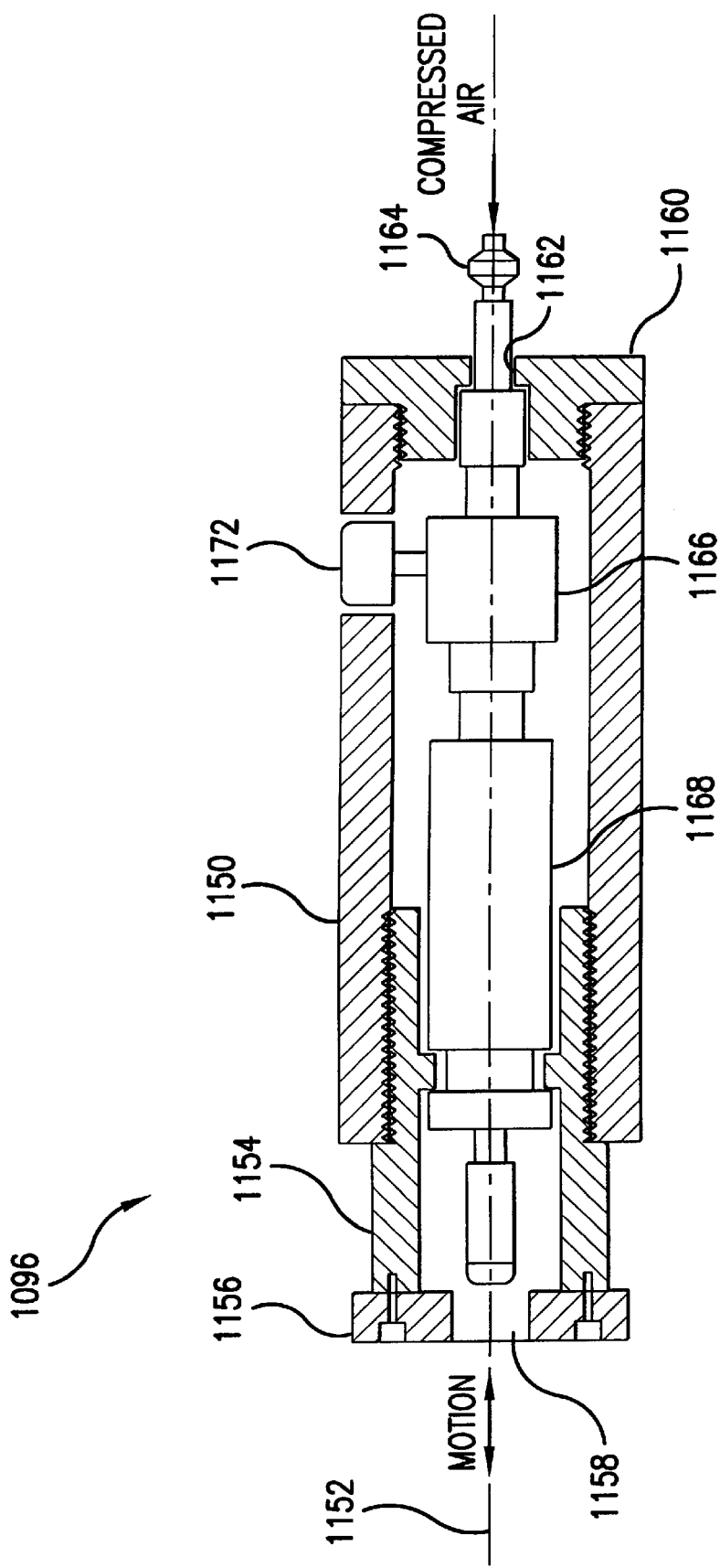
FIG. 14 is a longitudinal cross-sectional view of an impulse tool for dynamically stimulating the cable under test.

As shown is greater detail in FIG. 14, the impulse tool comprises a main body 1150 having a fore-and-aft axis 1152. A standoff 1154 is threaded into the forward end of the body and covered by a foot 1156 having a central orifice 1158. The aft end of the body is covered by cap 1160 having a central orifice 1162 through which a quick-release nozzle 1164 protrudes for receiving compressed air from a compressed air source (not shown). The operating mechanism of the device comprises the serial connection of nozzle 1164, push-button controlled valve 1166, pneumatic cylinder 1168, and tip 1170.

When push-button 1172 is depressed, the compressed air flows from the nozzle 1164, through valve 1166, and into pneumatic cylinder 1168, which drives tip 1170 forward through the central orifice 1158 where it strikes the test item. When the spring-loaded push-button 1172 is released, the air flow is interrupted and the spring-return of the cylinder 1168 pulls the tip back to its original position.

The foot 1156 should be placed firmly against the test item (e.g., the conductors or connectors of the CUT) before the push-button is pressed. In doing so, the standoff 1154 guarantees that the tip will always be a given distance from the test unit when the device is actuated. This feature serves to provide a consistent impulse force and leads to consistent repeatable shock impulse tests.

As an alternative to using a pneumatic tool, an impulse tool can be operated by any suitable power source. For example, the tool shown in FIG. 12A might be modified by replacing the pneumatic cylinder with an adjustable spring mechanism, or by fitting a commercially available spring-operated punch with a rubber tip (to avoid damaging the CUT). Similarly, an industrial or lab quality shock system could be used, which delivers a greater degree of control over the impulse parameters, but is larger and more expensive.

In addition, the CUT may be placed on a resilient surface, such as foam pad 1198 (FIG. 12A), which serves to modify the characteristics of the stimulation. In general, the impulse tool imparts to the CUT connector a given amount of energy, which induces vibration in the CUT that may be characterized as a shock pulse having certain amplitudes (g-forces) at different vibration frequencies simultaneously, and which lasts for a finite duration. Since the distributed processing embodiment operates quickly enough to capture intermittent faults for even very brief pulses, the primary characteristics of interest are amplitude and frequency content.

In general, as the surface on which the CUT is resting is made less rigid, the shock pulse is characterized by lower amplitudes (g-force) and lower frequency content (for a longer duration). Thus, placing the CUT on a foam pad modifies the shock pulse to include more low frequency stimulation, but also at lower amplitudes—which can be counteracted by impacting the CUT with greater force. This is not to say that lower frequency content in the shock pulse is necessarily preferable; as discussed previously, intermittent faults may be due to a variety of different cable defects, each having a different resonant frequency. For some types of connectors (e.g., those with rubber-like potting) a more rigid surface—leading to a shorter duration shock pulse with higher amplitudes and higher frequency content—may induce intermittents more effectively and reliably.

In practice, a user may prefer either one of the configurations shown in FIGS. 12A or 12B. For example, the FIG. 12A system is capable of performing a wide range of dynamic stimulation—depending on the vibration profile being run on the vibration control software—in a more controlled, predictable fashion. Accordingly, the PC/shaker setup may be preferred for applications in which a highly detailed fault analysis is required, or in which a wide variety of environmental stimuli must be simulated, e.g., for acceptance testing.

However, the FIG. 12B system uses smaller (and less expensive) components, and is also capable of inducing and capturing a wide range of intermittent faults. The impulse tool described is capable of generating relatively consistent shock impulses, which provide energy at a wide range of frequencies simultaneously. Accordingly, this PDA/impulse tool system may be more suitable for applications in which the system must be easily portable, yet provides a high probability of identifying an intermittent fault event, e.g., in field testing.

Overview of Operation and Functional Relationships

For any given CUT, the specific testing processes and sequences will be determined by a cable test file (CTF) created by the user and including any of a set of defined commands to which the system will respond. The CTF is an ASCII text file that the user creates using any text editor, and contains two portions: (1) a required program portion, which contains the test file commands using predetermined syntax and parameters (to be discussed later); and (2) an optional net list portion, which contains information representing the continuity paths within a particular CUT.

This continuity path information can be recorded in any format that is convenient (e.g., a continuity matrix, or a table of connected pins) as long as it is separated from the test file commands using some predetermined syntax or protocol. In the distributed processing embodiment, the preferred format for the continuity information is a net list: a list of paired pin numbers, such that a continuity path exists between the two pins identified in each pair. For example, the line "12:67" indicates that a continuity path exists between pin 12 and pin 67. These pin numbers are keyed to the cable testing system pins, rather than the CUT's pins. The net list is initiated in the cable test file by the phrase "Begin Netlist" and is terminated by the phrase "End Netlist".

Since the user creates the test file based on the type of cable being tested, the purpose of the testing, and a variety of factors, the operation of the system is best understood by discussing the range of valid commands used the CTF and how the system is programmed to respond to those various commands. The functional control of the system is accomplished by three specialized software programs: (1) a user interface program running on the PC/PDA; (2) a control and communications program running on the Master processor; and (3) a testing program running on each Slave processor.

The three specialized programs operate independently of one another, with each program continually cycling through its respective main "wait" loop until an event occurs to trigger the program into action. In the case of the PC/PDA, the trigger will be one of three events: a user input (e.g., using the PDA's stylus, or the PC's mouse/keyboard); a command from a cable test file (each instruction in the file may be considered a separate event); or a communication from the Master. For the Master, the triggering event is the receipt of either a command from the PC/PDA, or a response from the Slave(s). The Slaves' only triggering event is the receipt of a command from the Master.

Figure 18:
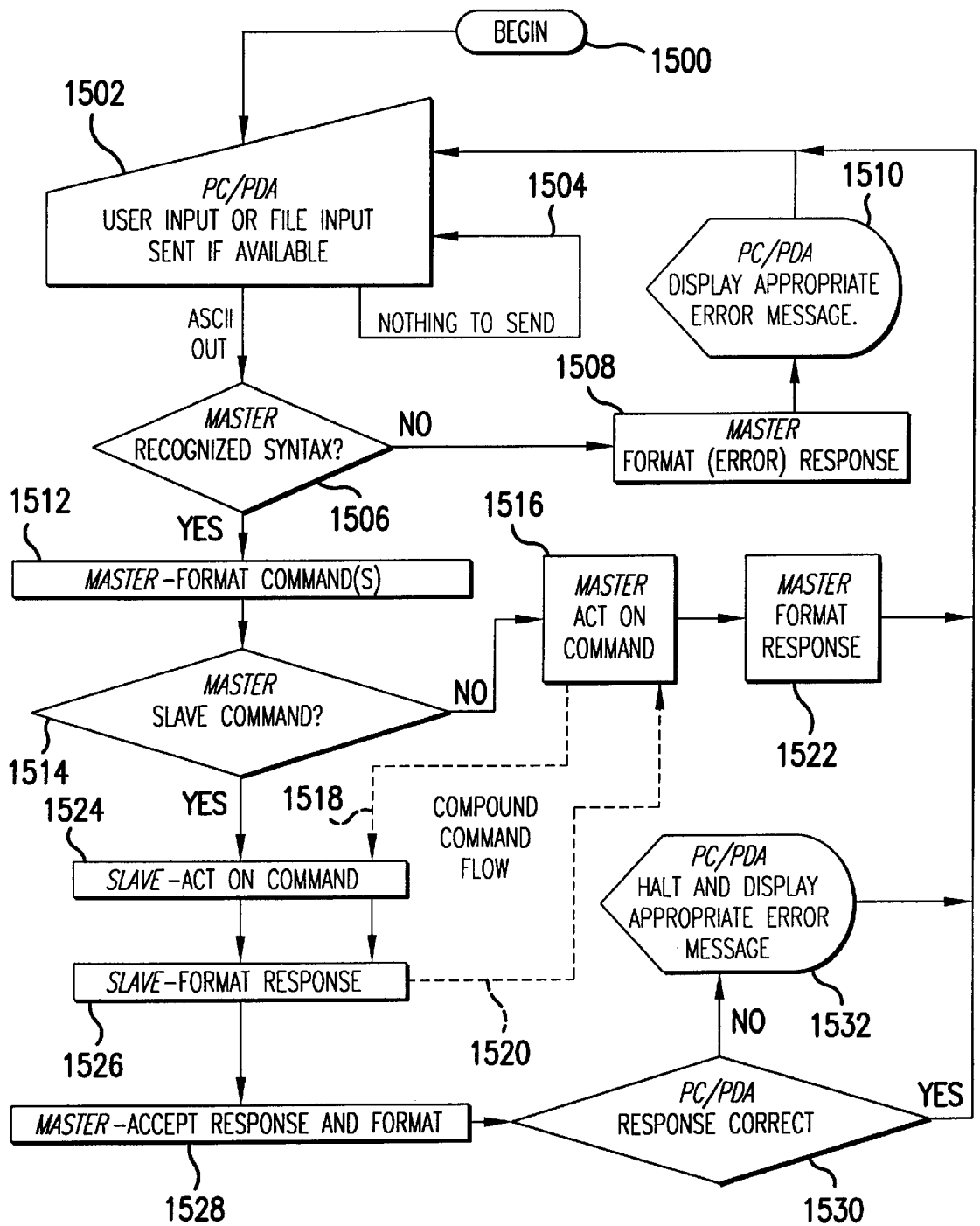
FIG. 18 is a flow chart showing the functional relationships and operation of the main components in the multiprocessor-controlled embodiment of the invention.

The functional interaction of the overall system is summarized in FIG. 18. At the top of each functional step appears one of three bold and italicized legends—PC/PDA, Master, or Slave—to indicate which of the three components is performing the operation or function. Beginning at step 1500, the PC/PDA continuously cycles through loop 1504, until one of its three triggering events occurs. Presuming that the triggering event is not a function that is executed solely within the PC/PDA, the program sends out 1502 a string of ASCII characters as a command to the Master. The Master decodes the command 1506; if the Master does not recognize the string of characters as a valid command, it sends an error message 1508 back to the PC/PDA, which displays 1510 an appropriate error message to the user.

However, if the Master recognized the ASCII command at step 1506, it reformats 1512 the ASCII command into an appropriate four-byte binary instruction. Next, the Master determines 1514 who, as between itself and the Slaves, is responsible for executing the binary command. In the rare case, it is the Master who takes primary action on the command, which may also involve the Slaves, as shown in the compound command flow 1518 and 1520.

However, in most cases the binary command will be sent directly to the Slaves, who act 1524 on the instruction, and format and send 1526 a response (e.g., confirming the action it has performed), back to the Master. At step 1528, the Master takes the Slaves' binary response, reformats it into the corresponding ASCII string, and sends that string back to the PC/PDA. The PDA then checks 1530 to see if the action performed—at steps 1516 or 1524—conforms to the action requested at step 1502. If so, program control returns to the main wait loop at 1502 and 1504; if not, the PC/PDA issues 1532 an error message to the user before returning to the main wait loop.

Figure 22:
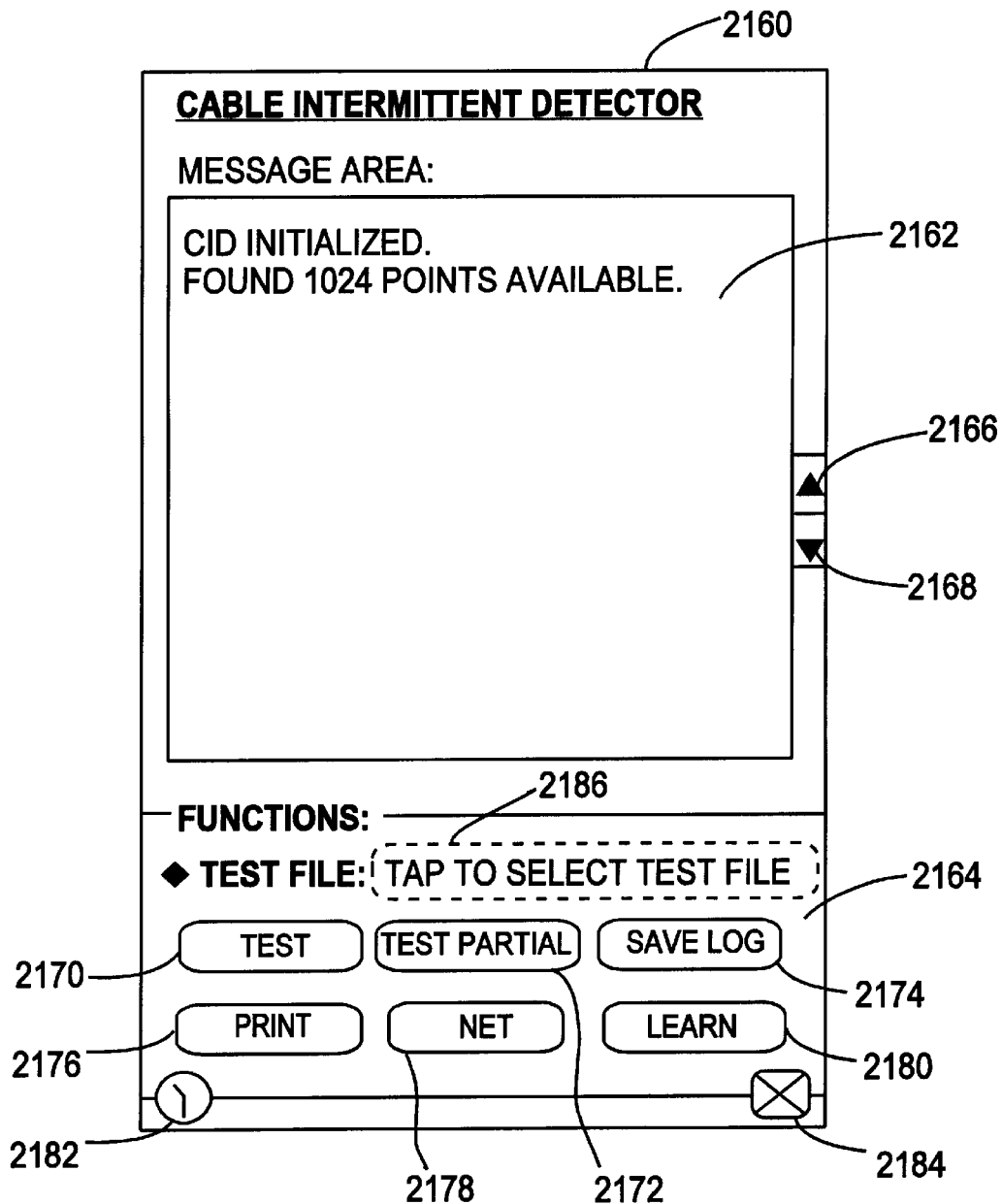
FIG. 22 depicts the display of the user interface unit of the distributed processing embodiment.

The user interacts with the system primarily through the PC/PDA's display, as shown in FIG. 22. After starting up the PC/PDA program, the application window 2060 is divided into two main areas: a message area 2062, and a functions area 2064. The message area displays messages from the PC/PDA about the status of the system and the results of the cable test (the latter being referred to as the "error log" which can be saved separately as a text file). The arrows 2066 and 2068 are used to scroll through the message area.

The functions area 2064 includes a text line "Test File" that lists 2086 the currently selected cable test file, as well as a several graphical buttons: TEST 2070, TEST PARTIAL 2072, SAVE LOG 2074, PRINT 2076, NET 2078, AND LEARN 2080. In addition, there are two icons, 2082 and 2084, that are standard to the PDA (Apple MessagePad 120) display: tapping the clock icon 2082 displays the date, time, and battery status; tapping the X-box icon 2084 closes the application.

Figure 19A:
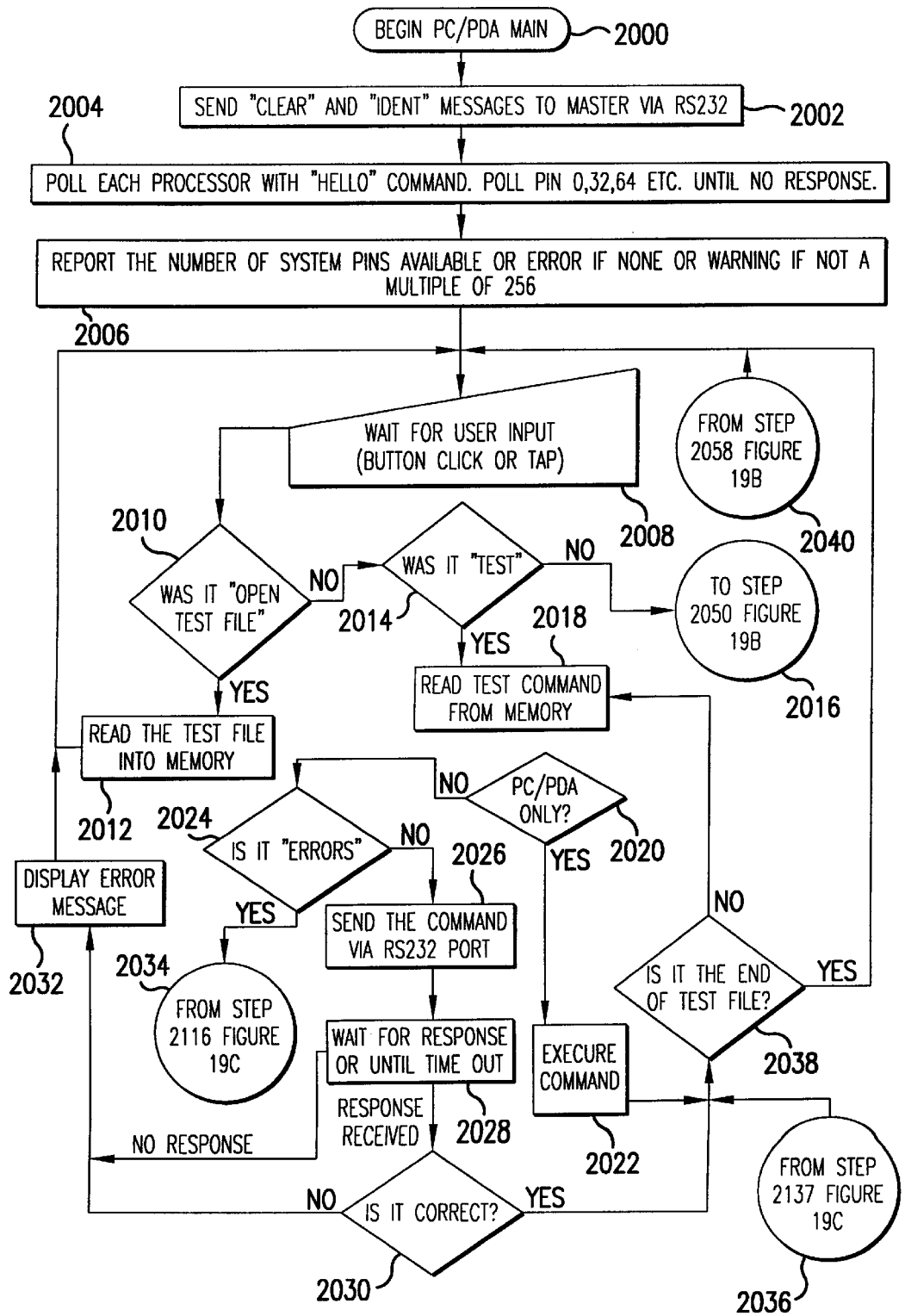
FIGS. 19A through 19C form a flow chart showing the functional steps performed by the user interface unit in the distributed processing embodiment of the invention.
Figure 19B:
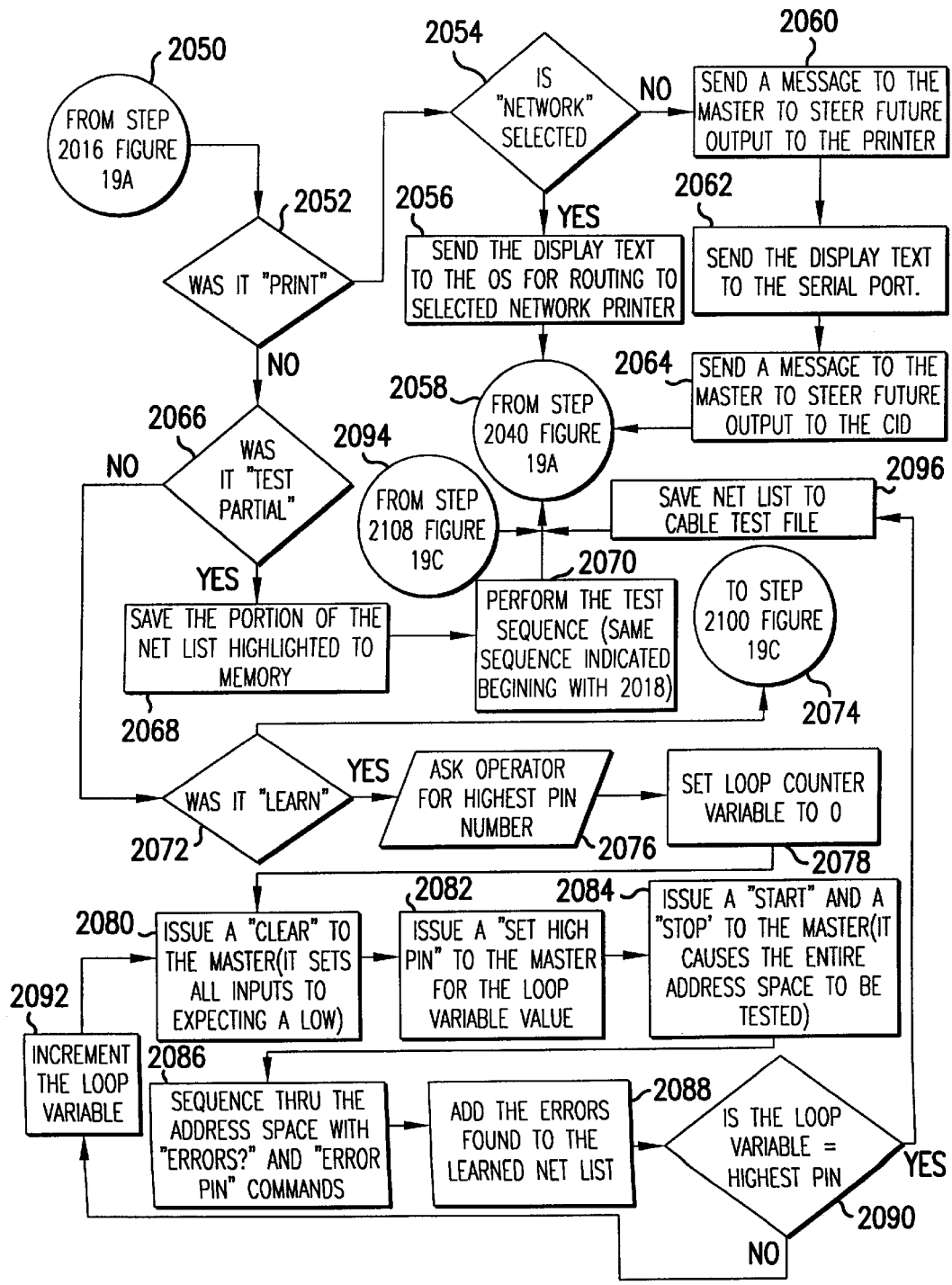

The functional steps taken by the PC/PDA are shown in greater detail in FIGS. 19A and 19B. Referring first to FIG. 19A, immediately after the program is started 2000, the system is initialized 2002 by sending 'CLEAR' and 'IDENT' commands to the Master via the PC/PDA's RS232 serial communications port. Although these commands will be discussed in greater detail later, one of the important aspects of step 2002 is that each of the Slave processors is allowed to "find itself in address space", or, in other words, to determine the particular group of 32 pins for which it is responsible.

Next, the PC/PDA checks 2004 to see how many Slave processors are initialized and operating. The system accomplishes this by a series of 'HELLO' commands, as will be discussed in more detail later. When finished, the PC/PDA displays 2006 the number of system pins available (see, e.g., display area 2062, FIG. 22), or reports an error if the number of available pins is zero, or a warning if not a multiple of 256 (which indicates at least one slave board has at least one malfunctioning or missing Slave).

Next, the program enters its main wait loop at step 2008. From the main wait loop 2008, the only event to trigger action is a tap or click on one of the buttons or icons presented in the functions area (2064, FIG. 22) on the PC/PDA screen.

When the user taps or clicks on the text 2086 adjacent to the "Test File", the "Open Test File" function is selected 2010, and the program displays for the user a listing of the cable test files that are currently stored in the PC/PDA's memory (RAM in the case of the PDA; hard disk or diskette in the case of the PC). The user selects a file by tapping or clicking on the file name, and the program loads 2012 that file into its RAM.

Once a test file is loaded, control returns to the main wait loop 2008, and the user can select 2014 the TEST button, which causes the program to step through the ASCII commands listed in the selected cable test file. The command in the file is read 2018 from RAM and the program classifies the command as one of three types: (1) PC/PDA only, which are executed exclusively within the PC/PDA; (2) pass-through, which are sent to the Master essentially unchanged from their ASCII format in the test file; or (3) a hybrid of the two, in which the PC/PDA issues certain combinations of pass-through commands based on responses received from the Master (e.g., the 'ERRORS?' command).

If the command is PC/PDA only, the program executes 2022 the command, and then, assuming it is not the end of the test file 2038, reads 2018 the next command from memory. Generally, the PC/PDA only commands are used to present information to, and retrieve information from, the user via the message area (2062, FIG. 22).

If, at step 2020, the command is not PC/PDA only, the program then checks 2024 if it is the "hybrid" type command 'ERRORS?'. If so, program control jumps 2034 to step 2116 of FIG. 19C, which will be discussed shortly. However, the majority of test file commands are pass-through, which means that the ASCII command text is sent 2026 directly to the Master via the PC/PDA's RS232 serial port. The program then enters its second wait loop 2028 until a response is received from the Master, or a maximum amount of time has passed with no response (indicating an error). The response from the Master will be a coded ASCII message representing the command that was actually executed by the Master/Slave(s). If it does not match 2030 the command sent out 2026, then the program displays 2032 an error message and program control returns to the main wait loop 2008; if it does match, the program continues at step 2038.

Figure 19C:
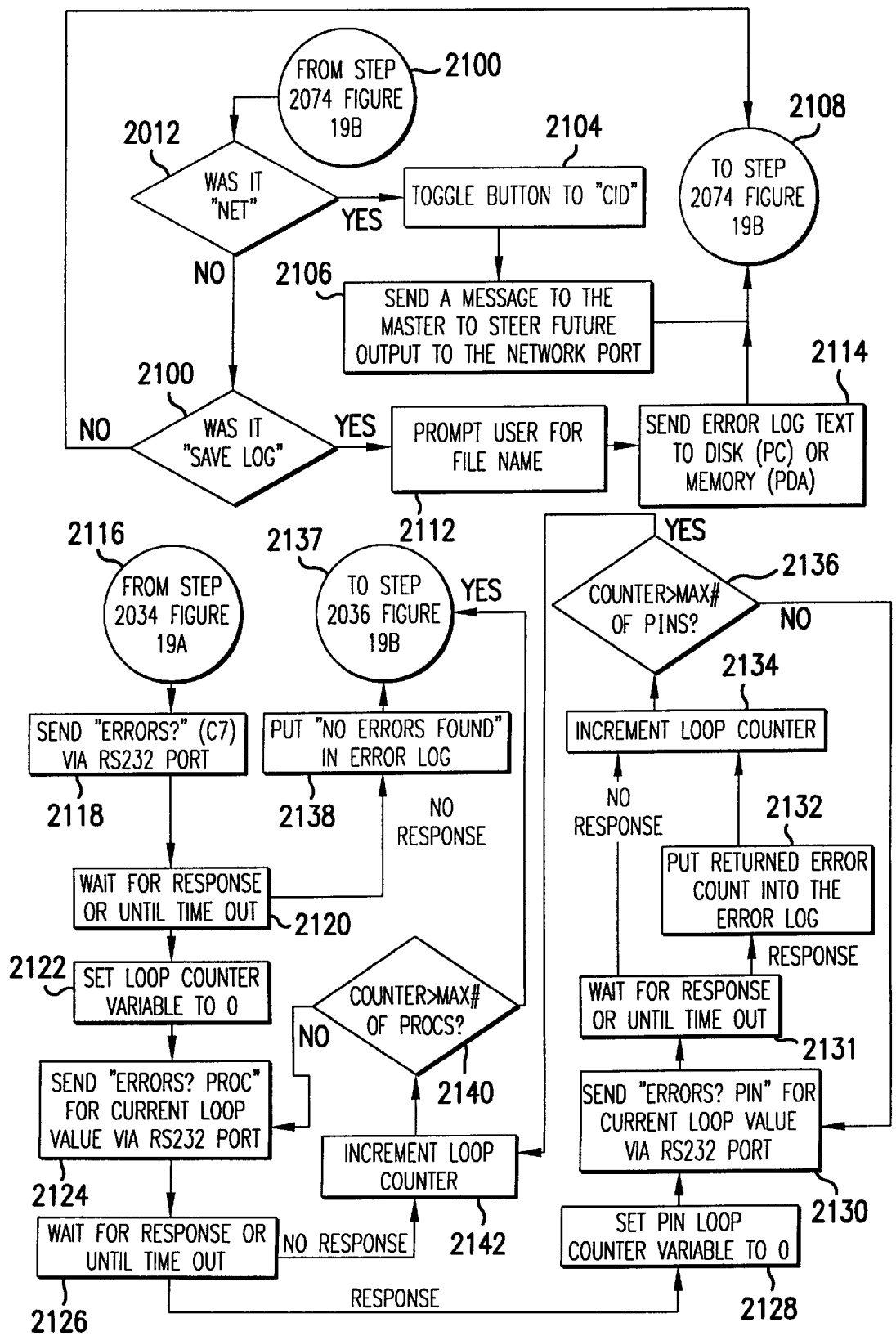

If, at step 2024, the command is the hybrid type 'ERRORS?' command, and program control jumps 2034 to step 2116 in FIG. 19C. The 'ERRORS?' command is the only test file command in which the PC/PDA both passes ASCII commands to the Master, and makes decisions or executes portions of the command itself First, the PC/PDA sends 2118 an 'ERRORS?' command to the Master, which polls all of the Slaves simultaneously to determine whether any Slave recorded an error during the testing process. If no response is received, then no errors were recorded, and the PC/PDA issues 2138 the appropriate message to the message area (i.e., it is recorded in the error log).

However, if the PC/PDA receives a (non-zero) response at step 2120, then at least one of the Slaves has recorded a fault on at least one of its pins, and the program enters a nested loop structure to locate the faults. In the outer loop (steps 2122, 2124, 2126, 2140, and 2142) the program sends 2124 the 'ERROR? PROC' command to each Slave to determine whether that particular Slave recorded any errors; if the processor responds affirmatively, the program enters the inner loop (steps 2128, 2130, 2131, 2132, 2134, and 2136) to poll each pin on that Slave for errors. Once all the pins have been checked 2136, program control moves to step 2142 of the outer loop to continue polling the next processor for errors. Once all of the processors have been checked 2140 for errors, program control returns 2137 to step 2036 of FIG. 19A.

In addition to running a complete test file, the user has the option of performing a limited predetermined test on CUT based on the CUT's net list contained in the cable test file. If the user selects the TEST PARTIAL button (2072 in FIG. 22) at step 2066, the program locates the net list information in the currently selected cable test file and displays that text in a separate window. The user then selects or highlights the desired portion of the net list that is to be tested and hits the TEST PARTIAL button again. The program saves the selected net list to memory and conducts a test sequence.

The program first issues a 'CLEAR' command to configure all of the pins as inputs expecting low, and then configures one pin at a time—the pin in the left-hand position of one of the selected pin pairs—as a high output, and configures the pin(s) that have continuity paths with that pin (e.g., the pin(s) designated in the right-hand position(s) of the pin pair) as inputs expecting high. Finally, the program begins the test (by issuing a 'START' command) and displays a message box to the user to initiate the dynamic stimulus, and to tap or click on the "Stop" button (provided in the message box) to end the test. When the test is complete, the program polls the system for errors (see earlier discussion of the 'ERRORS?' command, starting with step 2024).

The user selects the LEARN button (2072 in FIG. 22) at step 2066 (FIG. 19B) to determine the net list, i.e., the pin to pin continuity paths, for the CUT. To do so, the program assumes that the CUT is a known good cable (i.e., no faults), and injects a test signal into one pin at a time, with the rest of the CUT pins set to expect low. Thus, any pin recording an error must have received high (i.e., the test signal), which indicates a continuity path between those two pins. Thus any so-called errors are entered into the net list as a continuity path. Once the entire net list has been determined, the net list information is displayed in the message area (i.e., recorded in the error log), and, optionally, the user may be allowed to save the net list information directly to the currently selected cable test file.

The user selects the SAVE LOG button 2174 (FIG. 22) at step 2110 (FIG. 19C), to save the error log for the CUT that has been tested. The user is prompted 2112 for a file name and the error log (everything displayed in the message area since the last time any one of the TEST, TEST PARTIAL, or LEARN buttons was chosen).

The text of button 2178 (FIG. 22) toggles between "NET" and "CID" each time the button is selected. For discussion purposes, it is presumed that the button is initially labeled NET. The button functions to establish a communications link between the PC/PDA and either a network 1024 (FIGS. 11, 12A, and 12B), and the Master processor 1032 (e.g., FIGS. 11 through 13). More specifically, the routine establishes two-way communications with either the network port 1050 or the Master (via serial interface 1104); however, even when the network communications have been selected, the Master always maintains a connection to the output from the PC/PDA (see 1210 at FIG. 15), so that the Master can reestablish two-way communications with the PC/PDA when the CID button is selected. Once a network connection is established, the user can perform actions such as downloading an additional cable test file to the PC/PDA's memory, and then reestablish communications with the control unit by clicking the CID button.

The user selects the PRINT button (FIG. 19B, step 1471), to print the current error log displayed in the message area 2162 (FIG. 22). Referring to FIG. 19B, the program first checks 2054 to see whether the PC/PDA communications are being routed to the network 1024 (FIG. 11) or the Master 1032. If network communications have been established, the program assumes the user wants the error log printed to a networked printer, and sends the error log text to the PC/PDA's operating system (OS), which then forwards the text to the most recently selected network printer. If the network connection is not established, the program sends the error log to the local printer local printer port 1048 (FIGS. 12A, 12B, 13, and 15

Note that the NET and PRINT functions can be handled slightly differently if a PC/PDA being used as the user interface unit is equipped with a plurality of serial ports, rather than just one. The user interface program can be configured to route PC/PDA communications to a network or local printer connected to one of these other serial ports (i.e., other than the one communicating with the control unit), rather than routing all communications to the network or printer ports of the control unit 1012.

As indicated in the previous discussion, any commands generated by the PC/PDA that affect the cable testing operations (i.e., the pass-through commands, or 'ERRORS?' command) are transmitted via the RS232 serial port to the Master. The functional steps taken by the Master are shown in greater detail in FIGS. 20A through 20J. The Master functions primarily as a message traffic coordinator: it formats and routes the PC/PDA commands to the Slaves and the Slaves' responses to the PC/PDA.

Figure 20A:
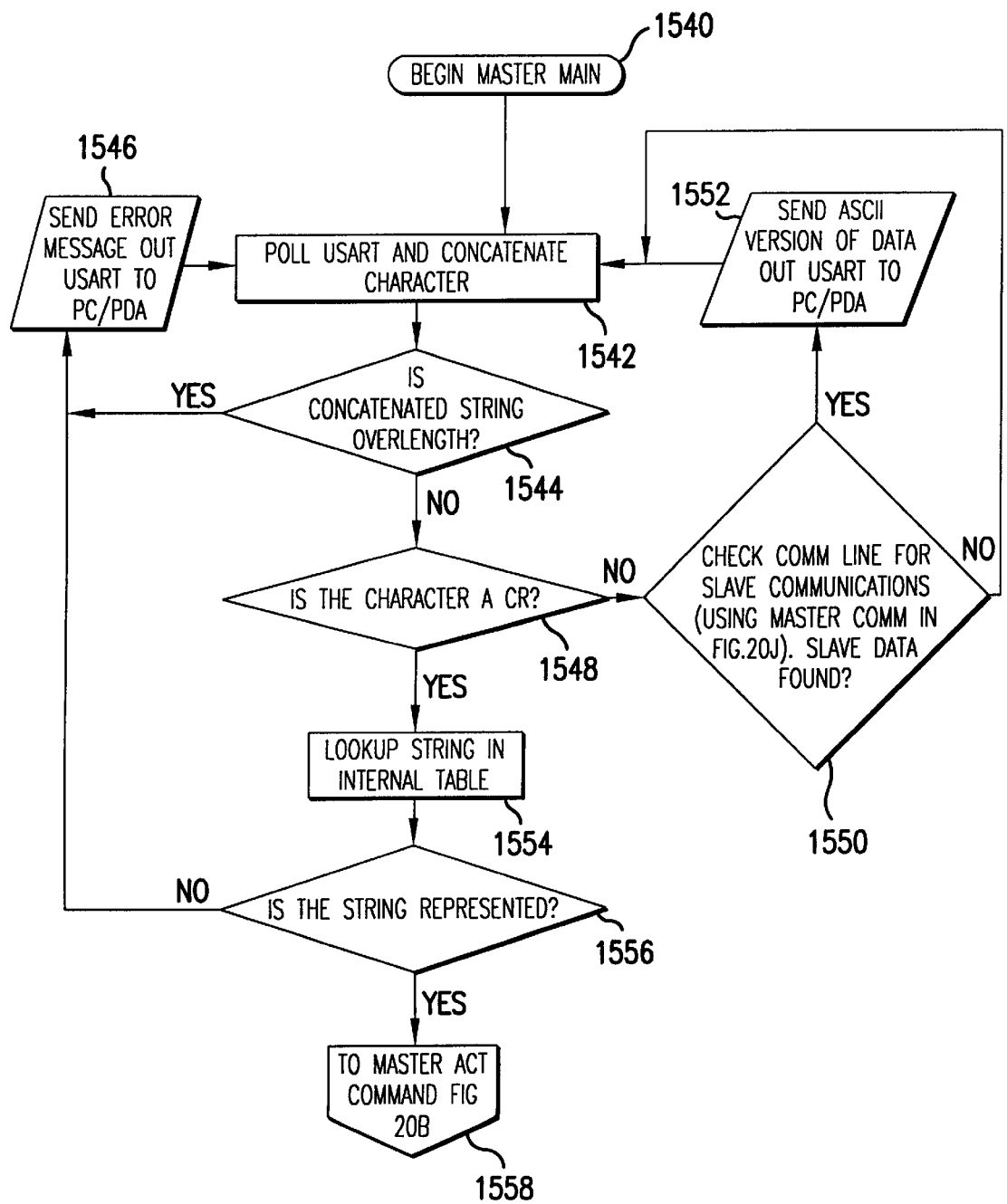
FIGS. 20A through 20J form a flow chart showing the functional steps performed by the master processor in the distributed processing embodiment of the invention.

As shown in FIG. 20A, the Master's main wait loop is continually checking for incoming messages: either an RS-232 communication from the PC/PDA via the Master's built-in (i.e., hardware) USART (step 1542), or a communication from the Slave using a custom serial communications protocol (step 1550), which is similar to RS-232.

At 1542, the Master first polls its hardware USART to see if the PC/PDA has sent a character, and if so, concatenates the character onto the command string it is storing in its registers (ASCII1 through ASCII32). If the string is too long (e.g., more than 32 characters), the Master sends 1546 an error message to the PC/PDA via the USART.

If the character is not a carriage return (CR)—a CR indicating the end of a single command string—the Master calls 1550 another routine (Master Comm In at FIG. 20J) to check for any communications from the Slave processors. If a Slave communication is found, the message is converted 1552 from the four-byte binary format to the corresponding ASCII string and relayed up to the PC/PDA via the USART. If no Slave communications are found at 1550, the program begins the process again at 1542.

If, at step 1548, the character is a CR 1548, which indicates the end of a single command string, the Master compares 1554 the received string to a stored table of valid commands. If the string is valid 1556, the program continues 1558 to the routine Master Act Command (FIG. 20B); otherwise, an error message is sent 1546 to the PC/PDA.

Figure 20B:
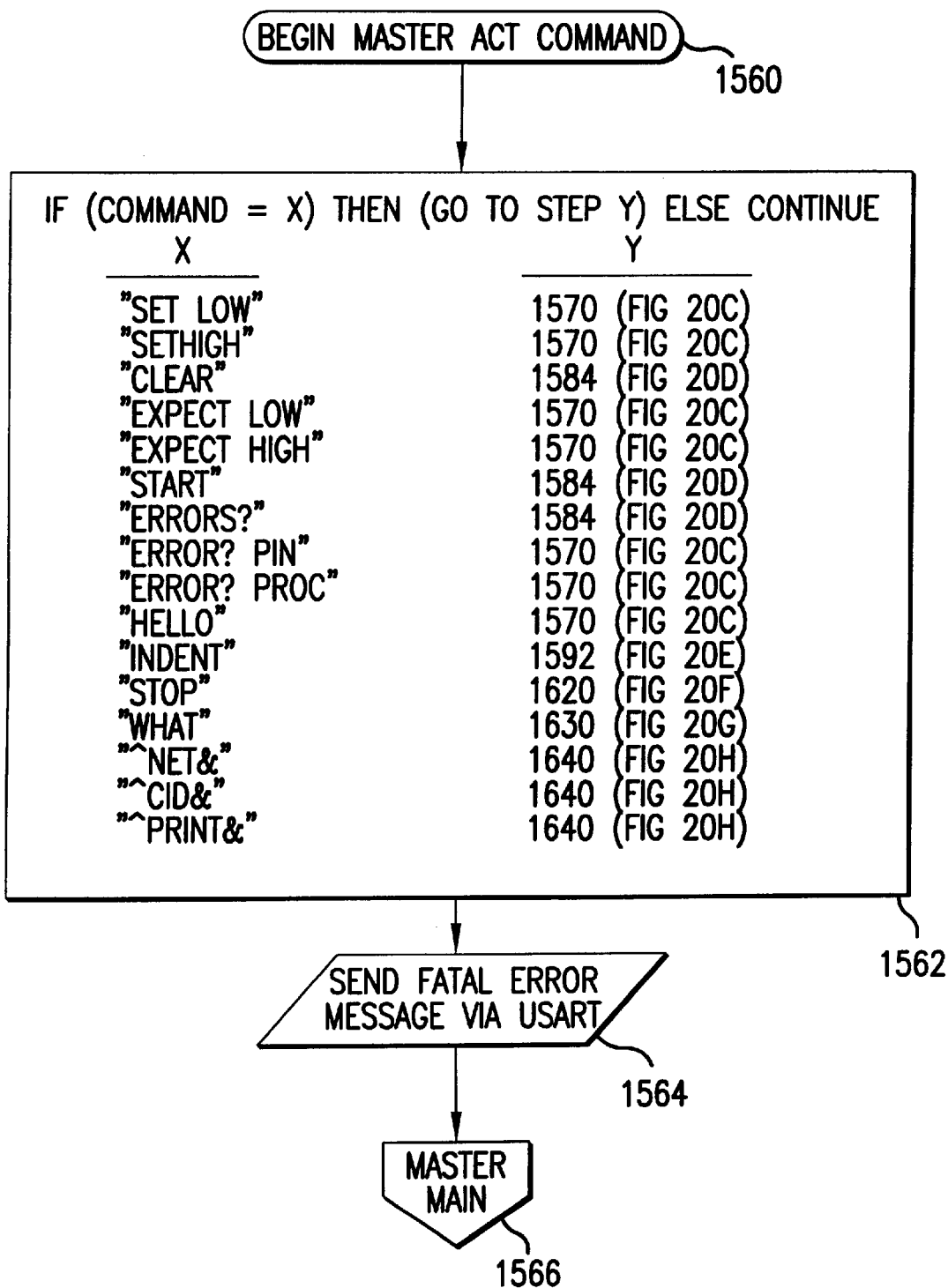

As shown in FIG. 20B, there are 15 possible (ie., valid) commands that the PC/PDA sends to the Master. Depending on the format of the command, the Master branches 1562 to a different subroutine to process the command. Each of these subroutines will be discussed in greater detail later.

Figure 21A:
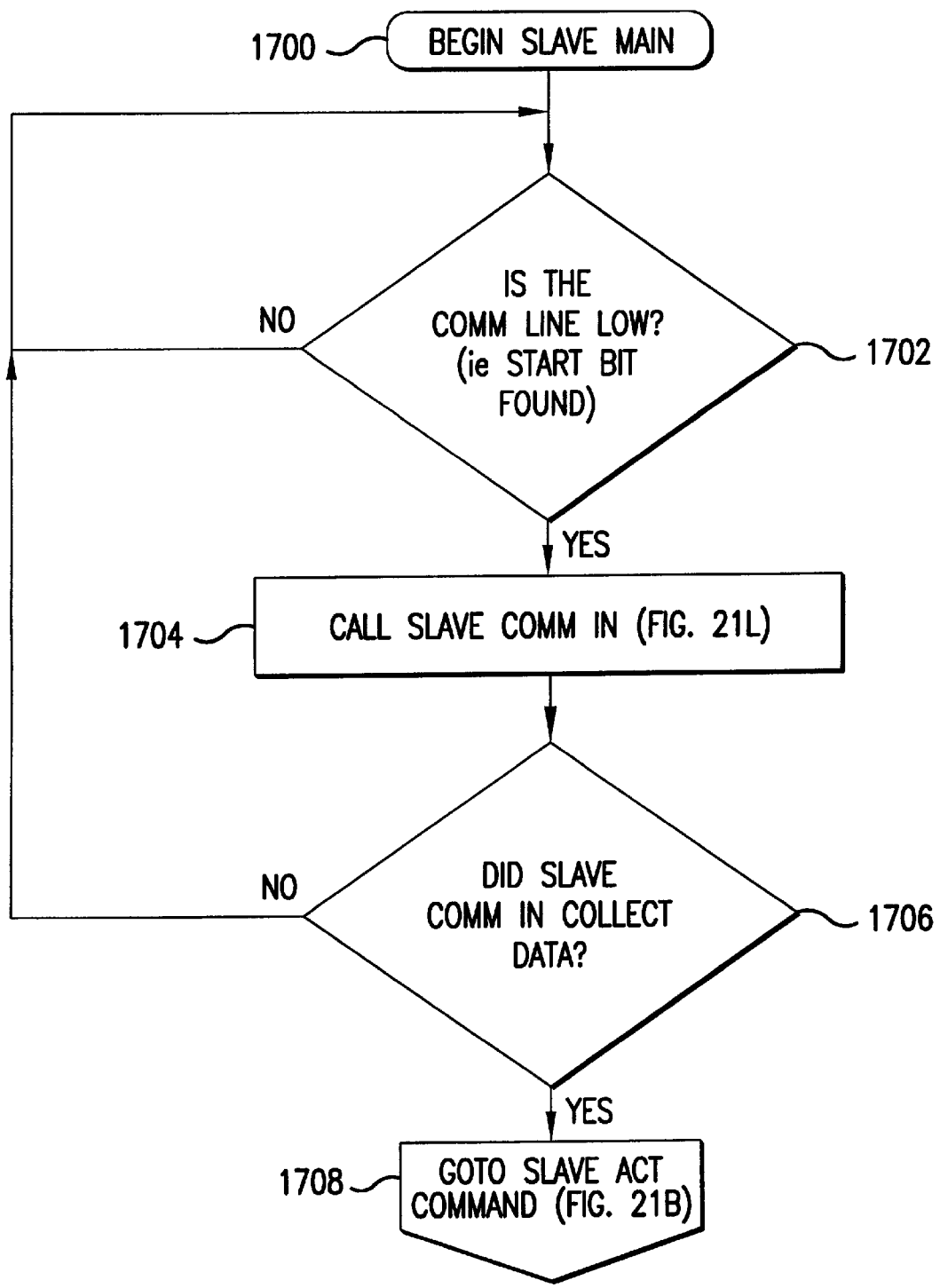
FIGS. 21A through 21O form a flow chart showing the functional steps performed by a slave processor in the distributed processing embodiment of the invention.

The functional steps taken by the Slave are shown in greater detail in FIGS. 21A through 21O. The Slave is primarily a testing and measuring program: it configures each of its I/O pins to either apply a test signal to, or measure a response from, a designated pin of the CUT; compares the measured values with the expected values, and logs any errors.

As shown in FIG. 21A, the Slave's main wait loop is constantly checking 1702 the COMM line for a communication from the Master; the COMM line is high when inactive, so whenever the line goes low the Slave calls 1704 a routine (Slave Comm In, FIG. 21L) to collect the four-byte command word. After the complete command is received and stored in registers, the program jumps 1708 to Slave Act Command (FIG. 21B).

Figure 21B:
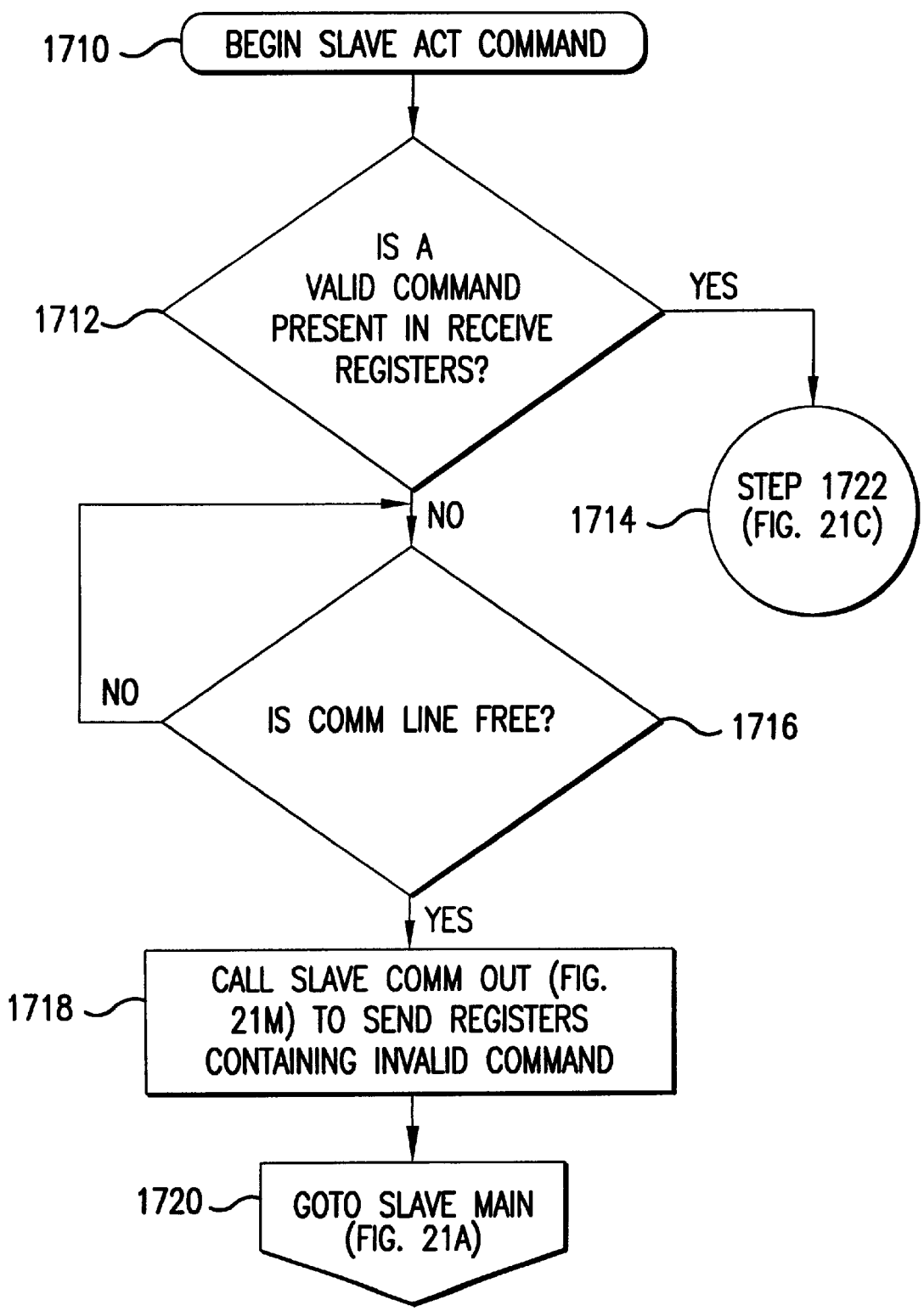

At step 1712 in FIG. 21B, the Slave first determines whether the command received is valid. If the command is not valid, the program waits 1716 until the COMM line is available, calls 1718 the routine Slave Comm Out (FIG. 21M) to send the invalid command back to the Master (which forwards the command to the PC/PDA), and returns program control to Slave Main (FIG. 20A). If the command is valid, the program continues 1714 to a branching operation 1724 (FIG. 21C), similar to that used by the Master (see step 1562 at FIG. 20B). For each of the eleven commands the Slave calls 1724 a different subroutine—which will be discussed in greater detail later.

Details of Components and Connections

The Master processor is a PIC16C74 (the '74) microcontroller, available from Microchip Technology, Inc. It was selected for its built in Universal Synchronous Asynchronous Receiver Transmitter (USART), relatively large input/output (I/O) pin count (33 I/O pins), program memory space (4 KB), and random access memory (RAM) space (192 bytes), speed (20 MHZ clock), and cost.

The '74 is an 8 bit processor capable of running at clock speeds up to 20 MHZ, which results in a typical instruction execution time of 200 ns. It has a total of 35 instructions. As configured in the preferred embodiment, the RAM includes several registers: 32 registers, ASCII1 through ASCII32, for holding each character of the command string received from, or sent to, the PC/PDA; four registers, SENDREC1 through SENDREC4, for holding the four-byte command sent to, or received from, the Slaves.

Each Slave is a PIC16C64 (the '64) microcontroller, also available from Microchip Technology, Inc. The '64 was selected because it was the most inexpensive processor in the processor family on a per-pin basis. It has 2 KB of program memory space and 128 bytes of random access memory (RAM). Like the Master, it is an 8-bit processor that can run at clock speeds of up to 20 MHZ, and has a total of 35 instructions.

The '64 has 33 I/O pins arranged in one 6-bit port (Port a), three 8-bit ports (Ports B, C, and D), and one 3-bit port (Port E). Using only one pin (Port a, bit 4) for the asynchronous communications with the Master leaves 32 pins available for testing. Since 32 is a power of 2 ($2^5$=32), the address decoding processes simplified, and the cost per pin is optimized.

However, a synchronous communications protocol—using more than one pin—might have been implemented if a different processor had been chosen as the slave processor (e.g., if using only one pin for communications would not have left 32—or some other power of 2—free I/O pins). It general, is easier to do address decoding than asynchronous communications. For example, a synchronous communications protocol using three wires (e.g., data-in, data-out, and clock) could be used: when the clock line transitions from low to high, data is received from the data-in line and transmitted via the data-out line. In the alternative, a two line protocol (e.g, using only clock and data lines) could be used: the send or receive status is controlled by the processor (i.e., in response to previously received control messages), and again the events are triggered by the clock.

However, since the '64 is used as the Slave in the preferred embodiment, an asynchronous communications protocol is used to maximize the 32 I/O pins available on each processor. In addition several temporary storage registers (temp registers) used for intermediate storage during calculations and operations, the Slave is also configured with several special registers used for communications, storing information concerning the configuration and status of the pins for which each Slave is responsible, and for storing the test results.

The FLAG (=00 through 31) registers hold the following information about each of the 32 pins that the Slave is responsible for: whether the pin is an input or output, whether the pin is high or low, whether the pin expects a high or low, and whether a fault has occurred. Bit 0 is cleared for input and set for output. Bit 1 is set for high output and cleared for low output. Bit 2 is set for expect high and cleared for expect low. Bit 3 is set if a fault occurred and cleared if no errors were found.

The *EXPECT (*=a through E) registers hold the expected values for Slave ports A through E. The ERROR (=00 through 31) registers hold the error count for each of the Slave's pins. By keeping track of the number of errors, the "severity" of the intermittent fault is approximated. PROSFLAG1 is a general purpose register. Bit 7 of the register is set if the processor has determined its location in address space (i.e., which set of CUT pins it is responsible for). The actual value is stored in a register called PROSNUM. Bit 6 is set if any of the pins on the processor have an error, as determined by polling the individual ERROR** registers. Finally, the SENDREC* (*=1 through 4) registers hold the four-byte command word received from, or sent to, the Master.

Full details on either chip can also be found at Microchip Technology, Inc.'s web site at http:/www.microchip.com. However, note than a variety of processors—other than the '64 and/or the '74—could have been used, depending on the priorities assigned in the design tradeoffs. For example, the architecture could have used a greater number of processors, each being responsible for a smaller number of pins. This configuration would complete the testing process more quickly because more parallel processing would occur, but would requires a greater number of devices, which in turn requires more labor intensive assembly, more area on the circuit board, and so on. The architecture implemented in the preferred embodiment was selected as a balance between speed, size, and cost.

Figure 15:
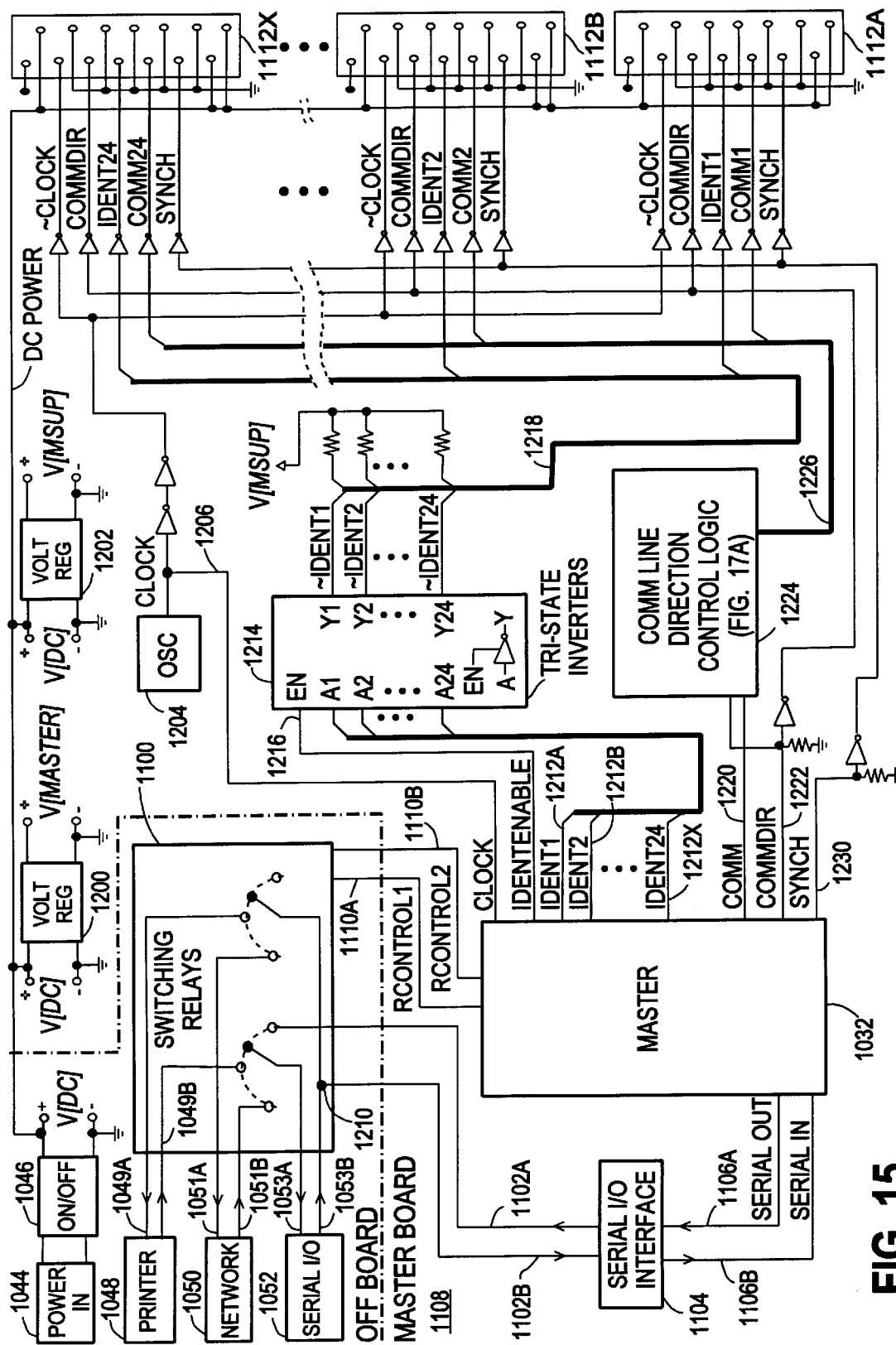
FIG. 15 is a schematic diagram showing the interconnections on a circuit board supporting the master processor of the distributed processing embodiment of the invention.

The layout of the master board 1108 is shown in detail in FIG. 15. a pair of voltage regulators, 1200 and 1202, convert the raw DC power input, $V_{DC}$, to more suitable supply voltages, $V_{MASTER}$ and $V_{MSUP}$. The voltage $V_{MASTER}$ is used only as the supply voltage for the Master, while the voltage $V_{MSUP}$ is used as a general positive supply voltage for the remainder of the elements on the master board. In addition, an oscillator 1204 is provided to serve as the system clock; in this case, the clock speed is 20 MHZ, the maximum allowed for the '74 and '64 chips. The signal CLOCK is supplied to the Master via line 1206, and is also distributed—after being inverted to ~CLOCK—to each slave board at connectors 1112A through 1112X.

In addition, as shown in the figures, both the Master board and the Slave boards contain a plurality of resistors, capacitors, and driving inverters that are used to condition, stabilize, or regenerate the various signals; unless necessary to clarify the discussion, these components generally will not be mentioned in detail.

Turning now to the main processing and logic elements on the board, communications from the PC/PDA are received at port 1052, and carried via the lines 1053A and 1053B to the switching relays 1100, via lines 1102A and 1102B to a serial I/O interface 1104, and finally via lines 1106A and 1106B into the Master 1032 (signals SERIALOUT and SERIALIN, respectively). The Master processes the signals and issues a plurality of control and communications signals, which are routed through the various logic elements positioned in the center of the layout, and are then distributed to the slave boards via the 14-pin bus connectors 1112A through 1112X. Each of these signals will be discussed in turn by referring to the inputs to, and outputs from, the Master 1032.

Beginning in the upper left hand corner of the Master 1032 are the two relay control (output) signals RCONTROL1 (line 1110A) and RCONTROL2 (line 1110B). The switching relays 1100 are responsive to these signals to selectively route the signals from the PC/PDA (ie., serial I/O port 1052) to either the Master (via serial I/O interface 1104), the local printer (i.e., printer port 1048), or the network (i.e., network port 1050). Note the permanent connection 1210, which enables the Master to receive control signals from the PC/PDA regardless of the position of the relays.

Moving clockwise around the Master, the next three lines have been discussed previously: SERIAL OUT and SERIAL IN are the Master's output and input lines, respectively, for communications with the PC/PDA; and the input signal CLOCK (line 1206) is received from the 20 MHZ oscillator 1204 serving as the system clock.

The next group of lines is used to initialize the system on startup; more specifically, to allow the Slaves to identify their respective location in address space. Since each Slave board is identical, any one particular board initially has no way of knowing which group of pins, and thus, which connectors/conductors in the CUT, it is responsible for. Accordingly the Master allocates a distinctive output line, 1212A through 1212X, carrying signals IDENT1 through IDENT24, respectively, for each of the 24 slave boards. The lines are bussed through a bank of tri-state inverters 1214 (enabled by the IDENTENABLE signal on line 1216), and then distributed via bus 1218 to their respective connectors 1112A through 1112X.

The next two signals, COMM and COMMDIR, carried by lines 1220 and 1222, respectively, are used for communications with the Slaves. The line COMM is a shared by all of the Slaves and is "bidirectional" in that it both carries commands to, and receives responses from, the Slaves. The direction of information flow on the line is controlled by the Master, via the COMMDIR line, as well as logic structures on both the master board (box 1224) and on each slave board (e.g., box 1302 in FIG. 16). The direction-control architectures are shown in greater detail in FIGS. 17A and 17B, and will be discussed after an initial overview of the layout of the Slave board. Eventually, both the COMM and the COMMDIR signals are distributed to the slave boards via connectors 1112A through 1112X.

The final signal generated by the Master is the output signal SYNCH, line 1230, which is also shared by all of the Slaves. The SYNCH signal is connected to the low-enabled clear reset pin of each Slave, and is used to initialize all of the Slaves upon startup of the system (i.e., when SYNCH is pulled high, the Slaves are brought out of reset mode), e.g., at step 2002 of FIG. 19A Referring now to FIG. 16, the layout of a representative slave board, 1120A, is depicted. The communications from the Master are received via the 14-pin connector 1116A and are shared by all of the Slaves, labeled Slave A1 (1034-1) through Slave A8 (1034-8). Each Slave then communicates independently with a distinct set of 32 pins in connector.

Figure 16:
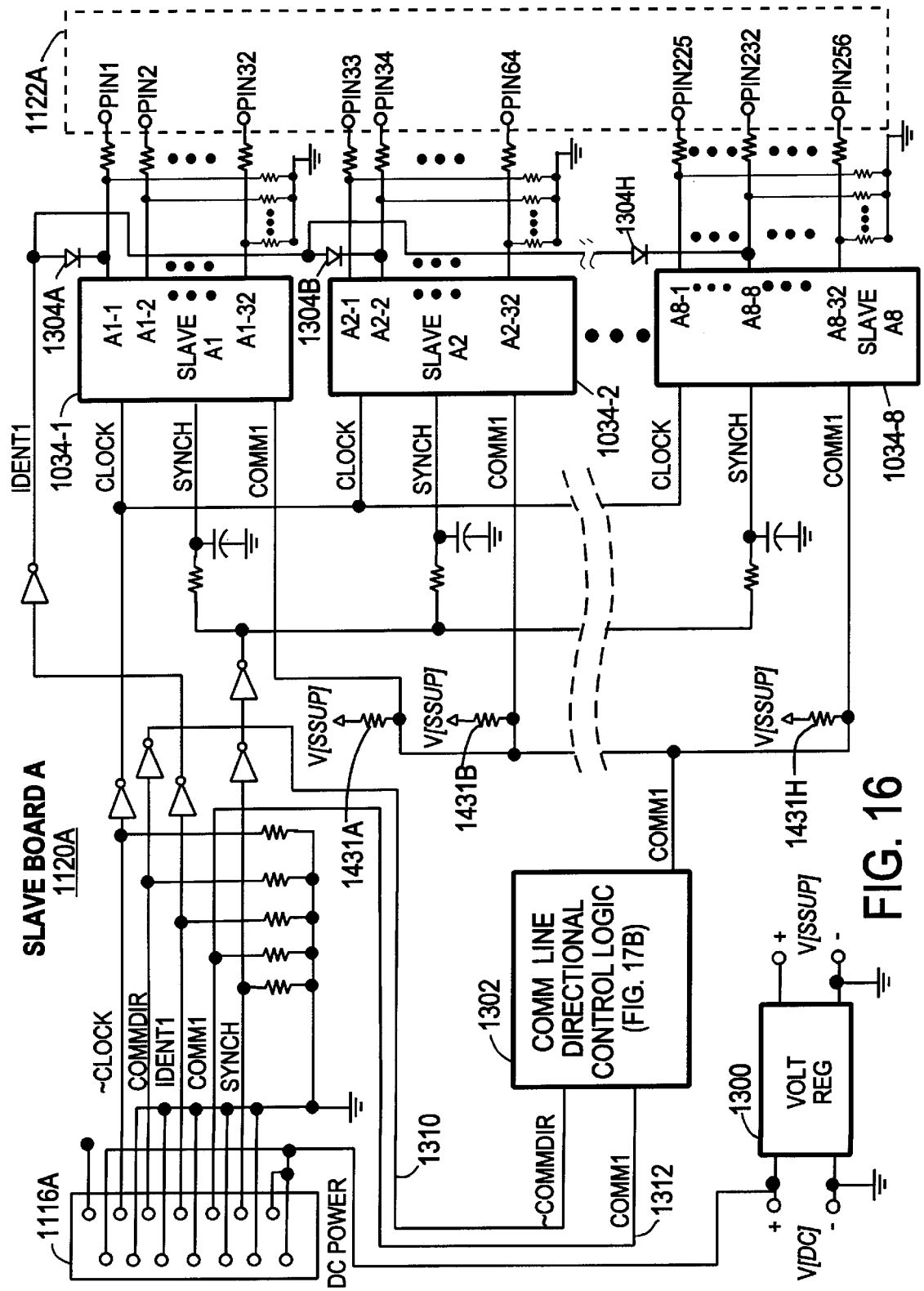
FIG. 16 is a schematic diagram showing the interconnections on a representative circuit board supporting slave processors in the distributed processing embodiment of the invention.

The function of the majority of the signals and lines received from the Master have already been discussed, and are merely being distributed to the Slaves as shown in FIG. 16. However, the specific connections for each line will be discussed in turn.

First, the raw DC voltage $V_{DC}$ is received and routed to voltage regulator 1300 to produce a positive supply voltage $V_{SSUP}$ for the slave board. The 20 MHZ (CLOCK) signal, and the SYNCH signal, are both distributed directly to each of the Slaves. Note that the SYNCH signal is routed through a resistor-capacitor combination before entering each Slave to stabilize the signal against intermittents or glitches that might inadvertently reset the Slaves.

The signals COMMDIR and COMM1 are first routed through the COMM line direction control logic 1302 before being distributed to the Slaves. This logic is shown in greater detail in FIG. 17B, and will be discussed in greater detail later.

The IDENT1 signal is connected through a diode to a different pin on each of the Slaves to allow each Slave to identify its relative position on the particular Slave board. Recall that each Slave is running an identical program, and each slave board is identical. Each slave board contains eight Slaves, with each Slave being responsible for 32 of the 256 pins allocated to each slave board. The IDENT1 signal is connected through diode 1304A to the first pin (labeled A1-1) of the Slave in the "first" position (responsible for pins 1-32), through diode 1304B to the second pin (labeled A2-2) of the Slave in the "second" position (responsible for pins 33-64), and so on. The specific process the Slave uses to identify itself based on this connection will be clarified in the discussion of the software below.

Figure 17A:
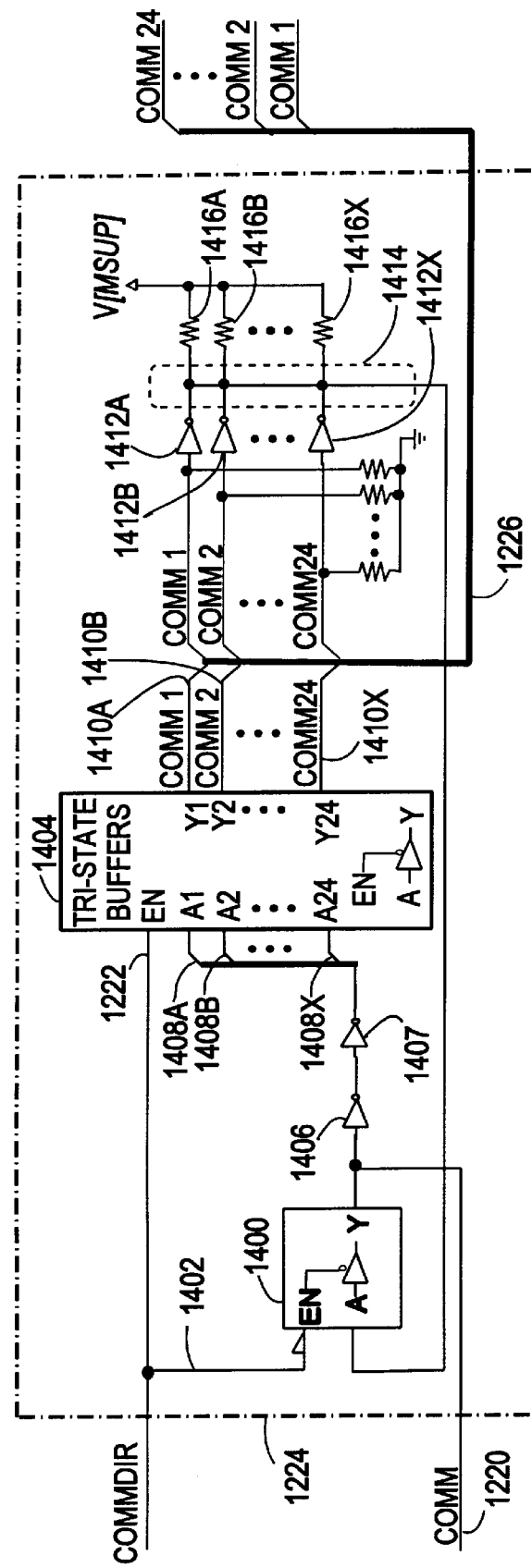
FIG. 17A is a schematic diagram of the COMM line directional control logic on the circuit board of FIG. 15.
Figure 17B:
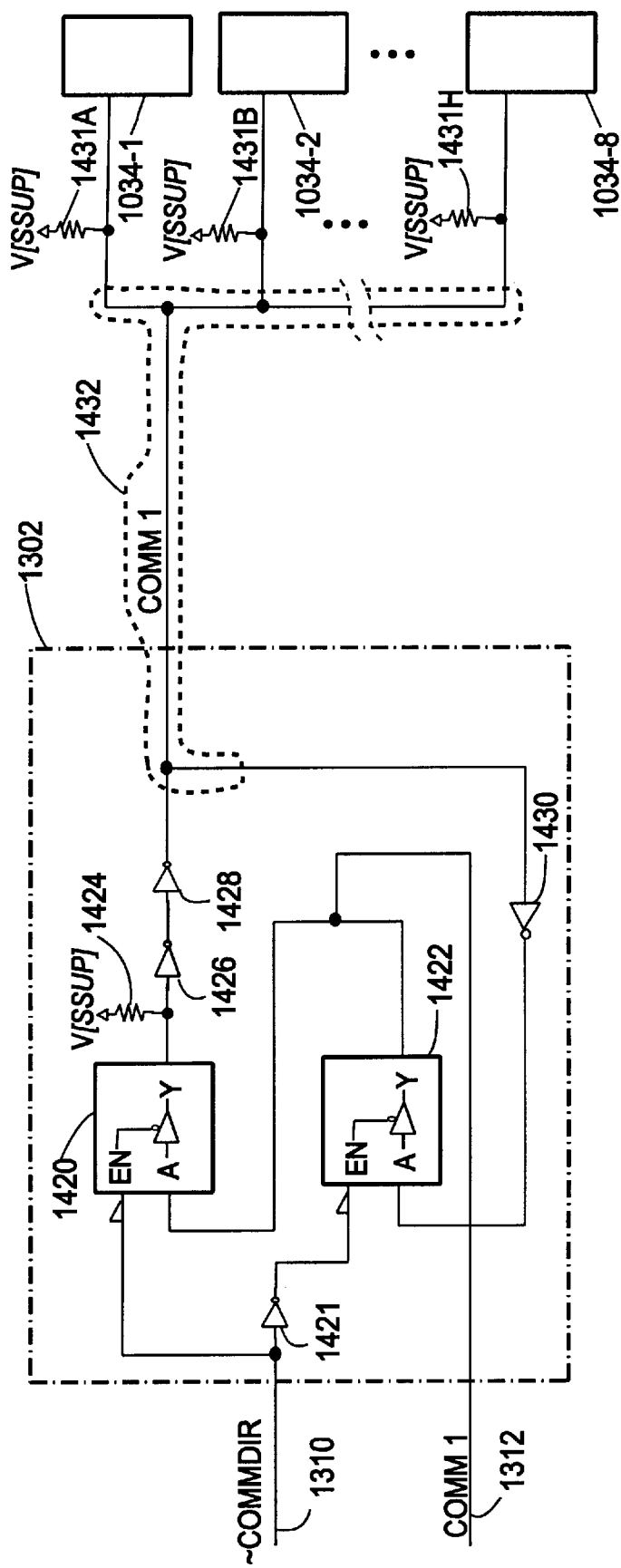
FIG. 17B is a schematic diagram of the COMM line directional control logic on the circuit board of FIG. 16.

Reference is now made to FIGS. 17A and 17B, which provide details concerning the COMM line directional control logic found on the master board (see also FIG. 15) and the slave board (see also FIG. 16), respectively. The circuitry shown not only allows the single COMM line to carry communications both directions between Master and Slave, but allows the all of the processors to share a single communications line. When the Master sends a message, every Slave receives the message simultaneously; similarly, when any single Slave sends a message, all other Slaves, as well as the Master, receive the signal.

Generally, this scheme is implemented with combinations of tri-state buffers, inverting drivers, and open-collector devices with their output pins connected, or "tied together." Tying together the outputs pins of open-collector devices is equivalent to routing all of the outputs into a negative-logic OR gate (or a positive-logic AND gate): the resulting signal will register low (a negative-logic-1, or a positive-logic-0) any time any one of the tied-outputs goes low. Since the primary communications between Master and Slaves (i.e., via the COMM line) are handled using a negative-logic protocol, this tying together of the outputs of open collector devices is referred to as OR-tying.

Beginning at the left hand side of FIG. 17A, the COMMDIR signal is routed to the "enable" input of both tri-state buffer 1400 as well as a bank of tri-state buffers 1404. Note that the buffer 1400 is low-enabled, i.e., the buffer passes the signal through only when the enable line is low.

The COMM line is connected to the output of tri-state buffer 1400, which is routed through a pair of driving inverters 1406 and 1407, split up into 24 separate lines, 1408A through 1408X, and fed into the bank of tri-state buffers 1404. Each of the 24 outputs, 1410A through 1410X, of the bank 1404 is routed out to one of the 24 Slave boards via bus 1226, as discussed earlier. Also, each of these outputs is routed into an open-collector inverter, 1412A through 1412X, respectively, and the outputs of all of these inverters are tied together 1414 as well as each having its own pull-up resistor, 1416A through 1416X. As a result, the node 1414 is OR-tied, and is then connected as the input to the tri-state buffer 1400.

Turning now to the logic contained on the Slave board a, as shown in FIG. 17B, the inverted signal (COMMDIR) is connected to the enable input of low-enable tri-state buffer 1420, as well as being inverted back to COMMDIR and fed into the enable input of low-enabled tri-state buffer 1422. At the left hand side of the figure, the COMM1 line "enters" and is connected to the output of buffer 1422, which also serves as the input to buffer 1420. The output of buffer 1420 is connected via pull-up resistor 1424 to inverter 1426 and then into open-collector inverter 1428. The output of the inverter 1428 is both distributed out to the Slaves as the COMM1 signal, and routed back through inverter 1430 as the input into tri-state buffer 1422. Note that the pins on each Slave that receives the COMM 1 line are also open-collector pins, and each is connected to its own pull-up resistor 1431A through 1431H, thus, node 1432 is also OR-tied: the entire node goes low when any of the Slaves pulls its COMM1 line low, or if the inverter 1428 output goes low. Note also that when tri-state buffer 1420 is disabled its output acts as an open circuit, which pin may "float" between high and low voltage levels. However, pull-up resistor 1424 ensures that the input to inverter 1426 is tied high, which results in open collector inverter 1428 outputting high, so as to avoid inadvertently pulling node 1432 low.

Now, with the various connections established the function of the direction control logic can be demonstrated by setting COMMDIR either low or high and following the COMM signal through the circuits.

The Master sets COMMDIR to high when it intends to send a message to the Slaves. On the master board (FIG. 17A), buffer 1400 is disabled, and the buffer bank 1404 is enabled; on the slave board, buffer 1420 is enabled, but buffer 1422 is disabled. The Master's message passes through inverters 1406 and 1407 and through the buffer bank 1404, and is routed to the Slaves via COMM buss 1226. Although the signal is also routed through the open-collector inverters 1412A through 1412X and back into buffer 1400, the buffer 1400 is disabled, which prevents the signal from being fed back into the Master on line 1220.

Turning now to FIG. 17B, the Master's message enters the circuit on COMM 1 (line 1312) and is routed into active tri-state buffer 1420. The output of the buffer is then passed through both inverters 1426 and 1428 and into all of that board's Slaves simultaneously. The output of inverter 1428 is also fed back through inverter 1430 and into disabled buffer 1422, which again prevents the signal from being cycled back the the Master.

In contrast, the Master sets COMMDIR to low when it is waiting to receive a message from the Slave(s). On the master board, buffer 1400 is now enabled, but the buffer bank 1404 is disabled; on the slave board, buffer 1420 is disabled, but buffer 1422 is enabled. For the sake of discussion, it will be assumed that Slave A2 is sending the message, which it initiates by pulling its own COMM1 line low (i.e., sending a negative-logic-1).

Since all of the COMM1 pins on all of the Slaves A1 through A8 are OR-tied, the common node 1432 is pulled low whenever any Slave pulls the line low. The signal at node 1432 is inverted to high by inverter 1430 and routed through active buffer 1422 and out to the Master board on line COMM1 (line 1312). The high signal is received on COMM1 at the output of disabled buffer bank 1404, and is also inverted by open-collector inverters 1412A through 1412X. Thus when any of the inverters 1412A through 1412X pulls its output low, the entire OR-tied node 1414 goes low, which is then fed through buffer 1400 into the Master's COMM pin via line 1220.

Details of Operation and Functional Relationships

The Master Main routine shown in FIG. 20A has previously been discussed in some detail. However, the specific processes and subroutines will be analyzed further in the discussion to follow. For example, at steps 1554 and 1556 the Master confirms that the command received from the PC/PDA is one of fifteen "valid" choices. This verification process is accomplished using a lookup table stored in the chip's program memory. Recall that the ASCII characters received from the PC/PDA were stored in as registers ASCII1 through ASCII32 (as many of these register as is required for the particular command). The program compares these ASCII values to those stored in the lookup table, checking for matches in both value and sequence. When a match is found, a command number—between one and fifteen—is read from the table and stored in a temporary register. From this point onward, the command is identified solely by the command number.

At step 1558, program control jumps to the subroutine Master Act Command at step 1560 in FIG. 20B. Step 1562 is essentially a large branch statement: the program identifies the command just received from the PC/PDA, and then transfers control to one of seven subroutines. The fifteen possible commands are listed in column X of step 1562, the ASCII (in quotes) command string is listed in column X, although the program uses only the command number (stored in a temp register in step 1554) to execute the branch.

Figure 20C:
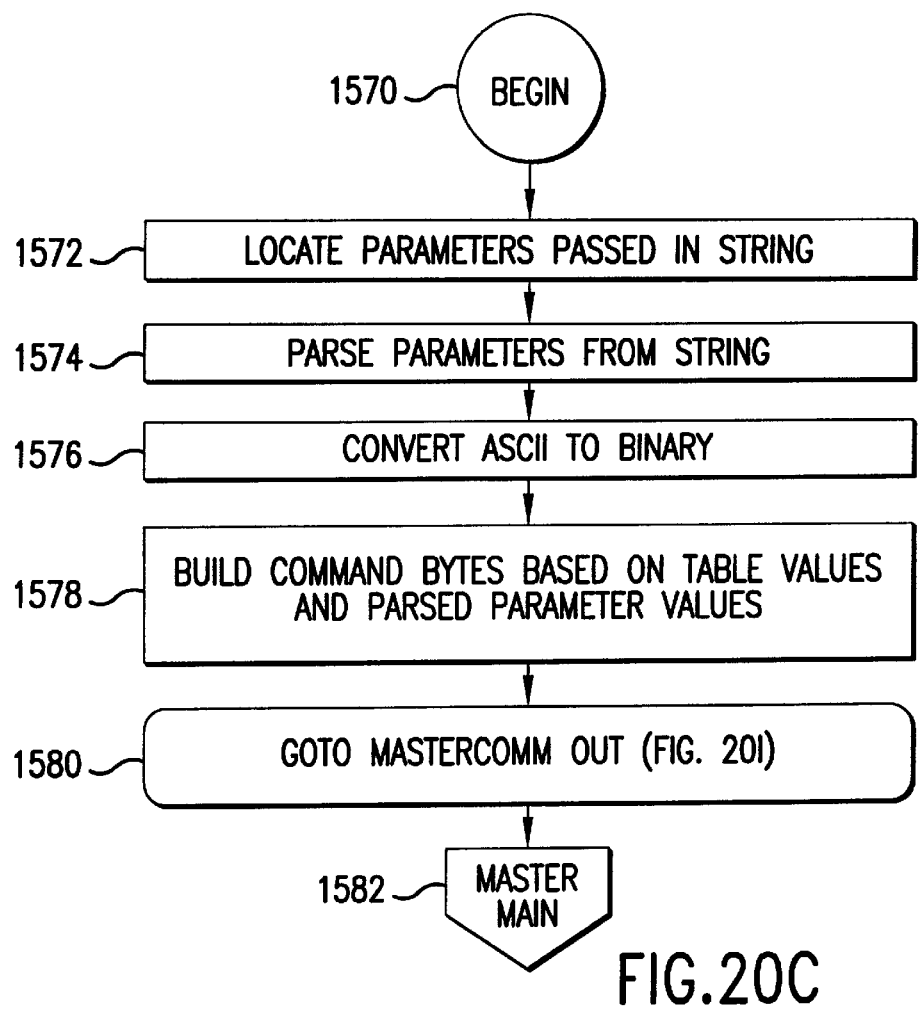

Seven of the commands ('SET LOW', 'SET HIGH', 'EXPECT LOW', 'EXPECT HIGH', 'ERROR? PIN, ERROR? PROC', and 'HELLO') are routed to step 1570 in FIG. 20C. Each of the seven commands processed in this subroutine are similar to two respects: (1) they each are commands that will be executed primarily by the Slaves; and (2) the ASCII-formatted command received from the PC/PDA included not only the command name, but additional parameters such as a pin number or processor number. Accordingly, the subroutine first locates 1572 and parses 1574 the additional information from the command string, then converts the ASCII pin or processor number to its corresponding binary representation.

Recall that the preferred embodiment is configured to test CUTS with up to 6,144 pins, which are handled by up to 192 Slave processors, with each Slave being responsible for a 32 of the CUT's pins. However, recall also that the processor chosen for both the Master and the Slave(s) are 8-bit RISC processor, which means that special precautions are needed to handle any pin numbers larger than 255 ($2^8$=255).

This is handled by breaking up the overall pin number or "address" into two components: (1) a number between 0 and 191, to identify the Slave processor that "owns" the pin in question; and (2) a number between 0 and 31, to identify the appropriate pin out of the 32 pins controlled by that particular Slave. To do this, the 16-bit binary representation of the overall pin number is divided up into two pieces, the eight most significant bits being carried in one temporary register, e.g., TEMP2, and the least significant eight bits being carried in a another register, e.g., TEMP3 These two 8-bit values are then shifted bitwise to the right five times; the bits shifted "out" of the the least significant bit (LSB) position of TEMP2 are loaded into the most significant bit (MSB) position in TEMP3. The 8-bit value that ends up in TEMP3 is the appropriate processor number, and the five bits that were shifted "out" of the LSB of TEMP3 (and stored in the 5 lower bits of yet another register, e.g., TEMP4) correspond to the pin number for that particular Slave.

Of course, if the syntax of the particular command being executed (e.g., error? proc, or hello) includes a processor number rather than a pin number as its additional parameter, then these additional steps are not required. In this case, the program can parse 1574 the processor number from the ASCII command string, convert 1576 that value to its 8-bit binary equivalent, and store the value in a temporary register, e.g., TEMP3.

In either case, after the additional parameter has been parsed 1574 and converted 1576 to the appropriate binary values, the Master builds 1578 the appropriate four-byte command to be passed on to the Slaves using the format described previously: the command number (from register TEMP1) is stored in Byte 0; the processor number (from register TEMP2) is stored in Byte 1; and the pin number (from register TEMP4), if any, is stored in Byte 2. Bytes 3 and 4 are empty when transmitted from Master to Slave. Finally, program control is routed 1580 to the subroutine Master Comm Out (see FIG. 20I, which will be discussed later) to send the four-byte command down to the Slaves, and then returns 1582 control to Master Main (FIG. 20A).

Figure 20D:
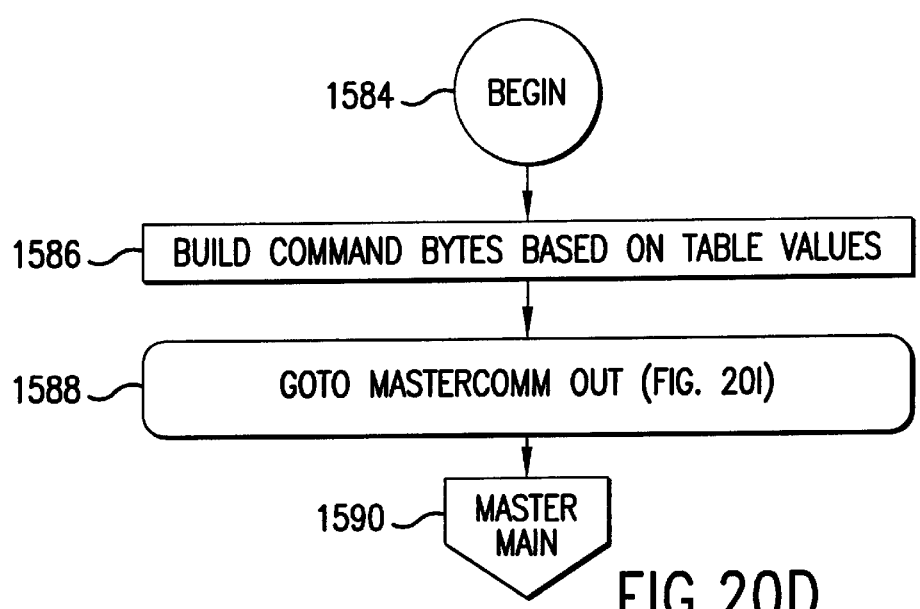
Figure 20E:
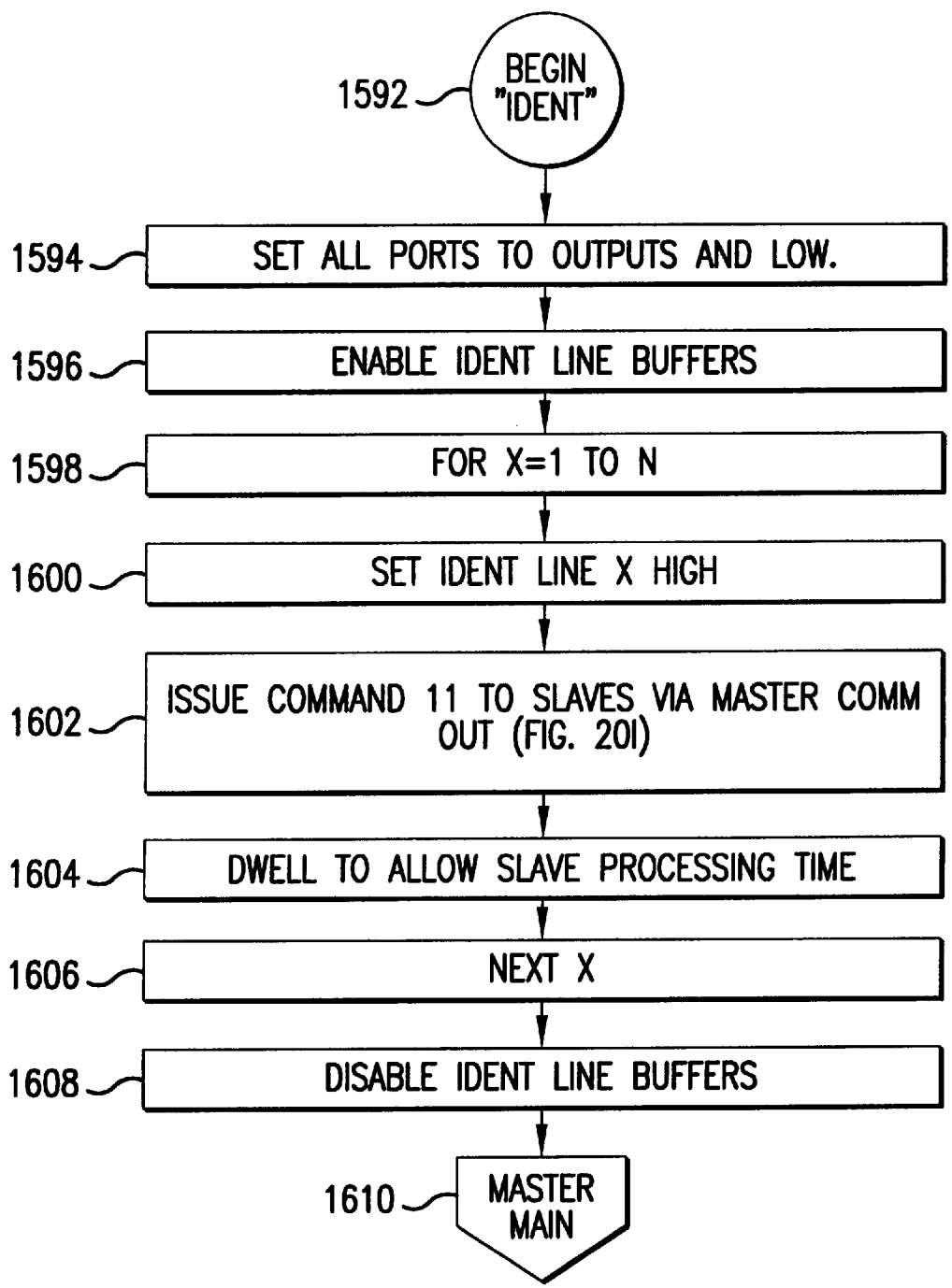

Referring again to the branch statement at step 1562 of FIG. 20B, there are three commands (clear, start, and errors?) that cause program control to jump to step 1584 of FIG. 20D. Each of these commands is similar in that it applies to all Slaves, not any one individual Slave. Thus, the subroutine shown in FIG. 20D is similar to that described in FIG. 20C, except that there are no additional parameters to be parsed from the ASCII command string: the routine builds 1586 the four-byte Slave command merely by placing the command number (e.g., from register TEMP I) into Byte 0, and clearing Bytes 1 through 4. Again, the subroutine ends by calling 1588 Master Comm Out (see FIG. 20I) to send the four-byte command down to the Slaves, and then returning 1590 control to Master Main (FIG. 20A).

All communications are handled in a serial bit wise fashion. Between the PC/PDA and the Master, the commands are ASCII. The specific information being passed between the Master and the Slave changes from command to command, although the four-byte format is always the same. Each of the four bytes carries specific information: byte 0 is the command number (1 through 11); byte 1 is the processor number (1 through 192); byte 2 is the pin number for that processor (1 through 32); and byte 3 is an auxiliary register that typically carries the error count (0 through 255) when the command is passed back from Slave to Master.

Of course, additional bytes could be added to carry additional information, or to accommodate different instructions in future upgrades of the Master/Slave software. For example, the system might be programmed to handle commands which set ranges of pins high or low; a byte 4 could be added to carry the pin number that defines the end of the range.

Before discussing the functional steps and procedures used by the Slaves, there are two subroutines called from within the previously discussed Master subroutines. The Master Comm Out and Master Comm In routines, shown in FIGS. 20I and 20J, respectively, are used to pass the four-byte binary control commands between the Master and Slave(s).

Referring first to Master Comm Out, beginning at step 1660 of FIG. 20L the routine first checks 1662 checks to make sure that the COMM line is not currently being used by a Slave. If so, then the program recognizes that an error has occurred; by design, the Master controls the COMM line and the Slaves only transmit messages in response to a command from the Master. The program then returns 1664 to the calling routine.

If the COMM line is free, then the Master configures 1666 the COMM line pin (Port C bit 4) to output, and sets the COMMDIR line high, which activates the COMM line directional control logic on both the master board and each slave board—as discussed previously and shown in FIGS. 17A and 17B—to allow the messages to pass from the Master to the Slave(s). Once configured, the subroutine pulls 1668 the COMM line high (it's "resting" state) and sends the contents of the registers SENDREC1 through SENDREC4 in serial bitwise fashion.

The signals carried by the COMM line use a negative logic scheme: Accordingly, the Master "inverts" each bit of the command before sending it on the COMM line. First, the Master sends a "start" bit by pulling the COMM line high, Next each bit of the four-byte command is inverted and sent along the COMM line: if the bit stored in the SENDREC register is set high, then the Master pulls the COMM line low, and vice versa.

It takes 18 instruction cycles from transmitted bit edge to bit edge (approximately 3.6 micro seconds) when using the 20 MHZ clock and the specific processors chosen for Master and Slave. There is a somewhat longer than 18 cycle pause between bytes because it takes a few extra cycles to queue up the next byte to send. Once all four bytes (SENDREC1 through SENDREC4) have been sent, the COMM line pin is configured 1670 for input, the COMMDIR is pulled low (which configures the COMM line directional control logic to allow messages to move from the Slaves to the Master, as discussed previously), and the Master program control returns 1672 to the calling routine.

Figure 20F:
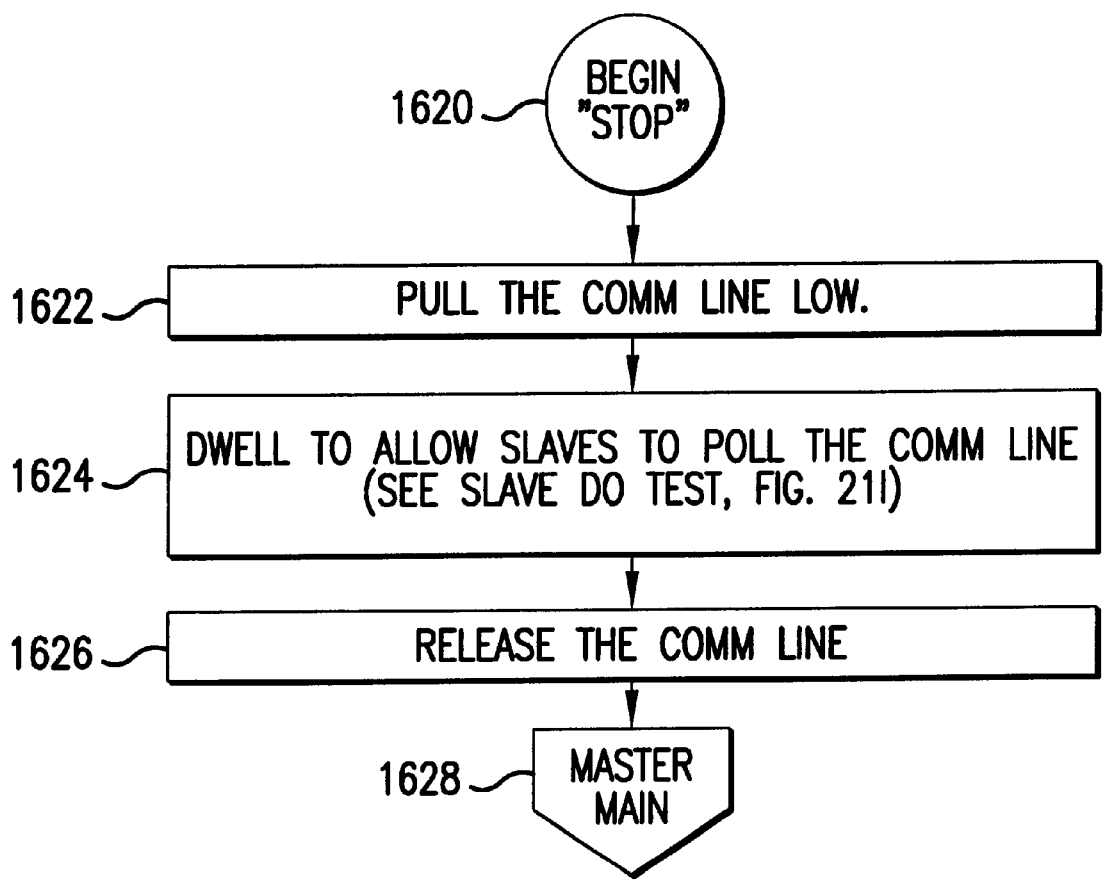
Figure 20G:
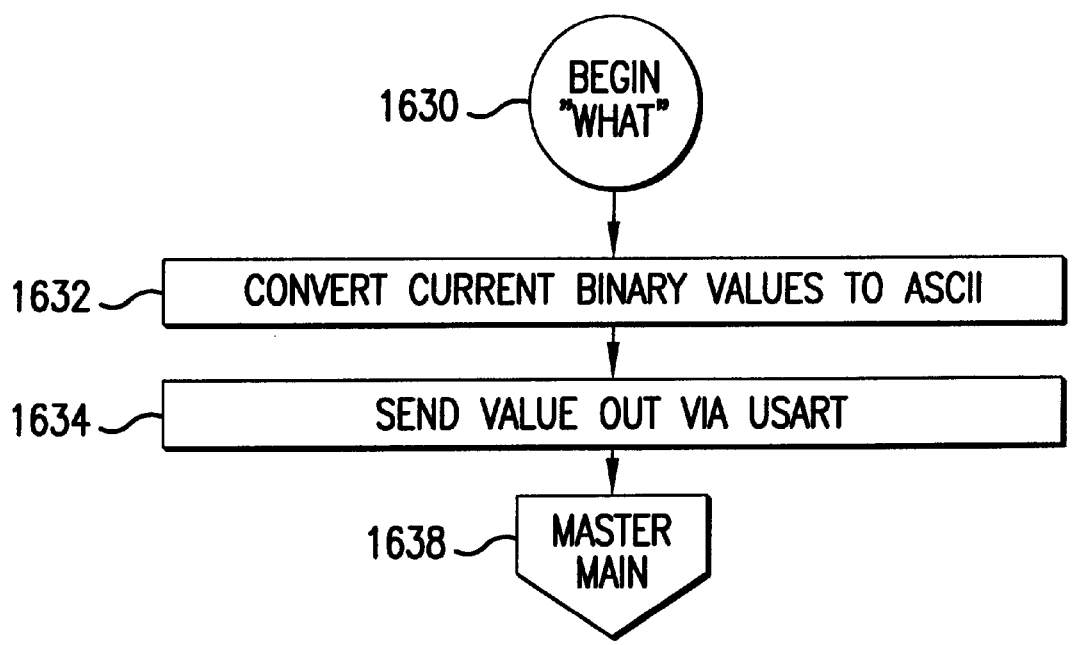
Figure 20H:
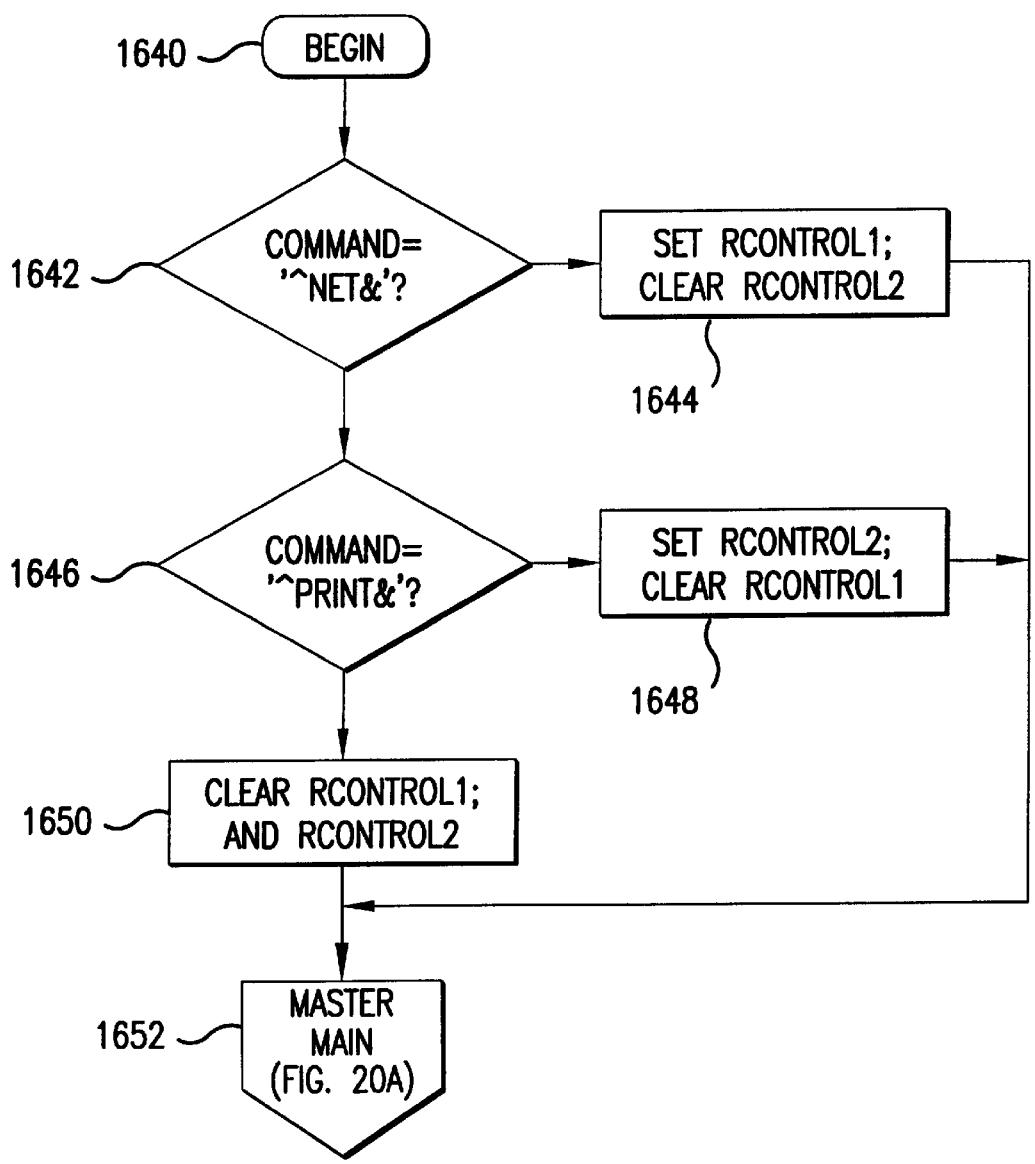
Figure 20I:
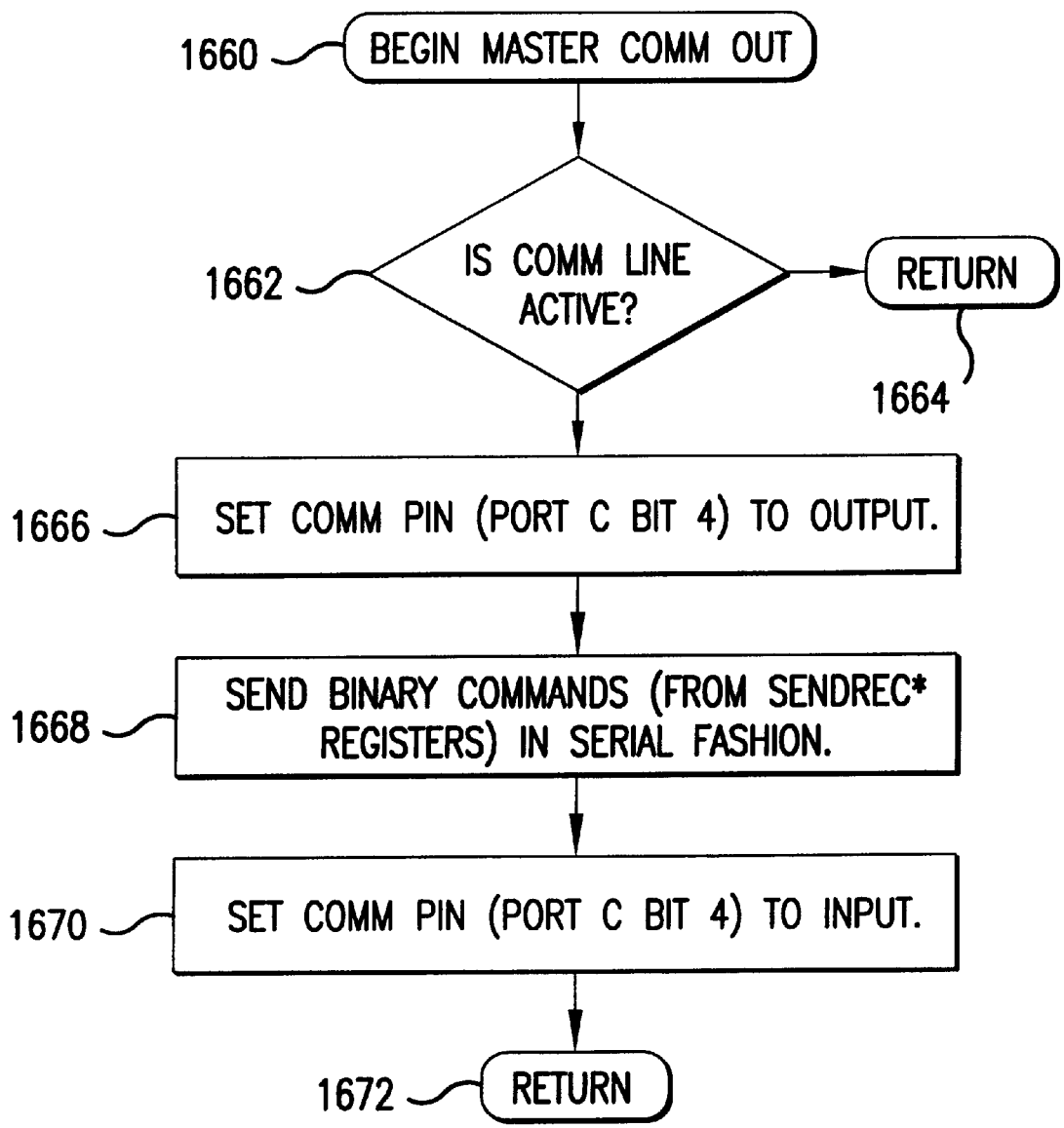
Figure 20J:
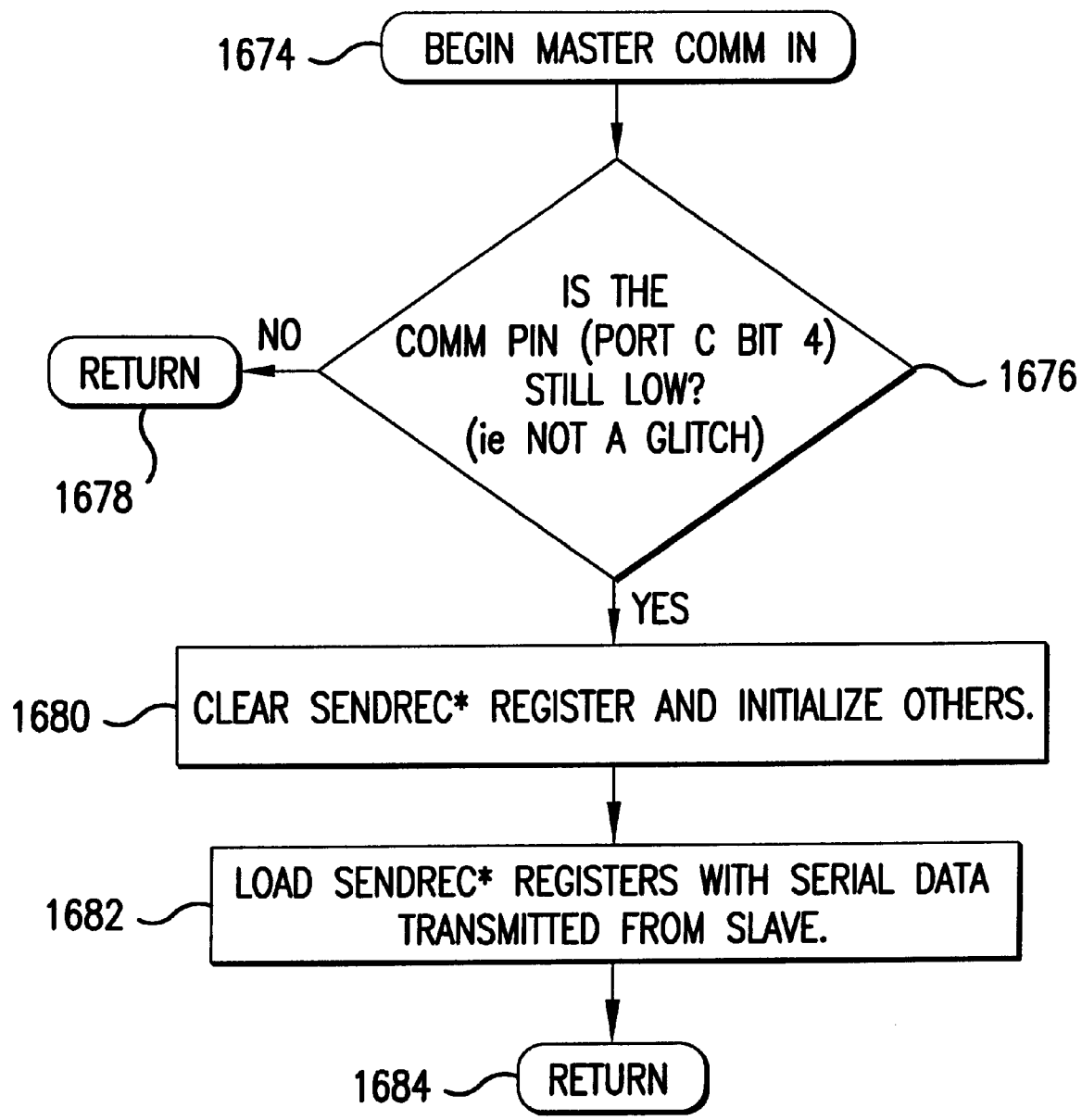

The final Master subroutine, Master Comm In at FIG. 20J, is called only from Master Main (FIG. 20A). The subroutine performs the opposite function of Master Comm Out (FIG. 20I) by loading into the registers SENDREC1 through SENDREC4 the bitwise values it reads from the COMM line.

Since Master Comm In is called only after the Master reads a low on the COMM line (see step 1550 in FIG. 20A), the subroutine should be starting its duties somewhere in the middle of the start bit transmitted from the Slaves. First, the program checks 1676 to verify that the COMM line is still low, and that it was not just a glitch that caused the subroutine to be called inadvertently. If the line is high, the program returns to the calling routine; if the line is still low, the subroutine clears 1680 all of the Master's SENDREC registers and initializes other supporting registers (e.g., to count the received bits, etc.)

The program then loads 1682 each bit it receives into the appropriate bit of the SENDREC registers. The receiving routine (Master Comm In or Slave Comm In) also waits the appropriate amount of time (e.g, 18 instruction cycles between bits, slightly longer between bytes) between reading each bit from the the COMM line. When the entire four-byte command has been received, program control returns 1684 to the calling routine.

The routines Slave Comm In (FIG. 21L) and Slave Comm Out (FIG. 21M) are essentially identical to Master Comm In (FIG. 20J) and Master Comm Out (FIG. 20I), respectively. The only difference is that the Slaves' COMM pin is pin 4 of Port A, while the Master's COMM pin is pin 4 of Port C.

The functional steps taken by the Slave(s) are shown in FIGS. 21A through 21O. The primary routine, Slave Main, is shown at FIG. 20A and has already been discussed in some detail. Recall that the Slave sits in main wait loop

1702, constantly checking the COMM line (port a, bit 4) for a start bit (i.e., low) to indicate that a message in coming in from the Master. When the start bit is found, the routine calls Slave Comm In (FIG. 21O) to collect the four-byte command from the COMM line. If Slave Comm In collected a command, as opposed to a short lived glitch (see step 1910 of FIG. 21L), then the routine jumps 1708 to Slave Act Command, at FIGS. 21B and 21C.

At step 1712, Slave Act Command first verifies that the command received is valid, e.g., by confirming that Byte 0 (stored in the Slave's SENDREC1 register) is a value between 1 and 11. If not, the routine waits 1716 until the COMM line is free, and calls 1718 Slave Comm Out (FIG. 20P), to send the invalid command (stored in registers SENDREC1 through SENDREC4) immediately back to the Master, and program control returns to Slave Main (FIG. 21A).

Figure 21C:
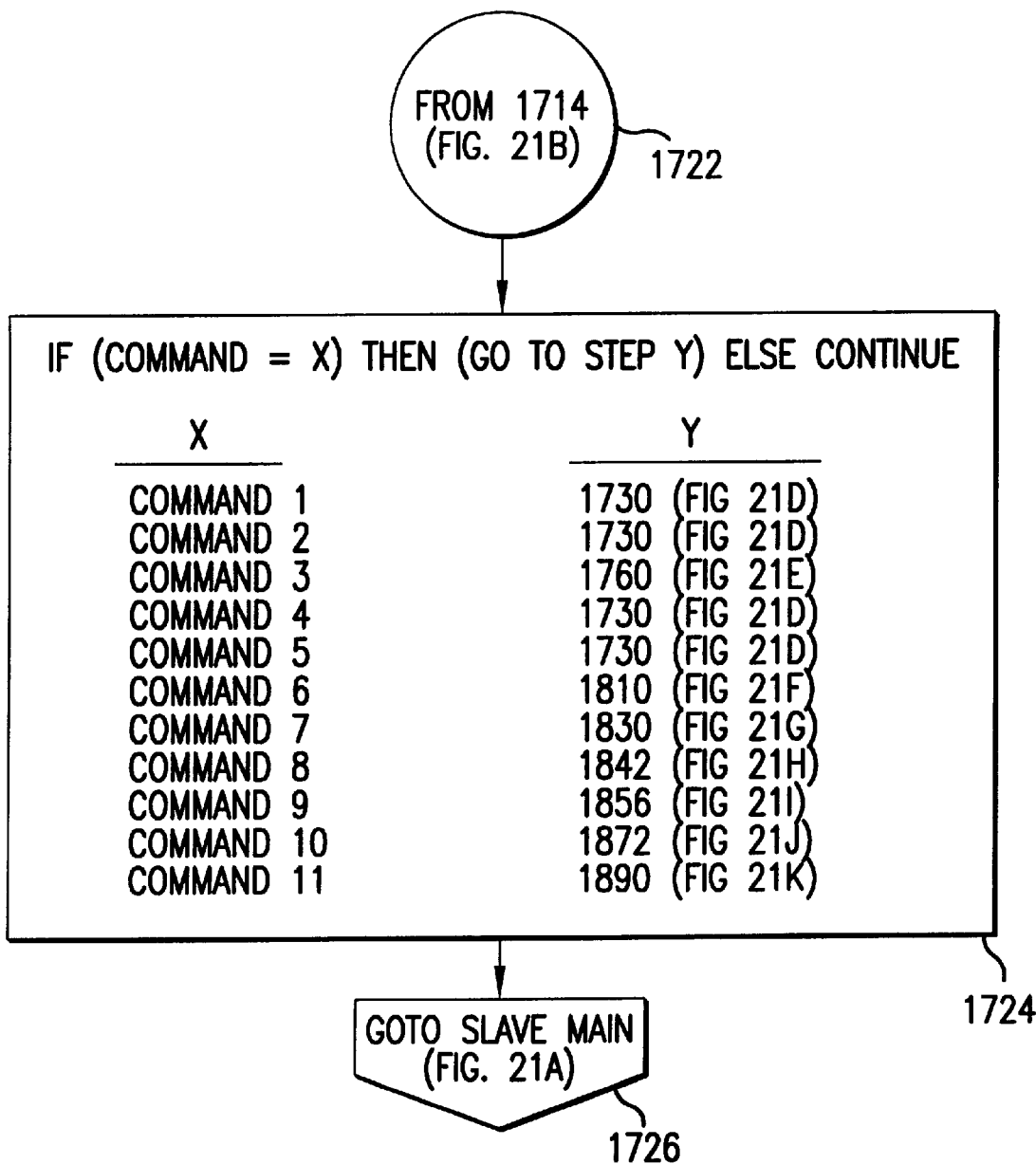
Figure 21D:
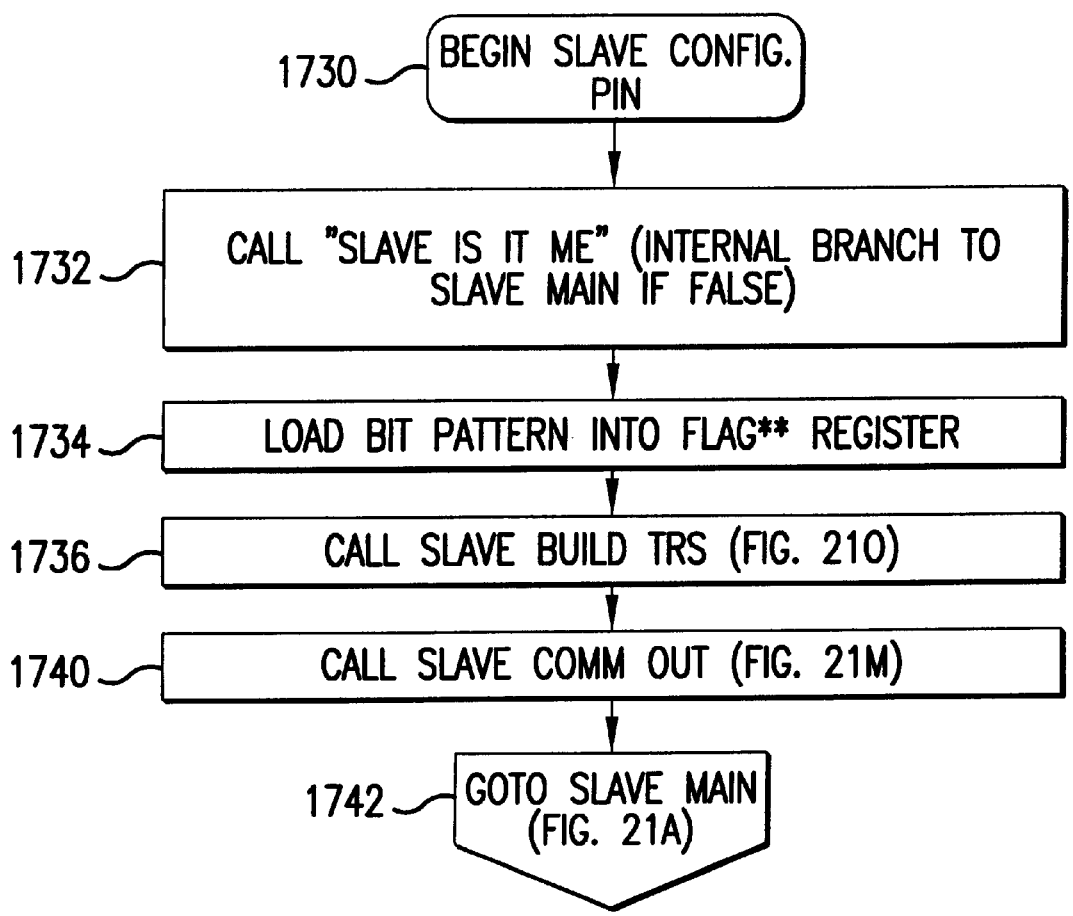
Figure 21E:
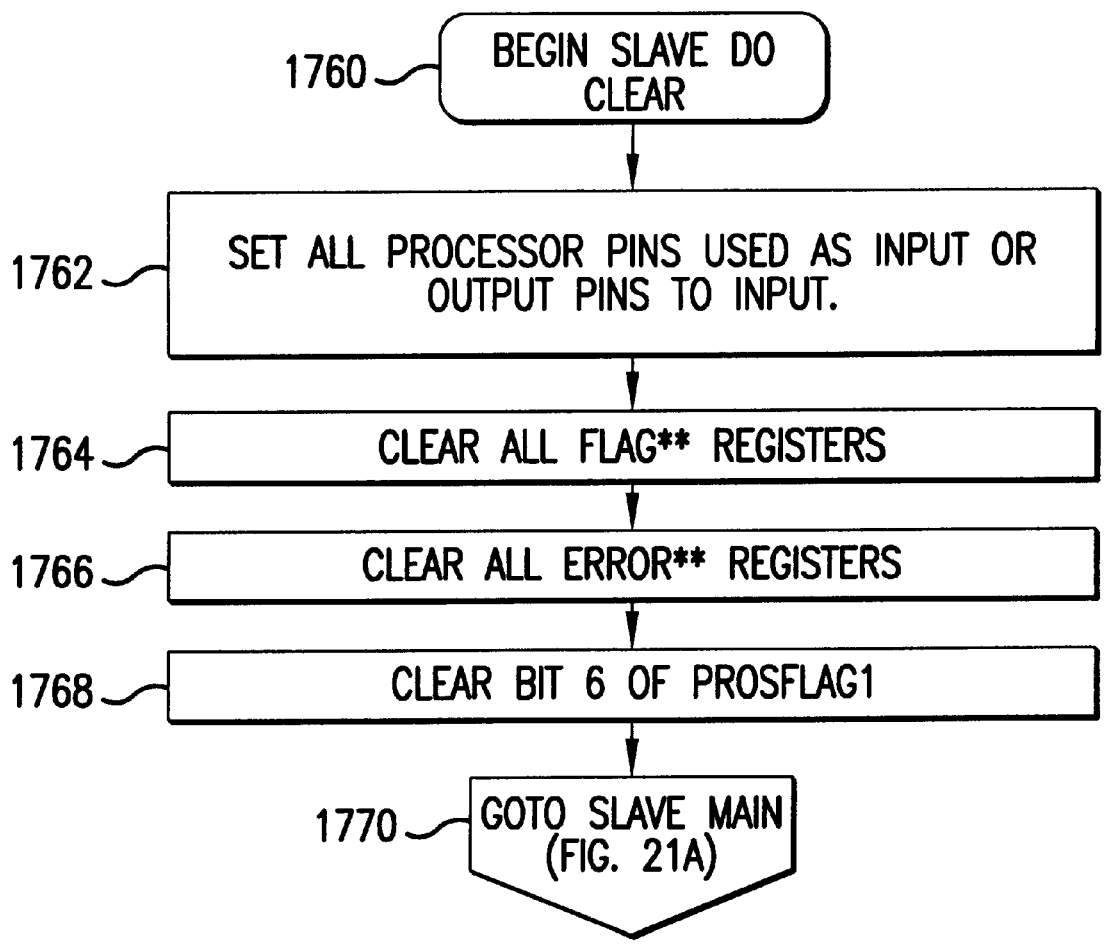

If the command number was valid at step 1712, then the program continues 1714 to step 1722 of FIG. 21C, which leads to a large branch routine 1724, similar to that used by the Master (see step 1562 of FIG. 20B). When the Slave receives one of the command numbers listed in column X, the branch statement transfers program control to the step listed in column Y. These eleven commands correspond to the first eleven commands listed in column X of step 1562 (FIG. 20B). In the following discussion, the values in the four-byte command format will be indicated as {byte 0, byte 1, byte 2, byte 3}.

As mentioned previously, the overall control of the system is governed by the user via the PC/PDA, which either performs various actions itself, or transmits the appropriate ASCII command to the control unit for action by the Master or Slave(s). To understand how the individual commands are processed within the overall system, each of the valid command will be discussed in turn begin with the system initialization.

First, there are two initialization commands issued by the PC/PDA at steps 2002 and 2004 in FIG. 19A. The 'IDENT' command is used to allow the Slave processors to find themselves in address space, i.e., determine the 32 pins for which it is responsible. When received by the Master, the 'IDENT' command (command number 11), causes the Master's program control to jump to step 1592 of FIG. 20E. First, referring to FIGS. 15 and 20E, the Master configures 1594 all of its I/O pins that are connected to lines IDENT1 through IDENT24 as outputs and clear (low), and enables 1596 the bank 1214 of tri-state inverters by pulling the IDENTENABLE line 1216 high. Next, the subroutine executes a loop 1598 N times, once for each of the slave boards used in the system (in the preferred embodiment, N=24).

Each iteration of the loop contains three steps. First, one of the IDENT lines (IDENTX, where X is the loop index) is pulled 1600 high. Second, the Master issues the appropriate four-byte command to the Slaves using Master Comm Out (see FIG. 20I). The format of each four-byte command is {11, ProcNum, 0, 0}, in which the ProcNum is equal to the first processor number of the slave board for which the Master has raised the IDENT line high (i.e., ProcNum starts at 0, and then is increased by 8 for each subsequent issuance of command until it reaches 185**)

Figure 21F:
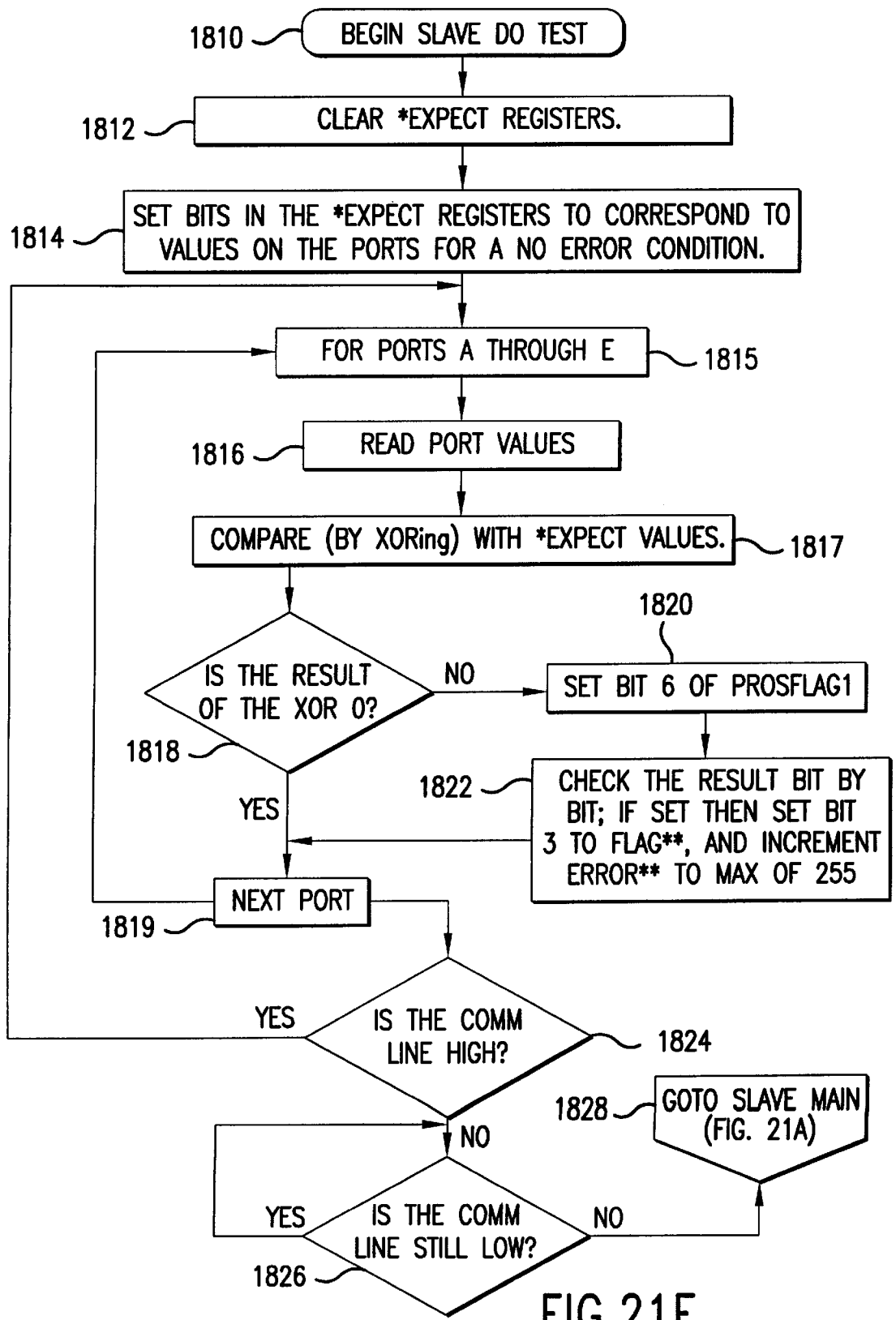
Figure 21G:
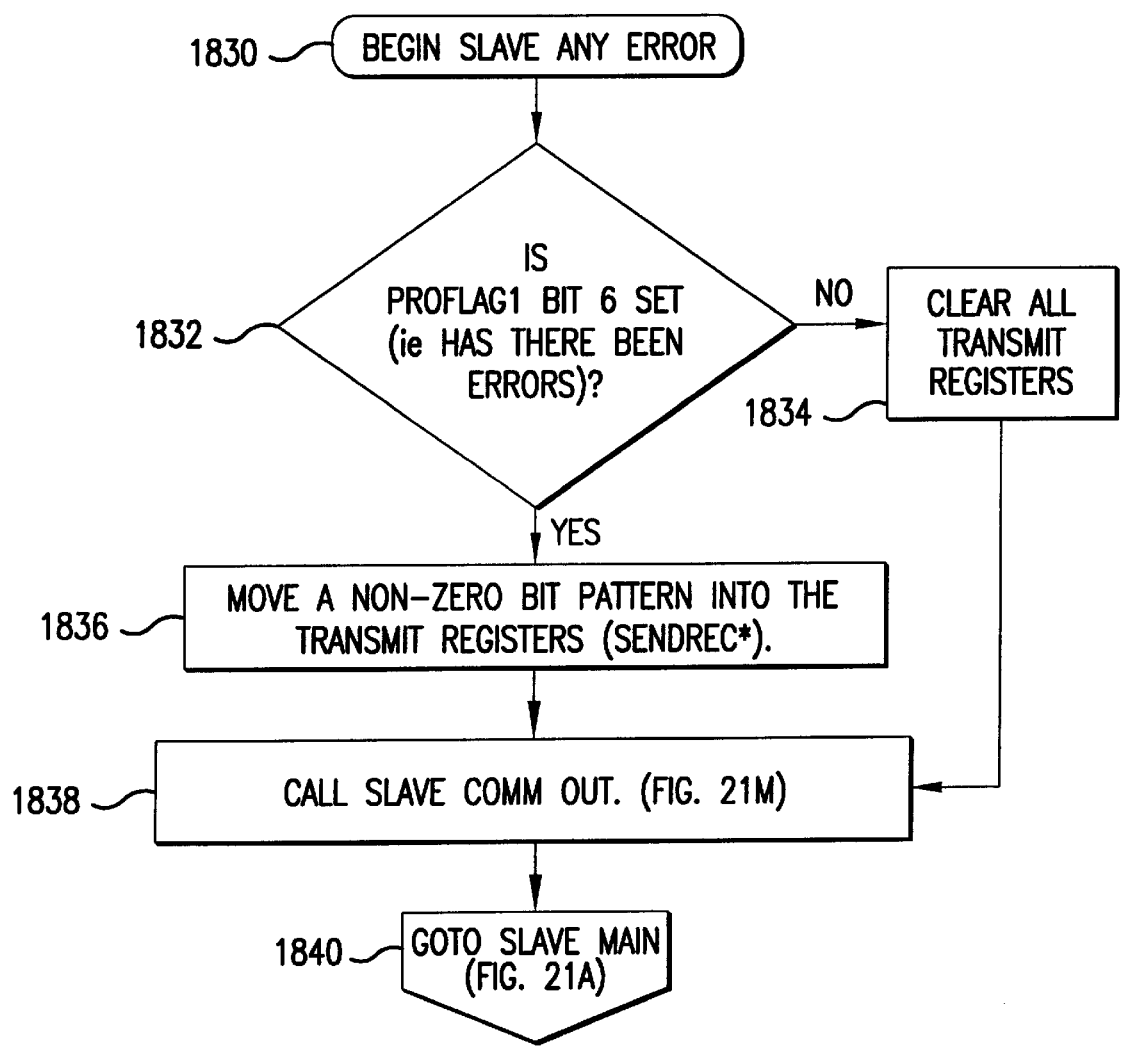
Figure 21H:
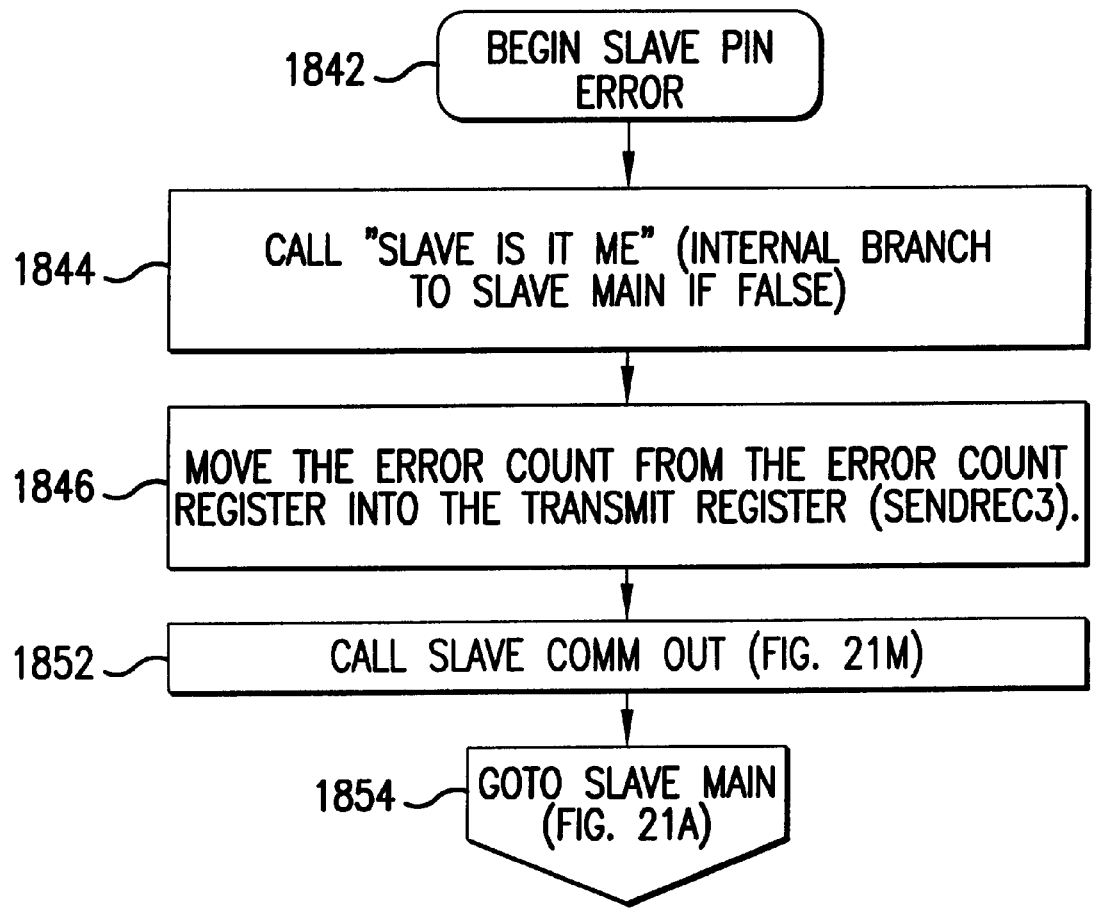
Figure 21I:
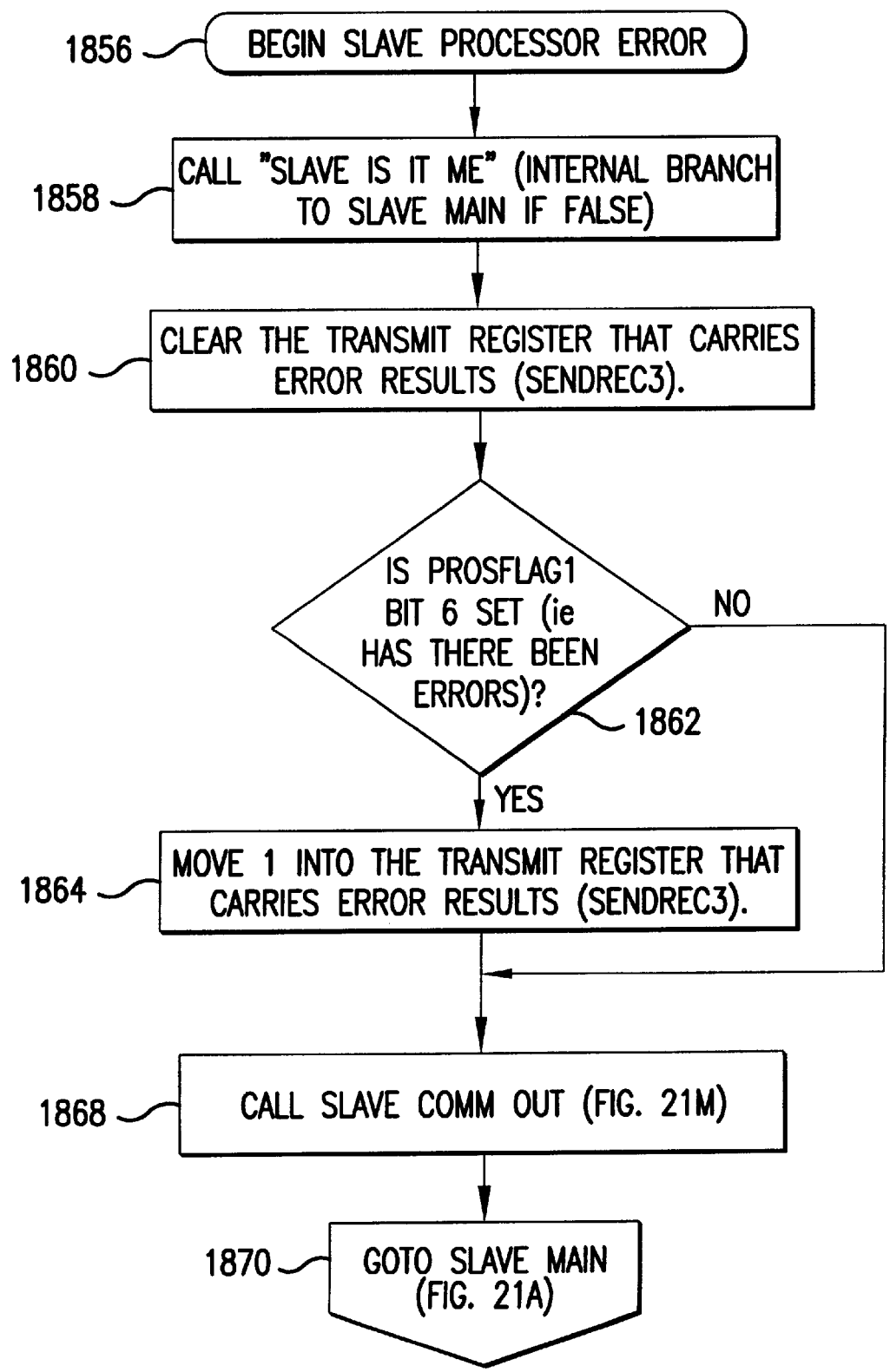
Figure 21J:
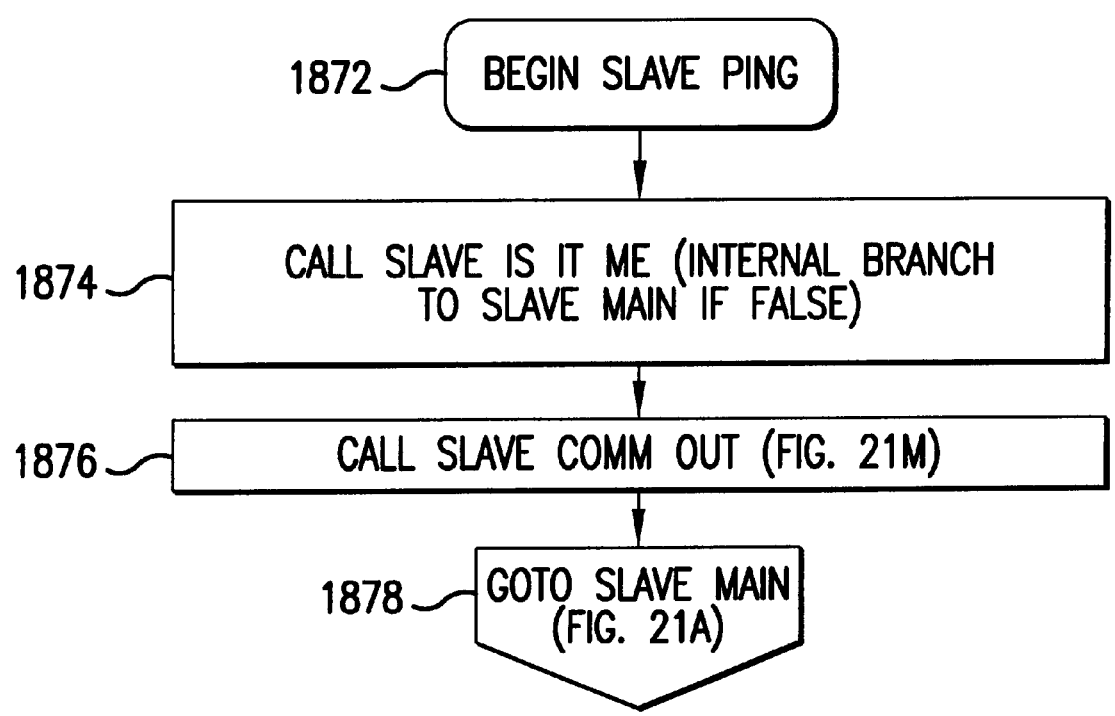
Figure 21K:
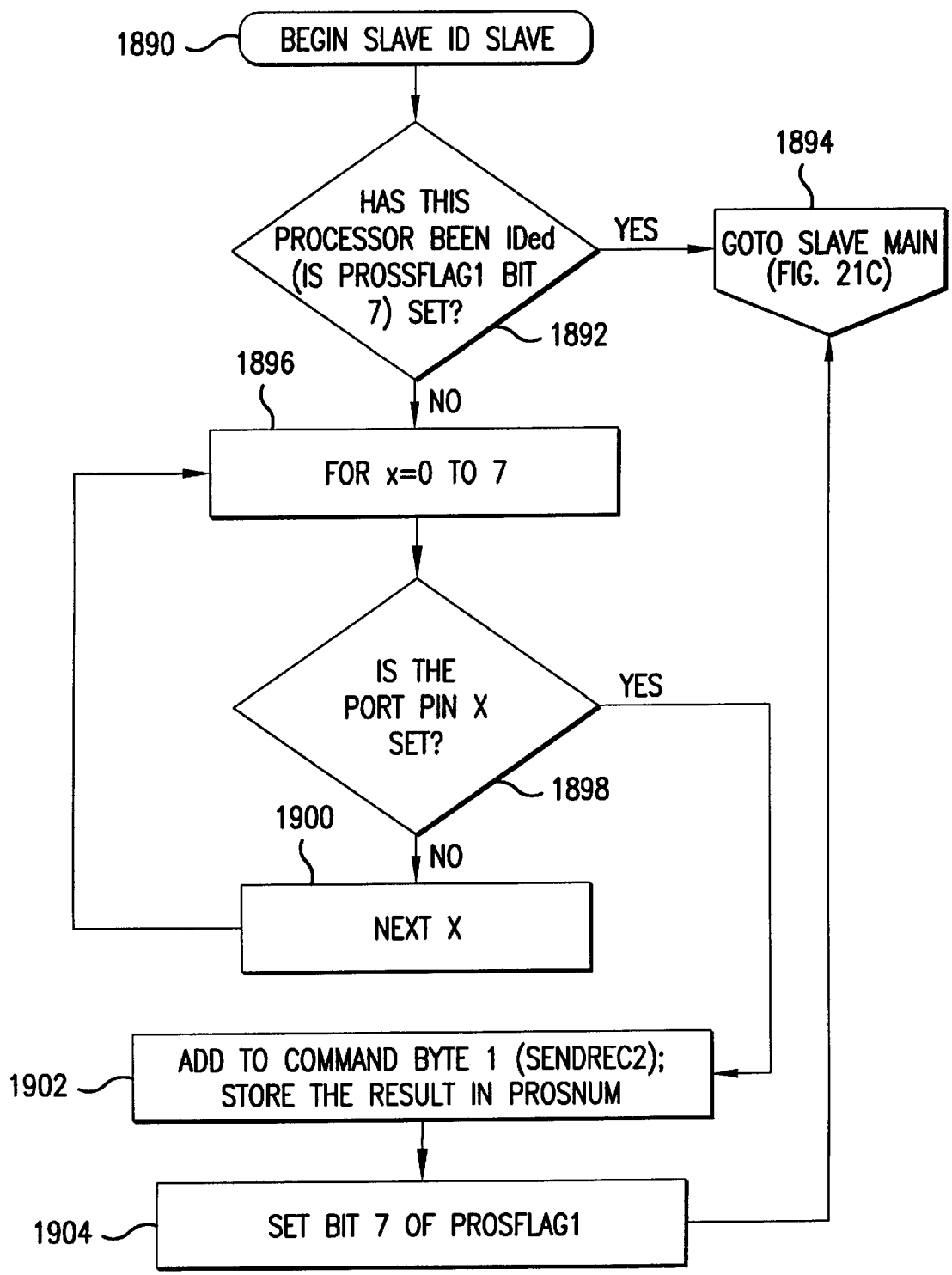
Figure 21L:
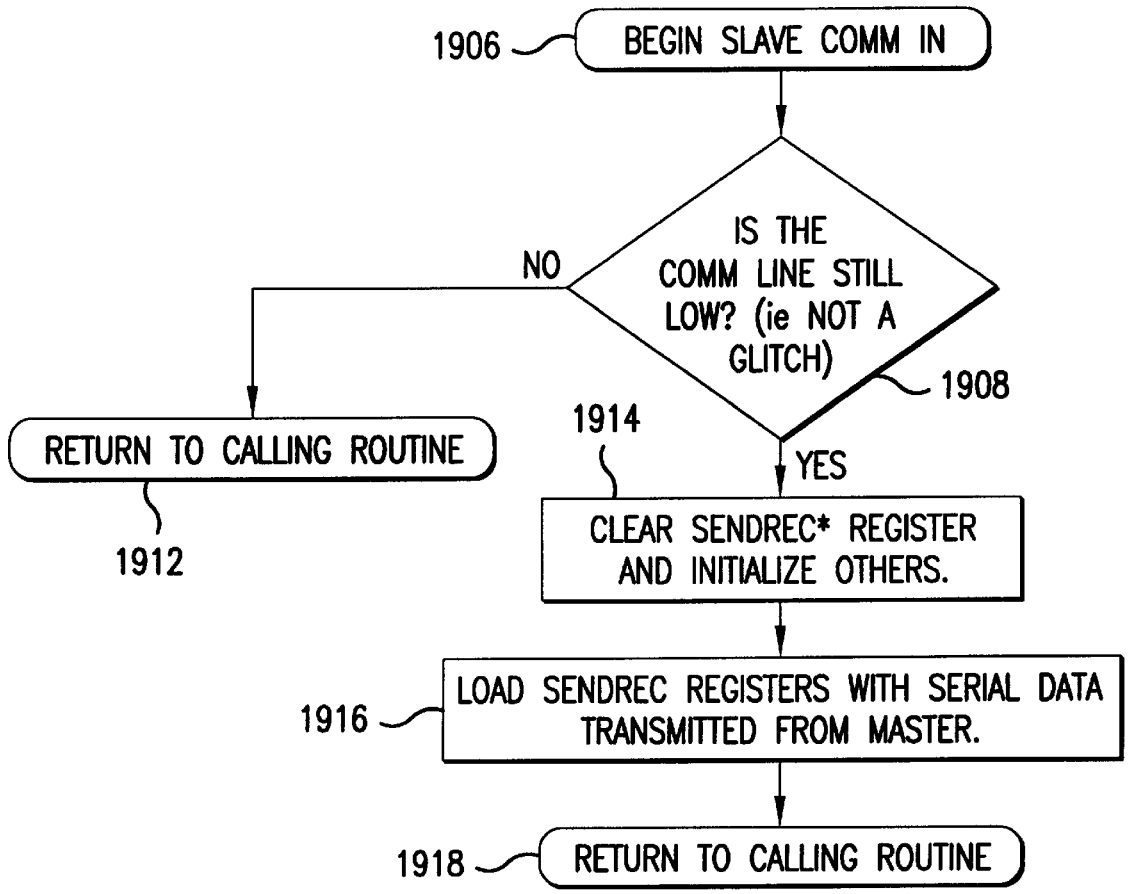
Figure 21M:
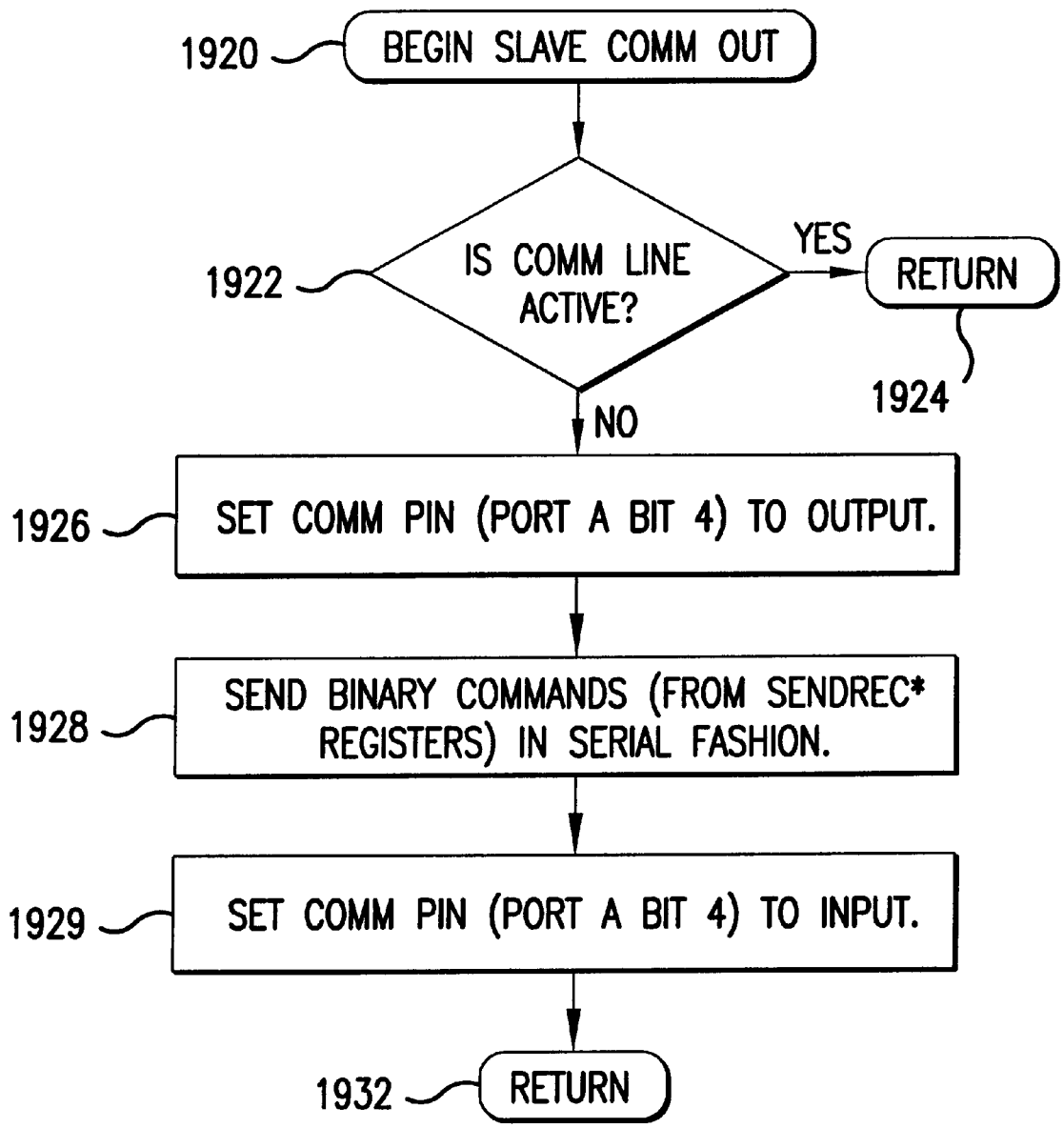
Figure 21N:
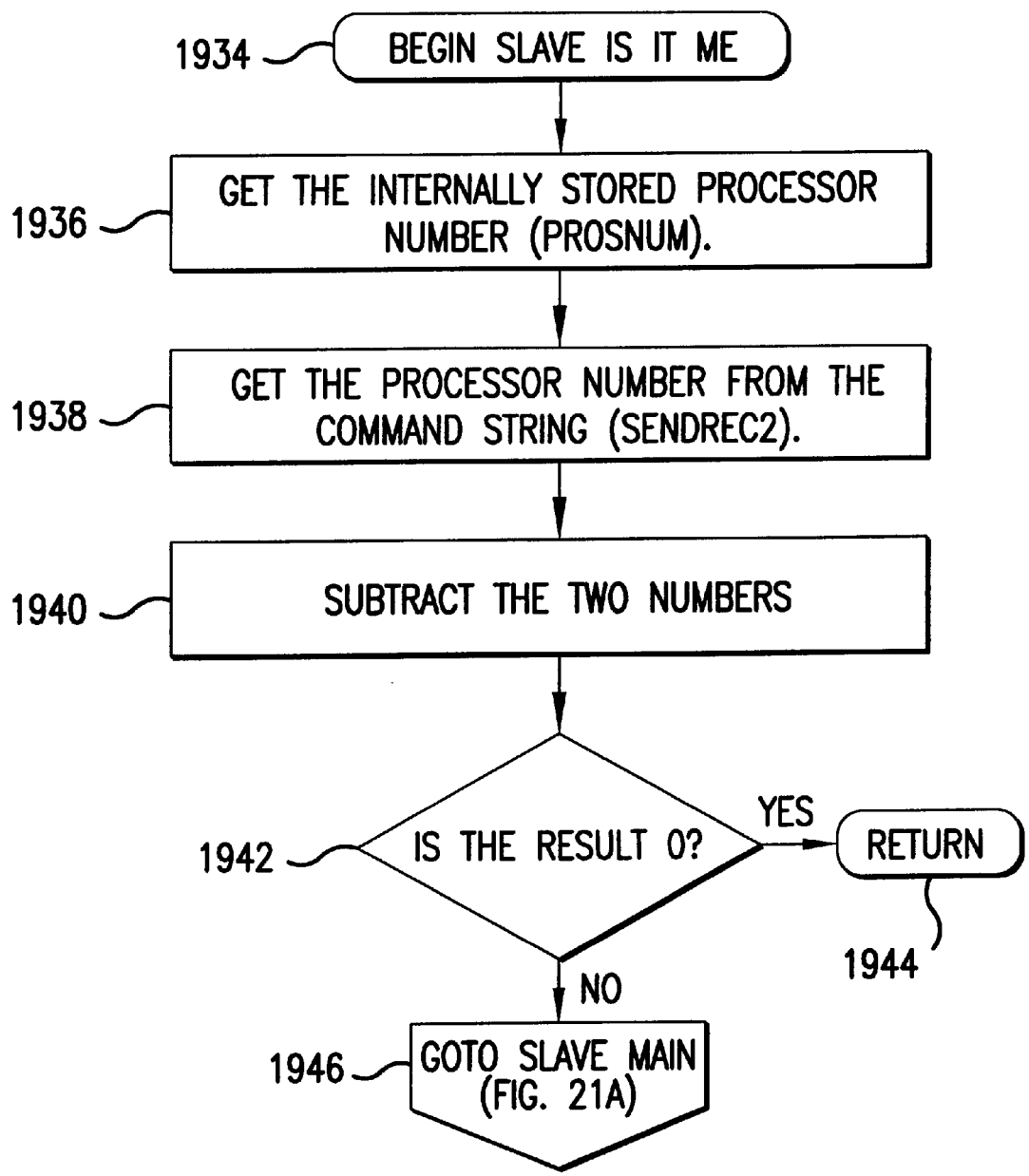
Figure 210:
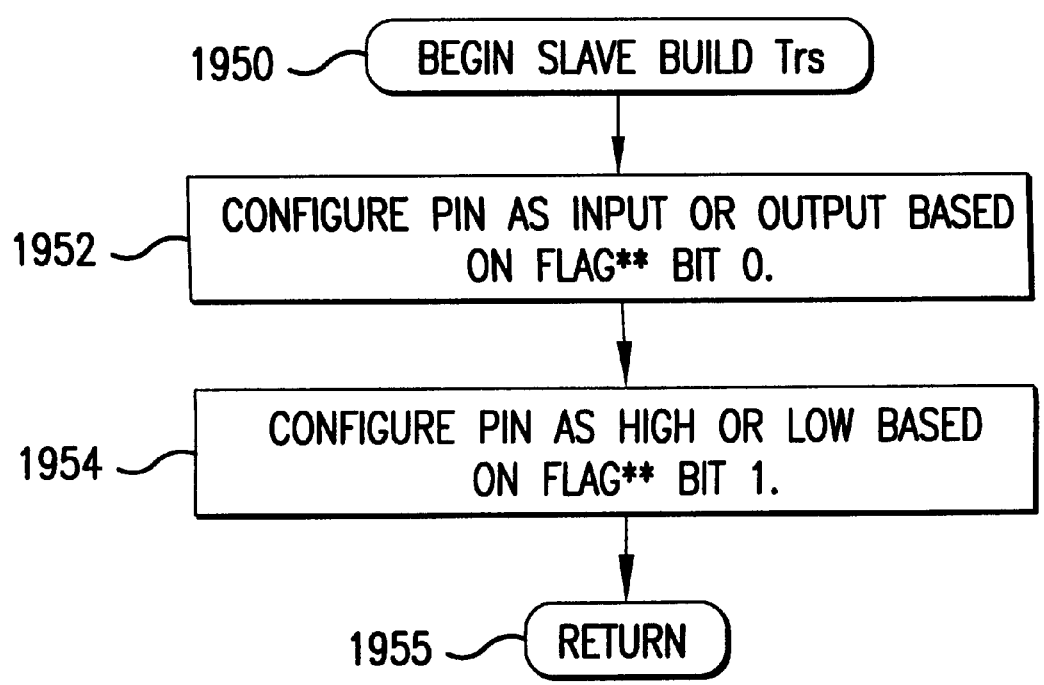

When received by the Slave, the Slave's program control jumps to 1890 of FIG. 21K. First, the Slave checks 1892 to see if it has already determined its processor number—by checking bit 7 of the PROSFLAG1 register. If the bit is set, the program returns control to Slave Main (FIG. 21A). If the bit is cleared, the routine begins 1896 checking the first eight of it's I/O pins. Recall that the IDENT line on each Slave board is connected through a diode to a different I/O pin on each of the Slaves on that board: pin 0 of the Slave in the first, position; pin 1 of the Slave in the second position; and so on, up to pin 7** of the Slave in the eighth position.

For each iteration through the loop, the routine checks 1898 its I/O pin corresponding to the loop counter to see if the pin is pulled high. If so, the routine adds the loop index (i.e., the pin number, and the position of the Slave on the board) to the value ProcNum passed from the Master in SENDREC2. Once this is done, the routine sets PROSFLAG1 bit 7 (to indicate the board has been identified) and the Slave's control returns to Slave Main.

Returning to FIG. 20E, the Master has dwelled 1604 for a short period to allow the Slaves to process the command. After the dwell period, the loop index is incremented 1606; after the final pass through the loop, the IDENTENABLE line is pulled low to disable 1608 all of the IDENT lines, and the Master's program control returns 1610 to Master Main (FIG. 20A).

At step 2004, the PC/PDA issues a series of 'HELLO PinNum' commands to determine how many Slave processors are physically present in the system. Recall that, referring to FIGS. 11 through 13, the preferred embodiment includes 32 Slaves carried by the four slave boards 1120A through 1120D within the control unit 1012, and can be connected to an additional 20 slave boards (160 Slaves) via expansion ports 1062A through 1062N. Thus, the PCIPDA issues 'HELLO PinNum' commands until it receives no response, which indicates that it has already identified the "last" Slave in the system. Whenever the Master receives the 'HELLO' command, Master routine 20C issues the appropriate four-byte command to all of the Slaves, but only a single Slave should respond—the Slave responsible for the pin designated by PinNum.

To determine whether a certain Slave exists—or, more accurately, whether there is a functioning Slave occupying a certain position on a certain slave board—the variable PinNum can be any pin in the system that would be handled by the Slave occupying the position of interest. For example, the Slave in "first" position (position 0) will respond whenever PinNum is between 0 and 31, and the Slave in the fourth position (position 3) will respond whenever PinNum is specified between and 96 and 127. The Master then forwards the Slave's response to the PC/PDA.

The Slave Ping routine (FIG. 21J) calls 1874 the Slave Is It Me routine (FIG. 21N) to check if its Slave is the one to which the 'HELLO' command is addressed (i.e., whether it owns the pin, to which the 'HELLO' command was addressed. If control returns from Slave Is It Me, then the answer is yes, and the routine calls 1876 Slave Comm Out (FIG. 21M) to respond by returning the command bytes stored in the SENDREC* registers. This is the Slave's way of saying it is present and functioning properly.

Once the system is initialized, the user is free to select a cable test file, and then run the file using the TEST button. Recall that there are three types of commands used in a cable test file: commands executed within the PC/PDA only; commands that are "passed through" to the Master essentially unchanged; and a hybrid of the first two types, in which the PC/PDA issues certain combinations of pass-through commands based on responses received from the Master. What follows is a discussion of the primary cable test file command syntax. Each command includes a base command, listed in capital letters, and may include a user-specified value, listed in italics; optional portions of the command are enclosed in square brackets []. The following discussion uses specific nomenclature: "literal" refers to any sequence or combination of numbers or characters, which must be enclosed in quotes; and the term "PinNum" refers to the pin number being operated on by the command, and must be a number between 0 and the maximum number of pins available for testing.

The first three commands are PC/PDA only commands, and are used primarily to provide information to, and retrieve information from, the user. First, the 'ASK "literal"' command is used to present the text of the literal in a message box on the screen of the PC/PDA. In addition, an area is provided for the user to enter information, e.g., by typing on the PC's keyboard, or writing on the PDA's screen with the stylus. Both the literal and the user response are recorded in the error log. This command is useful for retrieving open-ended information about the test to be performed; for example, CUT serial numbers, or unusual environmental conditions.

The 'ASK "literal" WITH "option list"' is similar to the 'ASK' command described above, with the addition of the option list: a series of literals separated by commas. The command presents the text of the literal as a message, and provides the user with a series of graphical buttons, each labeled with one of the items in the option list. The operator responds by tapping or clicking on one of the buttons. Both the literal message and the user's button choice are recorded in the error log. This command is useful for gathering information when only a limited set of responses is meaningful.

The final PC/PDA only command, 'MESSAGE "literal"', presents the text of the literal in a message box on the screen of the PC/PDA. It is useful for prompting the user to accomplish some action, e.g., verifying the cable connections, powering up the vibration equipment. This command should be used only when the message does not need to be recorded in the error log.

Next, there are five pass-through commands used for configuring the systems pins prior to testing, e.g., identifying which pins the system will inject a test signal, and which pins should indicate a response signal, thereby indicating a continuity path with the pin receiving the test signal.

The first two commands are used to configure the pins that will receive the test signal. 'SET HIGH PIN PinNum' is used to set the designated pin as an output (i.e., an output pin from the Slave's perspective, which is an input pin from the CUT's perspective) that will be driven high. Any other pin which should have a continuity path to designated pin should then be configured with an 'EXPECT HIGH PIN PinNum' command. Similarly, the 'SET LOW PIN PinNum' is used to set the designated pin as an output that will be driven low, and pins with continuity paths from the designated pin should be configured with 'EXPECT LOW PIN PinNum' command(s).

The next three commands are used to configure the remaining pins in the system based on whether they should have continuity paths with the pins designated by the 'SET' commands. First, 'EXPECT HIGH PIN PinNum' is used to set the designated pin as an input (i.e., an input pin from the Slave's perspective) expecting to receive high. In other words, the designated pin should have a continuity path to any pin(s) designated by the 'SET HIGH PIN PinNum' command. Once a pin is set to expect high, each subsequent measurement of low on that pin will increase the error count for that pin. Similarly the command 'EXPECT LOW PinNum' is used to set the designated pin as an input expecting to receive low. In other words, the designated pin should have a continuity path to any pin(s) designated by the 'SET LOW PIN PinNum' command. Once a pin is set to expect low, each subsequent measurement of high on that pin will increase the error count for that pin. The final configuration command, 'CLEAR', is equivalent to setting every pin in the system as an input expecting low. In addition, this command clears all of the error counts for each pin. Thus, it is useful to reinitialize the pins between different test configurations, but only if the error counts have already been retrieved.

When the SET LOW, SET HIGH, EXPECT LOW, and EXPECT HIGH commands are received by the Master they are processed by routine 20C, which issues to the Slaves the commands number 1 { 1, ProcNum, ProcPinNum, 0}, number 2 {2, ProcNum, ProcPinNum, 0}, number 4 {4, ProcNum, ProcPinNum, 0}, or number 5 {5, ProcNum, ProcPinNum, 0} respectively. Each of these commands transfers Slave control to the Slave Config Pin subroutine at step 1730 of FIG. 21D, to configure the specified pin (ProcPinNum) of the specified processor (ProcNum) as a low output, high output, low input, or high input, respectively. The routine first calls Slave Is It Me (FIG. 21N) to check if it is the correct processor (i.e., ProcNum); if not, the Slave Is It Me routine contains an internal branch to return control to Slave Main (FIG. 21A).

Thus, only Slave number ProcNum continues on to step 1734 to load the appropriate value into the FLAG registers that corresponds to the specified pin (i.e., where  equals ProcPinNum). In each case, the command stores a binary value into the three lower bits of the FLAG register: set low stores 001, set high stores 011, expect low stores 000, and expect high stores 100. It then calls 1736 the subroutine Slave Build Trs (FIG. 21O), which uses the FLAG register values to configure the pin in the specified manner, as will be discussed later. Next, it calls 1740 Slave Comm Out (FIG. 21M) to send that information to the Master, and then returns 1742 control to Slave Main (FIG. 21A**).

The 'CLEAR' command is received by the Master, and since it applies to all Slaves, is processed by routine 20D, which issues the command number 3 {3, 0, 0, 0} to the Slaves. Slave control is transferred to the Slave Do Clear subroutine at step 1760 of FIG. 21E which sets each of the pins on each Slave as an input expecting low. The routine would be equivalent to executing command number 1 repeatedly: once for each pin of each processor available in the system. In addition, the command clears the additional registers and pins associated with the error counting.

First, the program configures 1762 all of the Slave's relevant I/O pins (i.e., all except the COMM line pin) as inputs by setting (i.e., loading a "1") all of the relevant bits in the Slave's direction registers (called "TRIS" registers). Next, the program clears 1764 all of the FLAG registers, which indicates that the corresponding pins are inputs (bit 0 clear) expecting low (bit 2 clear), with no currently reported errors (bit 3 clear). Next, the routine clears 1766 the ERROR registers, which indicates that the corresponding pin has a zero error count, and clears 1768 bit 6 of PROSFLAG1, to indicate that no errors have been found on any of the pins in the Slave. Finally, control is returned 1770 to Slave Main (FIG. 21A).

Once the test setup is configured, the cable test file initiates the testing routine with the 'START "literal"' command. The literal is displayed to the user, along with a "stop"

button to end the test. The literal is a convenient location to display messages to the user concerning the dynamic stimulation system; for example, "Impulse the J1 connector three times with the impulse tool". The system continues to check the pins for the presence of errors until the user clicks on the "stop" button (which issues a 'STOP' command, as discussed later).

The main testing routine, Slave Do Test, is entered when command 6 {6, 0, 0, 0} transfers control (see step 1724 at FIG. 21C) to step 1810 of FIG. 21F. Similar to the Slave Do Clear routine (FIG. 21E) the Slave Do Test routine applies to all Slaves simultaneously, and so does not require calling the Slave Is It Me routine.

First, the routine clears 1812 the values currently stored (i.e., from the most recent test) in the five *EXPECT registers, which configures each pin as expecting low. Next, the the program builds 1814 the appropriate bit pattern in the *EXPECT registers to mirror the bit pattern that would exist on each port (a through E) if no errors are found (as discussed previously). This is accomplished by checking the bit pattern in the FLAG register associated with each I/O pin. If bits 1 or 2 of the FLAG register are set—indicating high output and high input, respectively—then the bit in the *EXPECT register corresponding to that pin is also set.

Next the program enters a loop 1815 in which the port values are read 1816 and compared (by XORing) 1817 with the appropriate *EXPECT registers. If the result is zero 1818, then no errors were found, and the routine moves on 1819 to check the next port. If the result is non-zero, then the program first sets 1820 bit 6 of the PROSFLAG1 register (to indicate that at least one error was found) and then branches to an internal subroutine that compares 1822, bit-by-bit (i.e., pin-by-pin), the measured port values with the expected values. If a difference is found, then the ERROR** register associated with that pin is incremented.

After the program has error-checked each of the Slave's five ports once, the routine polls 1824 the COMM line to check for a "stop" condition. The Master pulls the COMM line low (i.e., a negative logic 1), when the Master encounters the 'STOP' command (see step 1562 of FIG. 20B); until that time, the Slave reads the COMM line as high (a negative logic 0), and the routine loops back to step 1815 to error-check all of the ports again. If the COMM line is low, then the routine enters a wait loop 1826, continuously checking for the line to drop low again. Recall that the STOP command remains on the COMM line for a sufficient time to allow all of the Slaves to complete the cycle of step 1815 through 1819 or 1822. When the COMM line finally drops low again, program control returns 1828 to Slave Main (FIG. 21A).

The 'STOP' command, which is used to end the current testing process that was initiated by a 'START' command. Recall that the 'START' command displays a message box to the user that includes both a literal message, and a "stop" button. When the user taps or clicks the stop button, the PC/PDA issues the 'STOP' command, which will be discussed in more detail below in connection with FIG. 20F.

First, the Master pulls 1622 the COMM line low, and then waits 1624 to allow all of the Slaves to detect the signal. After sufficient time has passed that all Slaves must have halted their testing activities, the Master sets 1626 the COMM line high again, and program control returns 1628 to Master Main (FIG. 20A).

Referring again to the branching operation 1562 in FIG. 20B, the 'STOP' command, number 12, causes program control to jump to step 1620 of FIG. 20F. The 'STOP' command is unique in that it is the only command that is issued while the Slaves are executing the previous command (which must have been the 'START' command, command number 6). More specifically, the command is used to stop the Slaves from actively testing the CUT pins; which it does by halting execution of the subroutine Slave Do Test, as will be discussed later (see step 1822 of FIG. 21F).

After the testing routine is finished, the Slave is likely to receive one of the commands designed to poll the Slaves for errors. Referring to the branching step 1724 of FIG. 21C, the error-polling commands are numbered 7, 8, and 9. These commands are the only three commands in which the Slave responds to the Master with a four-byte command word that is intended to be different than the command word received by the Slave.

After the testing process is complete, the test file typically will include one of two commands to elicit the results of the test, i.e., whether any errors were recorded. The 'ERROR? PIN PinNum' command is used to retrieve the number of errors currently recorded in the error count for the specified pin, and to add that information to the error log. The command is useful primarily if only a small number of pins are of interest in the test. In contrast, the more common command, 'ERRORS?', is used to retrieve the error count for any pin in the system that currently has a nonzero error count, and to record that information in the error log. The command is used whenever it is desirable to check for errors, e.g., between test setups, or at the end of a complete test cycle.

If, at step 2024, the command is the hybrid type 'ERRORS?' command, then program control jumps 2034 to step 2116 in FIG. 19C. The 'ERRORS?' command is the only test file command in which the PC/PDA both passes ASCII commands to the Master, and makes decisions or executes portions of the command itself First, the PC/PDA sends 2118 an 'ERRORS?' command to the Master, which polls all of the Slaves simultaneously to determine whether any Slave recorded an error during the testing process. If no response is received, then no errors were recorded, and the PC/PDA issues 2138 the appropriate message to the message area (i.e., it is recorded in the error log).

However, if the PC/PDA receives a (non-zero) response at step 2120, then at least one of the Slaves has recorded a fault on at least one of its pins, and the program enters a nested loop structure to locate the faults. In the outer loop (steps 2122, 2124, 2126, 2140, and 2142) the program sends 2124 the 'ERROR? PROC' command to each Slave to determine whether that particular Slave recorded any errors; if a Slave does not respond 2126, then the loop counter—which keeps track of the processor being polled—is incremented 2142, and the next processor is polled until the loop counter exceeds the maximum number of processors available (see steps 2004 and 2006 of FIG. 19A).

If the processor responds affirmatively at step 2126, the program enters the inner loop (steps 2128, 2130, 2131, 2132, 2134, and 2136) to poll each pin on that Slave for errors. The inner loop uses a counter 2128 to keep track of the pin it is polling, and send an 'ERROR? PIN' command for each of the 32 pins controlled by that processor. Once all the pins have been checked 2136, program control moves to step 2142 of the outer loop to continue polling the next processor for errors. Once all of the processors have been checked 2140 for errors, program control returns 2137 to step 2036 of FIG. 19A.

The 'ERROR? PROC ProcNum' command, which is used to determine whether Slave number ProcNum has recorded any errors on any of its pins during the previous test sequence. Although the Master passes on the appropriate four-byte command to all Slaves, only the Slave number ProcNum will respond, and will indicate merely a "yes" (logic-1) or a "no" (logic-0) answer. The Master then reformats the response to ASCII and forwards the information to the PC/PDA.

Command number 7, byte format {7, 0, 0, 0}, transfers program control to step 1830 of FIG. 21G, the Slave Any Error routine, which checks all of the Slaves to see if any errors were reported. No specific error count information is provided by the Slaves; only a "yes" or "no" regarding whether any of the pins governed by that Slave has a non-zero error count. First, the routine checks bit 6 of PROSFLAG1, which is set during Slave Do Test (FIG. 21F) if any errors were found. If no errors were found, then all of the SENDREC* registers are cleared 1834, and the program calls 1838 Master Comm Out (FIG. 21M) to send the Os up to the PC/PDA, which interprets an all-0 message as "no response" at step 2120 (FIG. 19C).

In contrast, commands number 8 and 9 check for specific error information about a designated pin or a designated processor, respectively.

Command 8, byte format received as {8, ProcNum, ProcPinNum, 0}, transfers program control to step 1842 of FIG. 21H, the Slave Pin Error subroutine, which causes only a single Slave (ProcNum) to report the error count for a single designated pin (ProcPinNum). The routine first calls 1844 Slave Is It Me (FIG. 21N) to check if it is the correct processor; if not, the Slave Is It Me routine contains an internal branch to return control to Slave Main (FIG. 21A). Otherwise, the routine continues by moving 1846 the value from the ERROR** register corresponding to the appropriate pin into the SENDREC4 register (which corresponds to command byte 3). After this Slave COMM Out is called to transmit the information.

Slave Processor Error

Command 10, {10, ProcNum, 0, 0} This routine first calls Slave Is It Me to see if it is the correct processor. It then clears Byte 3 of the transmit register. Next it checks the processor register PROSFLAG1 bit 6 to see if it is set. PROSFLAG1 bit 6 is set during Slave Do Test if any errors are found. If it is set then Byte 3 of the transmit register is set to 1. Finally, Slave COMM Out is called to transmit the information to the Master.

Finally, there is one control structure used in cable test files that does not fit easily in the three classifications previously discussed (PC/PDA only, pass-through, and hybrid). It is a relatively standard format for the FOR-NEXT loop control structure:

FOR VarName = "literal" TO "literal" {BY "literal"} program statements

NEXT VarName'

The user-designated variable, VarName, is used as a counter starting at the first literal integer value and increasing to the second literal integer value, and optionally being increased by the third literal integer value. The program statements are any combination of valid commands, and the variable is incremented upon the occurrence of the NEXT VarName command. The loop is valuable for performing any repetitive task; for example, setting all of the pins at one end of the the CUT to expect high since the test signal (high) is being injected into all of the pins at the other end of the CUT.

Regarding the 'LEARN' function, the program asks 2076 the user for the highest pin number for the CUT, and initializes 2078 a counter variable to zero. Each iteration of the test loop begins by issuing 2080 a "clear" command, to set all of the CUT pins to expect low, then setting 2082 the pin number corresponding to the value of the counter variable to receive the test signal. Issuing 2084 a "start" and "stop" command allows the system to test all of the pins multiple times, checking for "errors", which are retrieved at step 2086, and entered 2088 into the net list. Provided that the pin receiving the test signal is not the highest pin number provided at step 2090, the system increments 2092 the counter variable, and steps through another iteration of the loop beginning at 2080. Once the net list is completed (i.e., "yes" as step 2090), the net list information is displayed in the message area (i.e., and recorded in the error log) and, optionally, the user is prompted to save the net list information directly to the currently selected cable test file. Depending on the intended users of the system, it may be preferable to omit step 2094, so that the integrity of the cable test files can not be accidentally breached during the test. Finally, program control returns via steps 2058 (FIG. 19B) and 2040 (FIG. 19A) to the main wait loop 2008 (FIG. 19A).

Three commands—'^NET&', '^CID&', and '^PRINT&'—that the PC/PDA uses to route its two-way communications between the network port, the Master processor, and the printer port, respectively.

The text of button 2178 (FIG. 22) toggles between "NET" and "CID" each time the button is selected. For discussion purposes, it is presumed that the button is initially labeled NET. The button functions to establish a communications link between the PC/PDA and either a network 1024 (FIGS. 11, 12A, and 12B), and the Master processor 1032 (e.g., FIGS. 11 through 13). More specifically, the routine establishes two-way communications with either the network port 1050 or the Master (via serial interface 1104); however, even when the network communications have been selected, the Master always maintains a connection to the output from the PC/PDA (see 1210 at FIG. 15), so that the Master can reestablish two-way communications with the PC/PDA when the CID button is selected.

Referring to FIG. 19C, when NET is selected the program first toggles 2104 the button's label to CID, and then sends the appropriate command ('^NET&') to establish two-way communications with the network port 1050, before returning 2108 to the main wait loop 2008 (FIG. 19A). If the CID button had been displayed originally—and selected at step 2102—the button would have been toggled 2104 to NET, and communications established with the Master 1032. The routing of the PC/PDA communications is effected by the switching relays 1100 (FIG. 15) and will be discussed in detail later.

The user selects the PRINT button (FIG. 19B, step 1471), to print the current error log displayed in the message area 2162 (FIG. 22). Referring to FIG. 19B, the program first checks 2054 to see whether the PC/PDA communications are being routed to the network 1024 (FIG. 11) or the Master 1032. If the networks communications have been established, the program assumes the user wants the error log printed to a networked printer, and sends the error log text to the PC/PDA's operating system (OS), which then forwards the text to the most recently selected network printer. If the network connection is not established, the program sends a command ('^PRINT&") to the Master to route the PC/PDA communications to the local printer port 1048 (FIGS. 12A, 12B, 13, and 15), and then routes 2062 the error log text out via the RS232 serial port. The switching between Master and the printer port is handled using the same processes as discussed previously in the context of the NET/CID button. After the error log has been sent to the local printer, the program reestablishes 2064 two-way communications with the Master, and returns 2058 control to the main wait loop 2008 (FIG. 19A).

Referring again to the branch step 1562 of FIG. 20A, the three commands, '^NET&' (command 14), and '^CID&' (command 15), and '^PRINT&' (command 16), are also executed entirely within the Master. In addition, these commands differ from the previous commands in that they do not send anything back to the PC/PDA. Referring to FIGS. 15, and 20H, these three commands cause the Master to set the switching relays 1100 to route communications from the PC/PDA to either the "Network" port 1050, the Master 1032 ("CID"—an acronym for "cable intermittent detector"—is the program's short-hand reference for the control unit) or to the "Printer" port 1048.

In response to the 'NET&' command, the Master sets line RCONTROL1 1110A high and RCONTROL2 low, which connects line 1053A to 1051B, and connects line 1053B to 1051A, thus establish two-way communication between the PC/PDA and the Network (via port 1050). In response to the 'CID&' command, the Master clears both lines RCONTROL1 1110A and RCONTROL2, which connects line 1053A to 1102A, and thus establishes two-way communication between the PC/PDA and the Master (via serial interface unit 1104).

Note that at all times line 1053B is connected 1210 to line 1102B, so that the Master always receives the output from the PC/PDA. For example, this allows the Master to receive a "^CID&" command—to restore communications between the Master and PC/PDA—after the PC/PDA has been communicating primarily with the network (or printer).

Referring again to the branching operation 1562 in FIG. 20B, the '^WHAT' command, number 13, causes program control to jump to step 1630 of FIG. 20G. The '^WHAT' command is one of the three commands that is executed solely within the Master, and initiates no activity in the Slaves. The purpose of the subroutine is to send back to the PC/PDA a duplicate of the command most recently executed. The subroutine converts 1632 the four-byte command currently in the SENDREC1 through SENDREC4 registers to the corresponding ASCII values, and stores those values in the ASCII1 through ASCII32 registers. These values are then sent 1634 up to the PC/PDA via the Master's hardware USART, and control returns 1638 to Master Main (FIG. 20A).

The Slave Is It Me routine (FIG. 21N) retrieves 1936 the Slave's processor number from PROSNUM, and 1938 the processor number received in the current command (ProcNum in SENDREC2), and subtracts the two numbers. If the result is zero 1942, then the Slave is the one identified in the command, and program control returns 1944 to the calling routine to execute the command. If the result is nonzero, then the program control returns 1946 to Slave Main, to await a command that does affect that Slave.

The routine Build Trs (FIG. 21O) uses the values in the FLAG register to configure 1952 the corresponding pin as input or an output and, in the case of an output, sets 1954 the pin to output high or low. The Slave processor uses a I/O pin direction control register—called a "TRIS" register by the manufacturer—for each I/O port to determine whether each pin in that port will function as an input (bit is set) or output (bit is clear). The routine first checks 1952 bit 0 of the FLAG register, and if set (indicating an output), it clears the bit in the TRIS register corresponding to that pin. Next, the routine checks 1954 bit 1 of FLAG**, and if set (indicating a high output), it writes a logic 1 to the corresponding pin (i.e., pulls that pin high). When finished, program control returns 1955 to the calling routine.

The above descriptions of the preferred embodiments are not to be taken as limiting the principles of the invention as defined by the appended claims.

We claim:

1. An apparatus for testing a cable, the cable having a plurality of cable connectors, each cable connector having a plurality of electrical contacts, and the cable having a plurality of electrical paths between the electrical contacts, the apparatus comprising:
   a. a user interface unit for receiving input from a user and providing output to the user;
   b. a control unit connected to said user interface unit and responsive to said user interface unit, comprising
      (1) plurality of testing means, operating independently from one another, each being connected to a different plurality of the cable's electrical contacts, for
         (A) selectively applying a test signal to any selected one of said plurality of said electrical contacts,
         (B) selectively measuring a response signal at any one of said plurality of said electrical contacts,
         (C) providing data representative of an expected response signal at each of said plurality of electrical contacts, and
         (D) comparing said measured response signal with said data representative of said expected response signal, to derive data representative of the result of such comparison; and
      (2) communication means, connected between said user interface unit and said plurality of testing means, for transferring signals between said user interface means and said testing means; and
   c. a dynamic stimulation unit for stimulating the cable at a plurality of frequencies simultaneously.

2. The cable testing apparatus of claim 1, in which:
   the data representative of an expected response signal is reference data representative of the electrical paths between the plurality of electrical contacts for at least one previously tested cable.

3. The cable testing apparatus of claim 1, wherein the dynamic stimulation unit comprises:
   (1) a test fixture member, upon which one of the cable connectors is carried;
   (2) agitating means, connected to the test fixture member, for causing relative motion of the test fixture member;
   (3) motion sensing means, for sensing relative motion of the test fixture member, and for generating a signal proportional to the sensed relative motion; and
   (4) agitation controller means, connected to the agitating means and responsive to the motion sensing means, for regulating the relative motion of the test fixture member.

4. The apparatus of claim 3, further comprising:
   means for connecting the agitation means to the cable at a location on the cable intermediate to two of the plurality of the cable connectors, one of the cable connectors being mounted on the test fixture member.

5. The apparatus of claim 1, in which the dynamic simulation unit comprises:
   a hand held impulse tool for imparting a shock impulse to the cable.

6. The apparatus of claim 1, wherein said testing means further comprises:

(E) error counting means for counting the number of fault conditions, and (F) means for storing the number of fault conditions.

7. An apparatus for testing a cable, the cable having a plurality of cable connectors, each cable connector having a plurality of electrical contacts, and the cable having a plurality of electrical paths between the electrical contacts, the apparatus comprising:

a. a user interface unit for receiving input from a user and providing output to the user:

b. a control unit connected to said user interface unit and responsive to said user interface unit, comprising (1) a plurality of testing means, operating independently from one another, each being connected to a different plurality of the cable's electrical contacts, for (A) selectively applying a test signal to any selected one of said plurality of said electrical contacts, (B) selectively measuring a response signal at any one of said plurality of said electrical contacts, (C) providing data representative of an expected response signal at each of said plurality of electrical contacts, and (D) comparing said measured response signal with said data representative of said expected response signal, to derive data representative of the result of such comparison; and (2) communication means, connected between said user interface unit and said plurality of testing means, for transferring signals between said user interface means and said testing means, wherein such signals are transferred by (A) a plurality of IDENT lines, each connecting the communication means to only a single one of said testing means, and (B) a single COMM line, connecting the communication means to each of the plurality of testing means, such that any signal carried by the COMM line is simultaneously available to the communication means and all of the plurality of testing means; and c. a dynamic stimulation unit for stimulating the cable at a plurality of frequencies simultaneously.

8. The apparatus of claim 7, wherein said control unit includes (3) a master circuit board, upon which said communication means is carried; and (4) a slave circuit board, carrying a plurality of said testing means.

9. The apparatus of claim 8, in which:

the data representative of an expected response signal is reference data representative of the expected electrical paths between the plurality of electrical contacts for the cable.

10. The apparatus of claim 8, wherein the dynamic stimulation unit comprises:

(1) a test fixture member, upon which one of the cable connectors is carried;

(2) agitating means, connected to the test fixture member, for causing relative motion of the test fixture member;

(3) motion sensing means, for sensing relative motion of the test fixture member, and for generating a signal proportional to the sensed relative motion; and (4) agitation controller means, connected to the agitating means and responsive to the motion sensing means, for regulating the relative motion of the test fixture member.

11. The apparatus of claim 10, further comprising:

d. means for connecting the agitation means to the cable at a location on the cable intermediate to two of the plurality of the cable connectors, one of the cable connectors being mounted on the test fixture member.

12. The apparatus of claim 8, in which the dynamic simulation unit comprises:

a hand held impulse tool for imparting a shock impulse to the cable.

13. The apparatus of claim 7, wherein said testing means further comprises:

(E) error counting means for counting the number of fault conditions, and (F) means for storing the number of fault conditions.

14. An apparatus for testing a cable, the cable having a plurality of cable connectors, each cable connector having a plurality of electrical contacts, and the cable having a plurality of electrical paths between the electrical contacts, the apparatus comprising a. a user interface unit for receiving input from a user and providing output to the user:

b. a control unit connected to said user interface unit and responsive to said user interface unit, comprising (1) a plurality of testing means, operating independently from one another, each being connected to a different plurality of the cable's electrical contacts, for (A) selectively applying a test signal to any selected one of said plurality of said electrical contacts, (B) selectively measuring a response signal at any one of said plurality of said electrical contacts, (C) providing data representative of an expected response signal at each of said plurality of electrical contacts, and (D) comparing said measured response signal with said data representative of said expected response signal, to derive data representative of the result of such comparison, such result indicating a fault condition when the measured response signal is not equivalent to the expected response signal;

(E) error counting means for counting the number of fault conditions, and (F) means for storing the number of fault conditions;

(2) communication means, connected between said user interface unit and said plurality of testing means, for transferring signals between said user interface means and said testing means, wherein such signals are transferred (A) a plurality of IDENT lines, each connecting the communication means to only a single one of said testing means, and (B) a single COMM line, connecting the communication means to each of the plurality of testing means, such that any signal carried by the COMM line is simultaneously available to the communication means and all of the plurality of testing means:

(3) a master circuit board, upon which said communication means is carried; and (4) a plurality of slave circuit boards, each carrying a plurality of said testing means; and c. a dynamic stimulation unit for stimulating the cable at a plurality of frequencies simultaneously.

15. The apparatus of claim 14, wherein the dynamic stimulation unit comprises:

(1) a test fixture member, upon which one of the cable connectors is carried;
(2) agitating means, connected to the test fixture member, for causing relative motion of the test fixture member;
(3) motion sensing means, for sensing relative motion of the test fixture member, and for generating a signal proportional to the sensed relative motion; and
(4) agitation controller means, connected to the agitating means and responsive to the motion sensing means, for regulating the relative motion of the test fixture member.

16. The apparatus of claim 15, further comprising:
   d. means for connecting the agitation means to the cable at a location on the cable intermediate to two of the plurality of the cable connectors, one of the cable connectors being mounted on the test fixture member.

17. The apparatus of claim 14, in which the dynamic simulation unit comprises:
   a hand held impulse tool for imparting a shock impulse to the cable.

* * * * *